(12) United States Patent
Park et al.

(10) Patent No.: US 8,860,221 B2
(45) Date of Patent: Oct. 14, 2014

(54) ELECTRODE CONNECTING STRUCTURES CONTAINING COPPER

(71) Applicant: Samsung Electronics Co., Ltd., Suwon-si (KR)

(72) Inventors: Kun-Sang Park, Hwaseong-si (KR); Byung-Lyul Park, Seoul (KR); Su-Kyoung Kim, Suwon-si (KR); Kwang-Jin Moon, Hwaseong-si (KR); Suk-Chul Bang, Yongin-si (KR); Do-Sun Lee, Gwangju (KR); Dong-Chan Lim, Gangneung-si (KR); Gil-Heyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 134 days.

(21) Appl. No.: 13/685,174

(22) Filed: Nov. 26, 2012

(65) Prior Publication Data

US 2013/0140697 A1 Jun. 6, 2013

(30) Foreign Application Priority Data

Dec. 2, 2011 (KR) .......................... 10-2011-0128430

(51) Int. Cl.
*H01L 23/00* (2006.01)
*H01L 25/065* (2006.01)

(52) U.S. Cl.
CPC ....... *H01L 24/28* (2013.01); *H01L 2224/08147* (2013.01); *H01L 2225/06517* (2013.01); *H01L 2224/05647* (2013.01); *H01L 2224/08148* (2013.01); *H01L 24/80* (2013.01); *H01L 2224/8001* (2013.01); *H01L 2225/06513* (2013.01); *H01L 2225/06541* (2013.01); *H01L 24/03* (2013.01); *H01L 24/05* (2013.01); *H01L 2224/05026* (2013.01); *H01L 2224/05571* (2013.01); *H01L 24/08* (2013.01); *H01L 25/0655* (2013.01); *H01L 2224/05009* (2013.01); *H01L 2224/0557* (2013.01); *H01L 2224/80203* (2013.01)

USPC .... 257/751; 257/774; 257/635; 257/E23.145; 257/E23.161

(58) Field of Classification Search
USPC .................. 257/751, 774, 635, 758, E23.145, 257/E23.161
See application file for complete search history.

(56) References Cited

U.S. PATENT DOCUMENTS

| | | | |
|---|---|---|---|
| 7,485,968 B2 | 2/2009 | Enquist et al. | |
| 7,851,346 B2 | 12/2010 | Lee et al. | |

(Continued)

FOREIGN PATENT DOCUMENTS

| | | |
|---|---|---|
| JP | 11330143 | 11/1999 |
| JP | 2009505401 A | 2/2009 |
| JP | 4294722 B2 | 7/2009 |
| KR | 1020080039899 A | 5/2008 |

*Primary Examiner* — Cathy N Lam
(74) *Attorney, Agent, or Firm* — Myers Bigel Sibley & Sajovec, PA

(57) ABSTRACT

Provided are electrode-connecting structures or semiconductor devices, including a lower device including a lower substrate, a lower insulating layer formed on the lower substrate, and a lower electrode structure formed in the lower insulating layer, wherein the lower electrode structure includes a lower electrode barrier layer and a lower metal electrode formed on the lower electrode barrier layer, and an upper device including an upper substrate, an upper insulating layer formed under the upper substrate, and an upper electrode structure formed in the upper insulating layer, wherein the upper electrode structure includes an upper electrode barrier layer extending from the inside of the upper insulating layer under a bottom surface thereof and an upper metal electrode formed on the upper electrode barrier layer. The lower metal electrode is in direct contact with the upper metal electrode.

20 Claims, 61 Drawing Sheets

(56) References Cited

U.S. PATENT DOCUMENTS

| | | | |
|---|---|---|---|
| 2004/0137721 A1* | 7/2004 | Lim et al. | 438/638 |
| 2007/0045861 A1* | 3/2007 | Ohto et al. | 257/774 |
| 2009/0068831 A1 | 3/2009 | Enquist et al. | |
| 2009/0102064 A1 | 4/2009 | Sawada et al. | |
| 2010/0233850 A1 | 9/2010 | Patti et al. | |

* cited by examiner

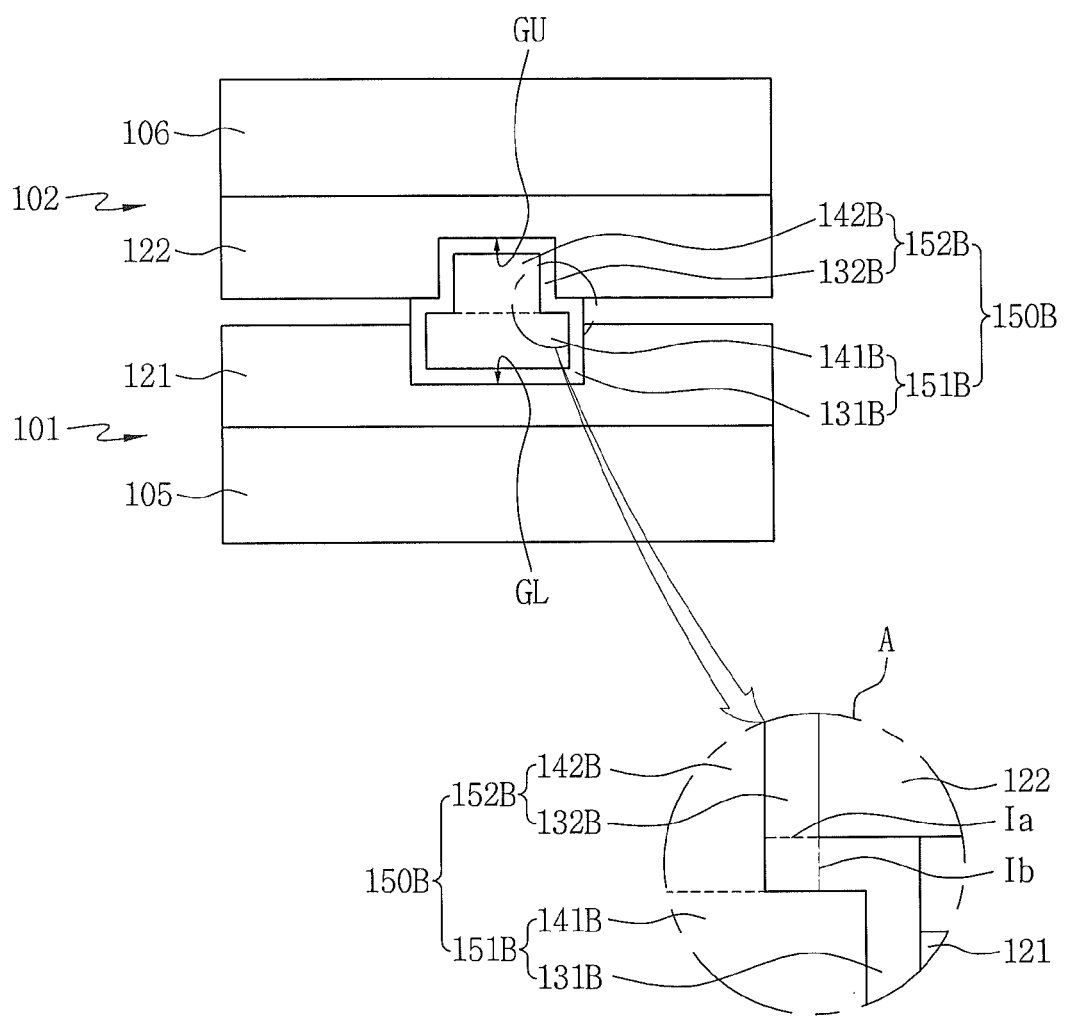

(A)  (B)

200G

400G

ELECTRODE CONNECTING STRUCTURES CONTAINING COPPER

CROSS-REFERENCE TO RELATED APPLICATION

This application claims priority under 35 U.S.C. §119 to Korean Patent Application No. 10-2011-0128430 filed on Dec. 2, 2011, the disclosure of which is hereby incorporated by reference in its entirety.

BACKGROUND

1. Field

Embodiments of the inventive concept relate to copper (Cu)-containing electrode-connecting structures having various shapes and methods of forming the same.

2. Description of Related Art

The increasing usage of smaller-sized, more lightweight, and thinner communication devices, such as mobile phones or tablet PCs, has led to the necessity for semiconductor devices and electrode-connecting structures having finer pitches, gaps, thicknesses, and volumes.

SUMMARY

Embodiments of the inventive concept provide electrode-connecting structures or semiconductor devices that are in direct contact with metal electrodes.

Other embodiments of the inventive concept provide electrode-connecting structures or semiconductor devices having copper (Cu) metal electrodes.

Still other embodiments of the inventive concept provide electrode-connecting structures or semiconductor devices in which copper-containing metal electrodes are not in direct contact with insulating layers.

Yet other embodiments of the inventive concept provide electrode-connecting structures or semiconductor devices in which electrode barrier layers are interposed between copper electrodes and insulating layers.

Yet other embodiments of the inventive concept provide methods of forming electrode-connecting structures or semiconductor devices that are in direct contact with metal electrodes.

Yet other embodiments of the inventive concept provide methods of forming electrode-connecting structures or semiconductor devices having copper metal electrodes.

Yet other embodiments of the inventive concept provide methods of forming electrode-connecting structures or semiconductor devices in which copper-containing metal electrodes are not in direct contact with insulating layers.

Yet other embodiments of the inventive concept provide methods of forming electrode-connecting structures or semiconductor devices in which electrode barrier layers are interposed between copper electrodes and insulating layers.

Aspects of the inventive concept should not be limited by the above description, and other unmentioned aspects will be clearly understood by one of ordinary skill in the art from example embodiments described herein.

In accordance with an aspect of the inventive concept, an electrode-connecting structure or semiconductor device is provided. The structure or device includes a lower device and an upper device. The lower device includes a lower substrate, a lower insulating layer formed on the lower substrate, and a lower electrode structure formed in the lower insulating layer. The lower electrode structure includes a lower electrode barrier layer, and a lower metal electrode formed on the lower electrode barrier layer. The upper device includes an upper substrate, an upper insulating layer formed under the upper substrate, and an upper electrode structure formed in the upper insulating layer. The lower electrode structure includes an upper electrode barrier layer extending from the inside of the upper insulating layer under a bottom surface thereof and an upper metal electrode formed on the upper electrode barrier layer. Herein, the lower metal electrode is in direct contact with the upper metal electrode.

In accordance with another aspect of the inventive concept, an electrode-connecting structure or semiconductor device is provided. The structure or device includes a lower insulating layer, a lower electrode barrier layer formed in the lower insulating layer, the lower electrode barrier layer having a first horizontal width, a lower copper electrode having lateral surfaces surrounded with the lower electrode barrier layer, the lower copper electrode having a second horizontal width smaller than the first horizontal width, an upper insulating layer formed on the lower insulating layer, an upper electrode barrier layer formed in the upper insulating layer, the upper electrode barrier layer being in contact with a portion of a top surface of the lower copper electrode and having a third horizontal width greater than the first horizontal width, and an upper copper electrode being in direct contact with the lower copper electrode and surrounded with the upper electrode barrier layer, the upper copper electrode having a fourth horizontal width smaller than the second horizontal width.

In accordance with another aspect of the inventive concept, an electrode-connecting structure includes an upper electrode structure comprising an upper electrode barrier layer and an upper metal electrode, the upper metal electrode having a lower surface with the upper electrode barrier layer surrounding other surfaces of the upper metal electrode and a lower electrode structure comprising a lower electrode barrier layer and a lower metal electrode, the lower metal electrode being disposed on the lower electrode barrier layer and having an upper surface that contacts the lower surface of the upper metal electrode, wherein a horizontal width of the lower metal electrode is greater than a horizontal width of the upper metal electrode.

Specific features of other embodiments are included in detailed descriptions and drawings.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 1A through 1H are conceptual longitudinal sectional views of electrode-connecting structures according to various embodiments of the inventive concept;

DETAILED DESCRIPTION OF THE EMBODIMENTS

Figure 1A:
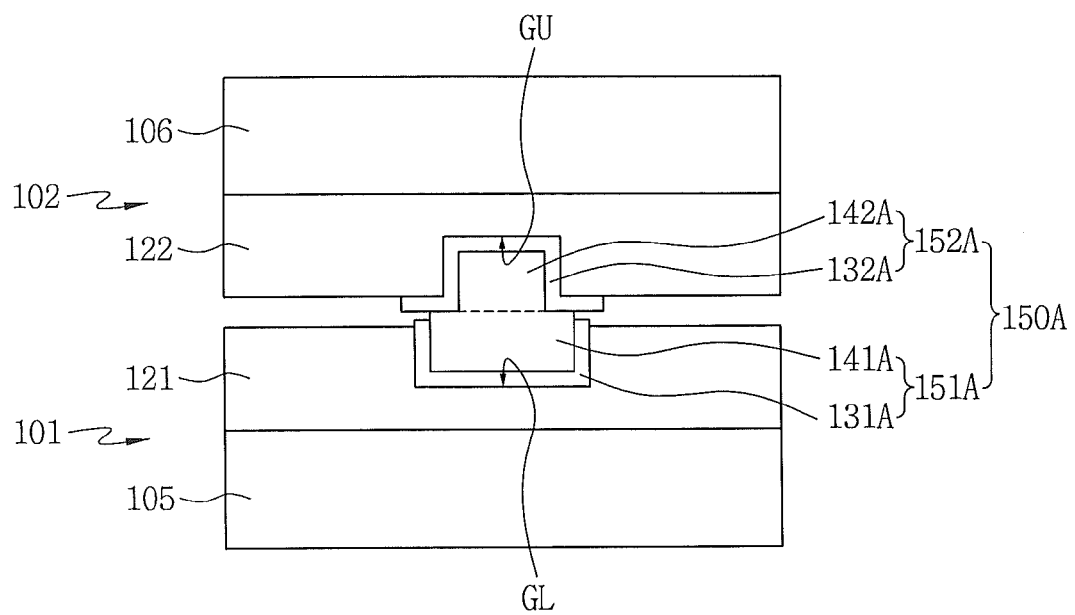

The inventive concept will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled with" another element or layer, it can be directly on, connected to or coupled with the other element or layer or intervening elements or layers may be present. In contrast, when an element is referred to as being "directly on," "directly connected to" or "directly coupled with" another element or layer, there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the inventive concept are described herein with reference to cross-section illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

The same reference numerals are used to denote the same component throughout the specification. Thus, even if not mentioned or described in the corresponding drawing, the same reference numerals or similar reference numerals may be described with reference to other drawings. Also, even if no reference numeral is used to denote a component, the component may be described with reference to other drawings.

FIGS. 1A through 1H are conceptual longitudinal sectional views of electrode-connecting structures 100A to 100G according to various embodiments of the inventive concept.

Referring to FIG. 1A, an electrode-connecting structure 100A according to an embodiment of the inventive concept may include a lower device 101 having a lower electrode structure 151A, and an upper device 102 having an upper electrode structure 152A. The lower device 101 and the upper device 102 may be electrically connected through an electrode structure 150A. The lower and upper electrode structures 151A and 152A may constitute the electrode structure 150A.

The lower device 101 may include a lower insulating layer 121 formed on a lower substrate 105, and a lower electrode structure 151A formed on/in the lower insulating layer 121.

The lower substrate 105 may include a silicon wafer, a silicon-on-insulator (SOI) wafer, a silicon germanium (SiGe) wafer, a silicon carbide (SiC) wafer, a glass substrate, a ceramic substrate, or a packaged semiconductor device. In the embodiment, the lower substrate 105 may exemplarily include a silicon wafer.

The lower insulating layer 121 may include oxygen (O). For example, the lower insulating layer 121 may include silicon oxide.

A lower groove GL may be formed in the lower insulating layer 121. The lower groove GL may be formed in a tetragonal shape from a plan view.

The lower electrode structure 151A may include a lower electrode barrier layer 131A and a lower metal electrode 141A.

The lower electrode barrier layer 131A may be conformally formed on a bottom surface and sidewalls of the lower groove GL. Topmost ends of the lower electrode barrier layer 131A may protrude upward from a top surface of the lower insulating layer 121. In another embodiment, the topmost ends of the lower electrode barrier layer 131A may be disposed at the same level as or at a lower level than the top surface of the lower insulating layer 121.

The lower electrode barrier layer 131A may include a metal layer and/or a metal nitride layer. For example, the lower electrode barrier layer 131A may include titanium (Ti), titanium/titanium nitride (Ti/TiN), TiN, titanium tungsten (TiW), tantalum (Ta), tantalum/tantalum nitride (Ta/TaN), TaN, or another metal/metal nitride layer. In another embodiment, the lower electrode barrier layer 131A may include silicon nitride.

The lower metal electrode 141A may be formed on a bottom surface and sidewalls of the lower electrode barrier layer 131A to fill the lower groove GL. A top surface of the lower metal electrode 141A may be disposed at a higher level than the top surface of the lower insulating layer 121. That is, the top surface of the lower metal electrode 141A may protrude upward from the top surface of the lower insulating layer 121. The lower metal electrode 141A may protrude upward from the topmost ends of the lower metal barrier layer 131A.

For brevity, it is assumed that upper and lower portions of the upper device 102 are inverted. Thus, the upper and lower portions should be interpreted as being compatible with each other.

The upper device 102 may include an upper insulating layer 122 formed on an upper substrate 106, and an upper electrode structure 152A formed on/in the upper insulating layer 122.

The upper substrate 106 may include a silicon wafer, a SOI wafer, a SiGe wafer, a SiC wafer, a glass substrate, or a ceramic substrate. In the present embodiment, the upper substrate 106 may exemplarily include a silicon wafer.

The upper insulating layer 122 may include oxygen. For example, the upper insulating layer 122 may include silicon oxide.

An upper groove GU may be formed in the upper insulating layer 122. The upper groove GU may be formed in a tetragonal shape from the plan view. The upper groove GU may have a smaller horizontal width than the lower groove GL.

The upper electrode structure 152A may include an upper metal barrier layer 132A and an upper metal electrode 142A.

The upper electrode barrier layer 132A may be conformally formed on a bottom surface and sidewalls of the upper groove GU. The upper electrode barrier layer 132A may also be formed on a top surface of the upper insulating layer 122. In other words, the upper electrode barrier layer 132A may extend onto the top surface of the upper insulating layer 122. Specifically, the upper electrode barrier layer 132A may be formed around the upper metal electrode 142A. That is, from the plan view, the upper metal barrier layer 132A may be formed in a shape surrounding the periphery of the upper metal electrode 142A. The upper electrode barrier layer 132A extending onto the top surface of the upper insulating layer 122 may have a horizontal width greater than a horizontal width of the lower metal electrode 141A. This will be described in further detail with reference to other drawings.

The upper electrode barrier layer 132A may include a metal layer and/or a metal nitride layer. For example, the upper electrode barrier layer 132A may include Ti, Ti/TiN, TiN, TiW, Ta, Ta/TaN, TaN, or another metal/metal nitride layer. In another embodiment, the upper electrode barrier layer 132A may include silicon nitride.

The upper metal electrode 142A may be formed on a bottom surface and sidewalls of the upper electrode barrier layer 132A to fill the upper groove GU. A top surface of the upper metal electrode 142A may protrude upward from the top surface of the upper insulating layer 122. The upper metal electrode 142A may have a horizontal width smaller than the horizontal width of the lower metal electrode 141A.

The lower and upper metal electrodes 141A and 142A may be integrally formed. In other words, the lower and upper metal electrodes 141A and 142A may be materially in continuity with each other. Accordingly, a boundary between the lower and upper metal electrodes 141A and 142A is illustrated with a dotted line.

A portion of the lower metal electrode 141A may be in direct contact with a portion of the upper metal barrier layer 132A. FIG. 1A illustrates that outer regions of the lower metal electrode 141A are symmetrically in direct contact with the upper electrode barrier layer 132A. However, only one of the outer regions of the lower metal electrode 141A may be in direct contact with the upper electrode barrier layer 132A.

Referring to FIG. 1B, an electrode-connecting structure 100B according to another embodiment of the inventive concept may include a lower device 101 having a lower electrode structure 151B, and an upper device 102 having an upper electrode structure 152B, and include a lower electrode barrier layer 131B configured to surround a lower metal electrode 141B. The lower and upper devices 101 and 102 may be electrically connected through an electrode structure 150B. The lower and upper electrode structures 151B and 152B may constitute the electrode structure 150B.

The lower electrode barrier layer 131B may surround lateral surfaces of the lower metal electrode 141B. In addition, the lower electrode barrier layer 131B may cover a portion of a top surface of the lower metal electrode 141B. Accordingly, the lower electrode barrier layer 131B may surround the lateral surfaces of the lower metal electrode 141B and peripheral regions of the top surface of the lower metal electrode 141B.

Referring to an enlarged view of a region A, the lower electrode barrier layer 131B may be in direct contact with the upper electrode barrier layer 132B. For example, the lower electrode barrier layer 131B may extend and contact lateral surfaces of an upper metal electrode 142B. In this case, a boundary Ia between the lower and upper electrode barrier layers 131B and 132B may be horizontally formed. In another embodiment, the upper electrode barrier layer 132B may extend and contact the lower metal electrode 141B. In this case, a boundary Ib between the lower and upper electrode barrier layers 131B and 132B may be vertically formed. Other unmentioned components will be understood with reference to components equal or similar to those of FIG. 1A.

Figure 1C:
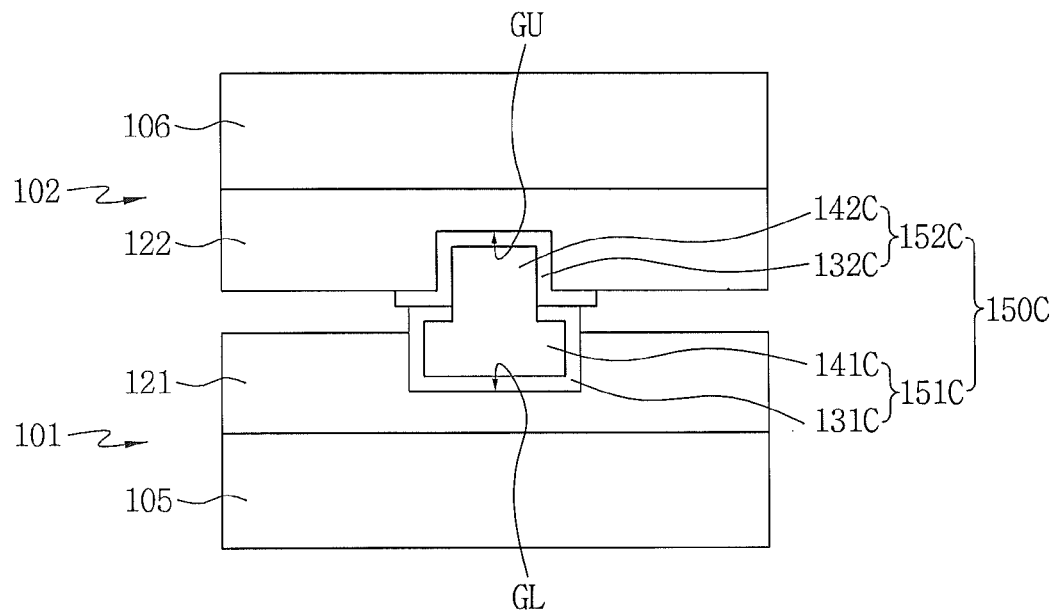

Referring to FIG. 1C, an electrode-connecting structure 100C according to another embodiment of the inventive concept may include a lower device 101 having a lower electrode structure 151C, and an upper device 102 having an upper electrode structure 152C. Also, the electrode-connecting structure 100C may include an upper electrode barrier layer 132C, which protrudes upward from or extends onto a top surface of an upper insulating layer 122, and a lower electrode barrier layer 131C configured to surround a lower metal electrode 141C. The lower and upper devices 101 and 102 may be electrically connected through an electrode structure 150C. The lower and upper electrode structures 151C and 152C may constitute the electrode structure 150C.

The lower electrode barrier layer 131C may be understood with reference to FIG. 1B, and the upper electrode barrier layer 132C may be understood with reference to FIG. 1A. The lower and upper electrode barrier layers 131C and 132C may be in direct contact with each other.

The lower metal electrode 141C and an upper metal electrode 142C may be integrally formed. Accordingly, a boundary between the lower and upper metal electrodes 141C and 142C is omitted. In addition, in some embodiments, the boundary between the lower and upper metal electrodes 141C and 142C may be disposed at the same level as or at a lower level than a top surface of the upper electrode barrier layer 132C. Other unmentioned components will be understood with reference to components equal or similar to those of FIGS. 1A and 1B.

Figure 1D:
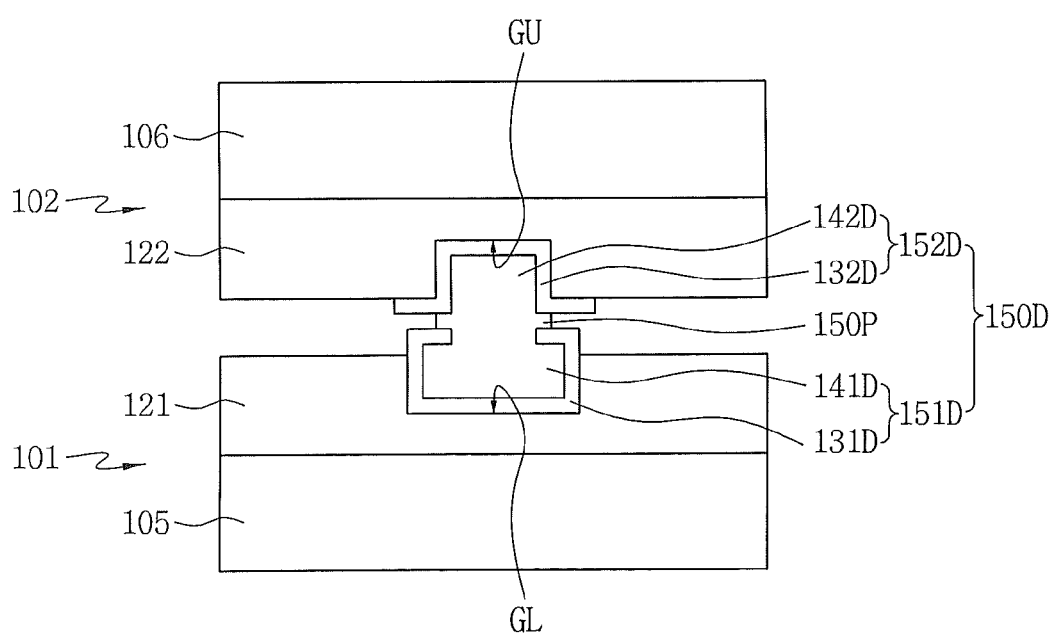

Referring to FIG. 1D, an electrode-connecting structure 100D according to another embodiment of the inventive concept may include a lower device 101 having a lower electrode structure 151D, and an upper device 102 having an upper electrode structure 152D, and include a protrusion 150P interposed between the lower and upper electrode barrier layers 131D and 132D. The lower and upper devices 101 and 102 may be electrically connected through an electrode structure 150D. The lower and upper electrode structures 151D and 152D may constitute the electrode structure 150D.

The protrusion 150P may be a portion of a lower metal electrode 141D, a portion of an upper metal electrode 142D, a combination thereof, or an added metal.

In another embodiment, the lower and upper electrode barrier layers 131D and 132D may be spaced apart from each other. In other words, the lower and upper electrode barrier layers 131D and 132D may be independently spaced apart from each other irrespective of the presence or absence of the protrusion 150P. In this case, the protrusion 150P may be in direct contact with the lower electrode barrier layer 131D and spaced apart from the upper electrode barrier layer 132D. Alternatively, the protrusion 150P may be in direct contact with the upper electrode barrier layer 132D and spaced apart from the lower electrode barrier layer 131D. The present embodiment will be understood in further detail with reference to FIG. 1F. Other unmentioned components will be understood with reference to components equal or similar to those of FIGS. 1A through 1C.

Figure 1E:
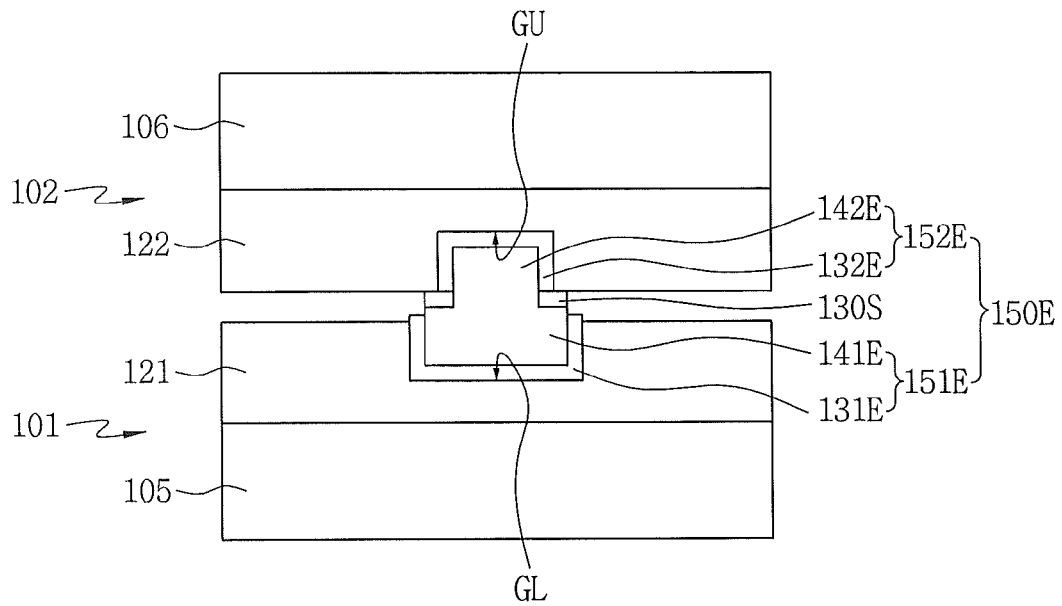

Referring to FIG. 1E, an electrode-connecting structure 100E according to another embodiment of the inventive concept may include a lower device 101 having a lower electrode structure 151E, and an upper device 102 having an upper electrode structure 152E, and include a surface electrode barrier layer 130S partially formed on a top surface of a lower metal electrode 141E. The lower and upper devices 101 and 102 may be electrically connected through an electrode structure 150E. The lower and upper electrode structures 151E and 152E may constitute the electrode structure 150E.

The surface electrode barrier layer 130S may be partially formed on an outer region of the top surface of the lower metal electrode 141E. The surface electrode barrier layer 130S may not be formed on lateral surfaces of the lower metal electrode 141E. That is, the lateral surfaces of the lower metal electrode 141E may be exposed. In addition, lateral ends of the surface electrode barrier layer 130S may be vertically aligned with the lateral surfaces of the lower metal electrode 141E.

In another embodiment, the surface electrode barrier layer 130S may be interpreted as a portion of an upper electrode barrier layer 132E with further reference to FIG. 1A. That is, at least one of the end portions of the upper electrode barrier layer 132E may be interpreted as being vertically aligned with one of the lateral surfaces of the lower metal electrode 141E. Other unmentioned components will be understood with reference to components equal or similar to those of FIGS. 1A through 1D.

Figure 1F:
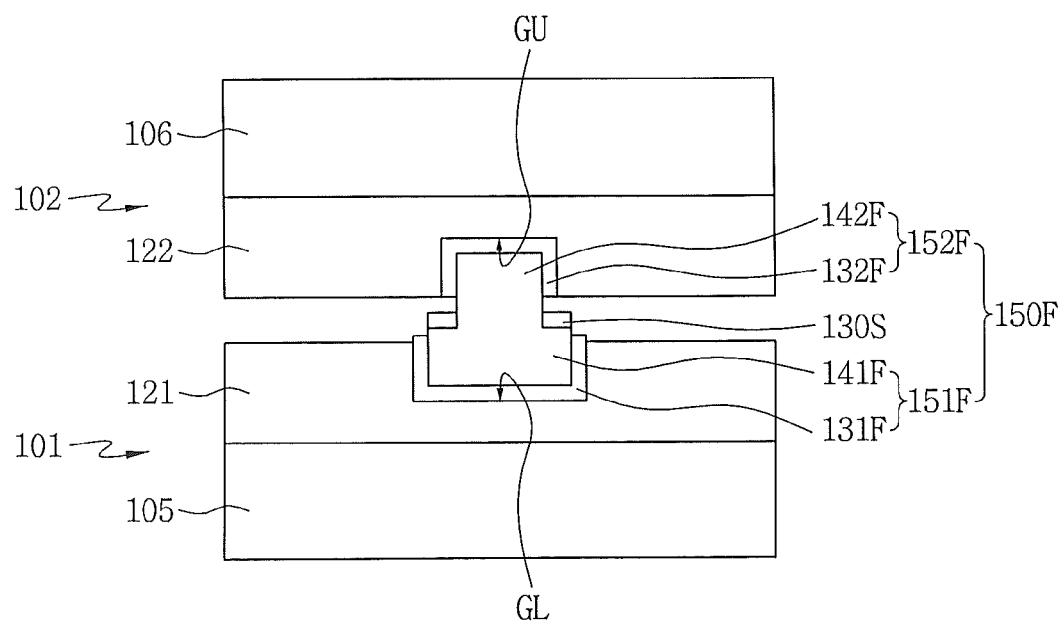

Referring to FIG. 1F, an electrode-connecting structure 100F according to another embodiment of the inventive concept may include a lower device 101 having a lower electrode structure 151F, and an upper device 102 having an upper electrode structure 152F, and include a surface electrode barrier layer 130S spaced apart from an upper electrode barrier layer 132F. The lower and upper devices 101 and 102 may be electrically connected through an electrode structure 150F. The lower and upper electrode structures 151F and 152F may constitute the electrode structure 150F.

In another embodiment, one or both of a lower metal electrode 141F and an upper metal electrode 142F may protrude between the upper electrode barrier layer 132F and the surface electrode barrier layer 130S. Other unmentioned components will be understood with reference to components equal or similar to those of FIGS. 1A through 1E.

Figure 1G:
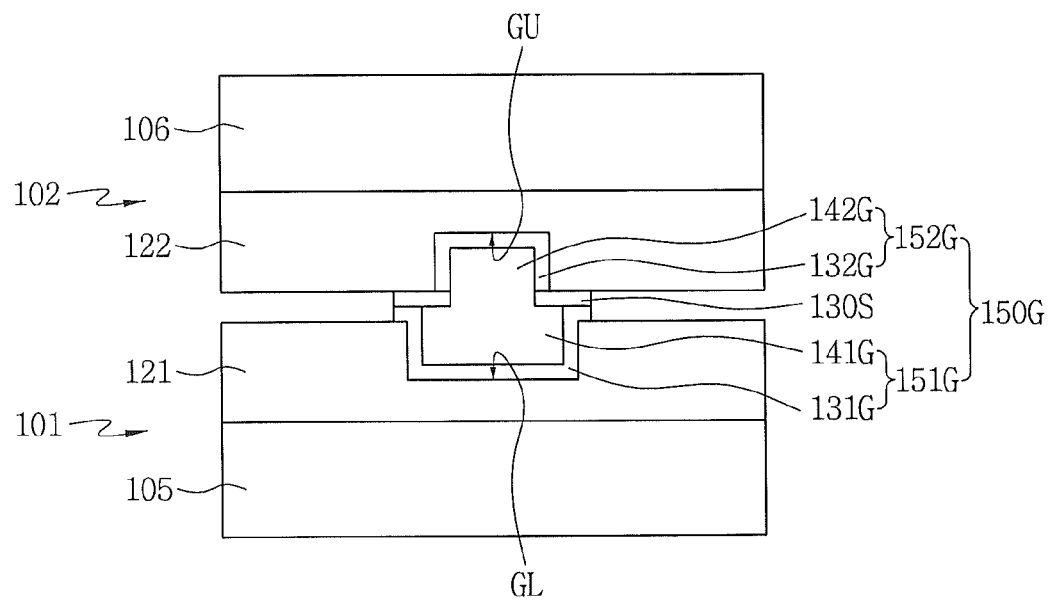

Referring to FIG. 1G, an electrode-connecting structure 100G according to another embodiment of the inventive concept may include a lower device 101 having a lower electrode structure 151G, and an upper device 102 having an upper electrode structure 152G, and include a lower electrode barrier layer 131G and a surface electrode barrier layer 130S partially formed on a lower insulating layer 121. The lower and upper devices 101 and 102 may be electrically connected through an electrode structure 150G. The lower and upper electrode structures 151G and 152G may constitute the electrode structure 150G. The lower electrode barrier layer 131G may extend onto the lower insulating layer 121. The surface electrode barrier layer 130S may be formed not only on a portion of a top surface of a lower metal electrode 141G but also on the lower electrode barrier layer 131G extending onto the lower insulating layer 121. The surface electrode barrier layer 130S may be an independent component, or a portion of an upper electrode barrier layer 132G When the lower electrode barrier layer 131G and the surface electrode barrier layer 130S are formed of the same material, the boundary therebetween may disappear. That is, the lower electrode barrier layer 131G and the surface electrode barrier layer 130S may be integrally formed or materially in continuity with each other. Other unmentioned components will be understood with reference to components equal or similar to those of FIGS. 1A through 1F.

In the present embodiments, positions of the lower and upper devices 101 and 102 may be exchanged. That is, upper and lower portions of the electrode structures 150A to 150G may be inverted.

Figure 1H:
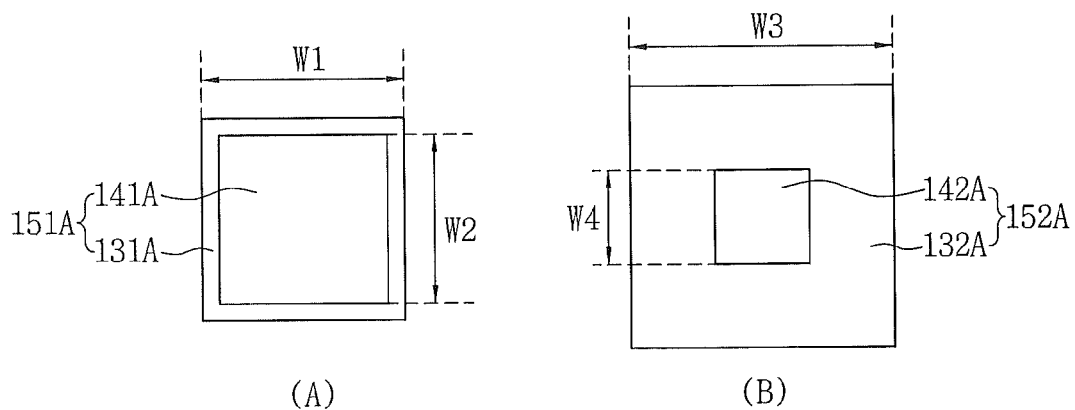

(A) of FIG. 1H is a top view of the lower electrode structure 151A shown in FIG. 1A, and (B) of FIG. 1H is a bottom view of the upper electrode structure 152A shown in FIG. 1A. For brevity, each of the lower and upper electrode structures 151A and 152A is illustrated in a square shape. Each of the lower and upper electrode structures 151A and 152A may be formed in various shapes, such as a rectangular shape, bar shape, a line shape, or a polygonal shape. Referring to (A) and (B) of FIG. 1H, a lower electrode barrier layer 131A of the lower electrode structure 151A may have a first horizontal width W1, and a lower metal electrode 141A of the lower electrode structure 151A may have a second horizontal width W2. An upper electrode barrier layer 132A of the upper electrode structure 152A may have a third horizontal width W3, and an upper metal electrode 142A of the upper electrode structure 152A may have a fourth horizontal width. As can be seen from (A) and (B) of FIG. 1H, the first horizontal width W1 may be greater than the second horizontal width W2. The second horizontal width W2 may be greater than the fourth horizontal width W4. The third horizontal width W3 may be greater than the first horizontal width W1.

Therefore, in the electrode-connecting structures 100A to 100G shown in FIGS. 1A through 1G, a horizontal width of the lower metal electrodes 141A to 141G may be greater than a horizontal width of the upper metal electrodes 142A to 142G. Thus, alignment margins between the lower metal electrodes 141A to 141G and the upper metal electrodes 142A to 142G may be improved.

The electrode-connecting structures 100A to 100G shown in FIGS. 1A through 1G may provide a low-resistance electrode connection because the lower metal electrodes 141A to 141G may be integrally formed with the upper metal electrodes 142A to 142G. In particular, when the lower metal electrodes 141A to 141G and the upper metal electrodes 142A to 142G include copper, an electrode connection having a much lower resistance than an electrode connection using a conventional solder material may be provided. Also, because the lower metal electrodes 141A to 141G and the upper metal electrodes 142A to 142G do not include a solder material, the lower and upper metal electrode 141A to 141G and the 142A to 142G may not be formed in spherical shapes but in mesa shapes having planar top and bottom surfaces. Therefore, vertical thicknesses of the lower metal electrodes 141A to 141G and the upper metal electrodes 142A to 142G, and the entire thicknesses of the electrode-connecting structures 100A to 100G may be reduced.

In the electrode-connecting structures 100A to 100G shown in FIGS. 1A through 1G, the lower metal electrodes 141A to 141G and the upper metal electrodes 142A to 142G may not be in direct contact with the lower insulating layer 121 and the upper insulating layer 122, respectively. For example, the lower metal electrodes 141A to 141G and the upper metal electrodes 142A to 142G may be spaced apart from the lower insulating layer 121 and the upper insulating layer 122 by the lower electrode barrier layers 131A to 131G and the upper electrode barrier layers 132A to 132G, respectively. Accordingly, oxygen or other impurities contained in the lower and upper insulating layers 121 and 122 cannot move to the lower metal electrodes 141A to 141G and the upper metal electrodes 142A to 142G. The lower metal electrodes 141A to 141G and the upper metal electrodes 142A to 142G according to the inventive concept may have stable electrical, physical, and/or chemical properties and extended lifespans.

FIGS. 2A through 2G are conceptual longitudinal sectional views of electrode-connecting structures 200A to 200G according to various embodiments of the inventive concept.

Figure 2A:
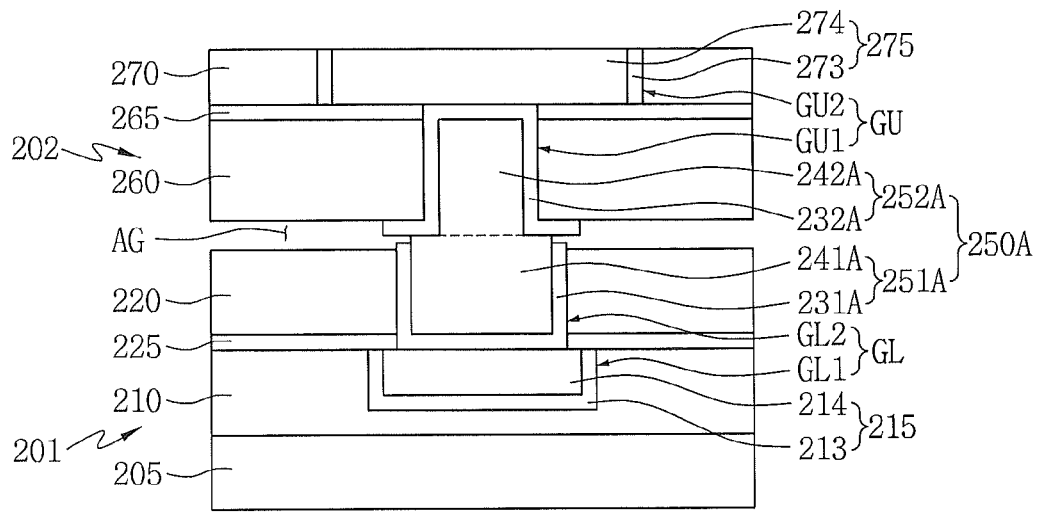
FIGS. 2A through 2G are conceptual longitudinal sectional views of electrode-connecting structures according to various embodiments of the inventive concept.

Referring to FIG. 2A, an electrode-connecting structure 200A according to an embodiment of the inventive concept may include a substrate part 201 and a redistribution part 202 disposed on the substrate part 201. The substrate part 201 and the redistribution part 202 may be electrically connected through an electrode structure 250A. The electrode structure 250A may include a lower electrode structure 251A and an upper electrode structure 252A.

The substrate part 201 may include a lower substrate 205, a lowermost insulating layer 210, a lower interconnection 215, a lower insulating layer 220, and a lower electrode structure 251A.

The lower substrate 205 may include a silicon wafer, a SOI wafer, a SiGe wafer, a SiC wafer, a glass substrate, a ceramic substrate, or a packaged semiconductor device. In the present embodiment, the lower substrate 205 may exemplarily include a silicon wafer.

The lowermost insulating layer 210 may include oxygen. For example, the lowermost insulating layer 210 may include silicon oxide.

A lowermost groove GL1 may be formed in the lowermost insulating layer 210.

The lower interconnection 215 may be formed within the lowermost groove GL1. The lower interconnection 215 may include a lower interconnection barrier layer 213 and a lower metal interconnection 214. The lower interconnection barrier layer 213 may be conformally formed on a bottom surface and sidewalls of the lowermost groove GL1. The lower interconnection barrier layer 213 may include any one of Ti, Ti/TiN, TiN, TiW, Ta, Ta/TaN, TaN, or SiN. The lower metal interconnection 214 may be formed on a bottom surface and sidewalls of the lower interconnection barrier layer 213 to fill the lowermost groove GL1. The lower metal interconnection 214 may include copper. A top surface of the lowermost insulating layer 210, topmost ends of the lower interconnection barrier layer 213, and top surfaces of the lower metal interconnection 214 may be disposed at the same level.

A lower interlayer barrier layer 225 may be formed between the lowermost insulating layer 210 and the lower insulating layer 220. The lower interlayer barrier layer 225 may also be formed on the lower interconnection 215. That is, the lower interlayer barrier layer 225 may be formed on the lower interconnection barrier layer 213 and the lower metal interconnection 214. Specifically, the lower interlayer barrier layer 225 may be in direct contact with the lower interconnection barrier layer 213 and the lower metal interconnection 214. The lower interlayer barrier layer 225 may be partially in contact with the lower metal interconnection 214. That is, the lower interlayer barrier layer 225 may expose a portion of a top surface of the lower metal interconnection 214. The lower interlayer barrier layer 225 may include silicon nitride.

The lower insulating layer 220 may be formed on the lower interlayer barrier layer 225. The lower insulating layer 220 may also include oxygen. For instance, the lower insulating layer 220 may also include silicon oxide.

A lower groove GL2 may be formed in the lower insulating layer 220. The lower groove GL2 may partially remove the lower interlayer barrier layer 225. Accordingly, the lower groove GL2 may expose a portion of a top surface of the lower interconnection 215.

A lower electrode structure 251A may be formed within the lower groove GL2. The lower electrode structure 251A may include a lower electrode barrier layer 231A and a lower metal electrode 241A. The lower electrode barrier layer 231A may be conformally formed on a bottom surface and sidewalls of the lower groove GL2. Specifically, the lower electrode barrier layer 231A may be conformally formed on the top surface of the lower interconnection 215 and sidewalls of the lower insulating layer 220, which constitute the lower groove GL2. Accordingly, the lower electrode structure 251A may be formed on the lower interconnection 215. The lower electrode structure 251A may be in direct contact with the lower metal interconnection 214. The lower electrode structure 251A will be understood in further detail with reference to the lower electrode structure 151A of FIG. 1A.

The redistribution part 202 may include an upper insulating layer 260, an upper electrode structure 252A, a topmost insulating layer 270, and a redistribution structure 275.

An upper groove GU1 may be formed in the upper insulating layer 260. The upper groove GU1 may partially expose a bottom surface of the redistribution structure 275. The upper insulating layer 260 may also include oxygen. For example, the upper insulating layer 260 may also include silicon oxide.

An upper electrode structure 252A may be formed within the upper groove GU1 The upper electrode structure 252A may include an upper electrode barrier layer 232A and an upper metal electrode 242A, The upper electrode barrier layer 232A may be conformally formed on sidewalls of the upper groove GU1 and under the bottom surface of the redistribution structure 275. The upper electrode barrier layer 232A may include any one of Ti, Ti/TiN, TiN, TiW, Ta, Ta/TaN, TaN, or SiN. The upper metal electrode 242A may be formed on the upper electrode barrier layer 232A to fill the upper groove GU1. The upper electrode structure 252A will be understood in further detail with reference to the upper electrode structure 152A of FIG. 1A.

An upper interlayer barrier layer 265 may be formed between the upper insulating layer 260 and the topmost insulating layer 270. The upper interlayer barrier layer 265 may be formed under a portion of the bottom surface of the redistribution structure 275. That is, the upper interlayer barrier layer 265 may be formed under bottom surfaces of a redistribution barrier layer 273 and a redistribution metal interconnection 274. For example, the upper interlayer barrier layer 265 may be in direct contact with the redistribution barrier layer 273 and the redistribution metal interconnection 274. The upper interlayer barrier layer 265 may be partially in contact with the bottom surface of the redistribution metal interconnection 274. The upper interlayer barrier layer 265 may include silicon nitride.

The topmost insulating layer 270 may be formed on the upper interlayer barrier layer 265. A topmost groove GU2 may be formed in the topmost insulating layer 270. The topmost groove GU2 may expose the upper interlayer barrier layer 265 and the upper electrode structure 252A. For instance, the topmost groove GU2 may expose the upper electrode barrier layer 232A. The topmost insulating layer 270 may include any one of silicon oxide, silicon nitride, or polyimide.

The redistribution structure 275 may be formed in the topmost insulating layer 270. The redistribution structure 275 may include the redistribution barrier layer 273 and the redistribution metal interconnection 274. The redistribution barrier layer 273 may be formed on sidewalls of the topmost groove GU2. Accordingly, the redistribution barrier layer 273 may be formed only on lateral surfaces of the redistribution metal interconnection 274. The redistribution barrier layer 273 may include any one of Ti TiN, TiW, Ta, Ta/TaN, TaN, or SiN.

The redistribution metal interconnection 274 may be formed on the upper electrode structure 252A and the redistribution barrier layer 273 to fill the topmost groove GU2. The redistribution metal interconnection 274 may include a metal, such as copper (Cu), aluminum (Al), nickel (Ni), or tin (Sn). FIG. 2A exemplarily illustrates that top surfaces of the topmost insulating layer 270 and the redistribution structure 275 are formed at the same level.

The lower electrode structure 251A and the upper electrode structure 252A may constitute the electrode structure 250A. An air gap AG may be present between the substrate part 201 and the redistribution part 202.

Figure 2B:
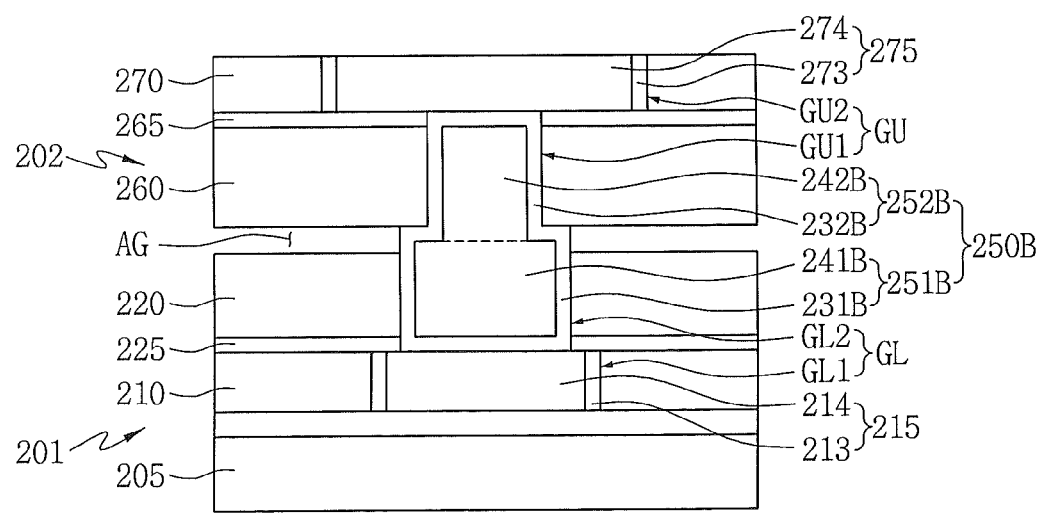

Referring to FIG. 2B, an electrode-connecting structure 200B according to another embodiment of the inventive concept may include a substrate part 201 and a redistribution part 202 disposed on the substrate part 201. The substrate part 201 and the redistribution part 202 may be electrically connected through an electrode structure 250B. The electrode structure 250B may include a lower electrode structure 251B and an upper electrode structure 252B. The lower electrode structure 251B may include a lower electrode barrier layer 231B and a lower metal electrode 241B. The upper electrode structure 252B may include an upper electrode barrier layer 232B and an upper metal electrode 242B.

The lower electrode barrier layer 231B may surround the lower metal electrode 241B. The lower electrode barrier layer 231B may be in direct contact with the upper electrode barrier layer 232B. Other unmentioned components and a further detailed description will be understood with reference to components equal or similar to those of FIGS. 1B and 2A.

Figure 2C:
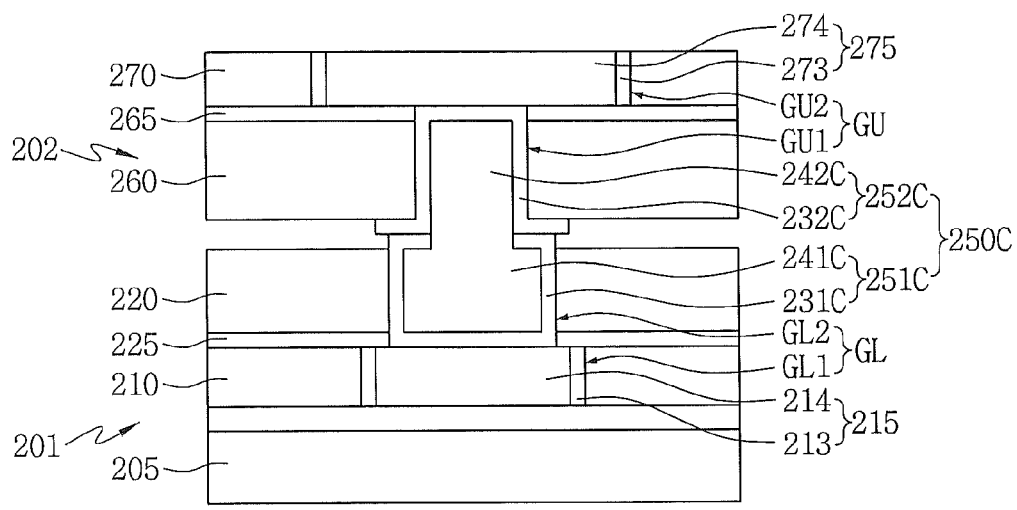
Figure 2D:
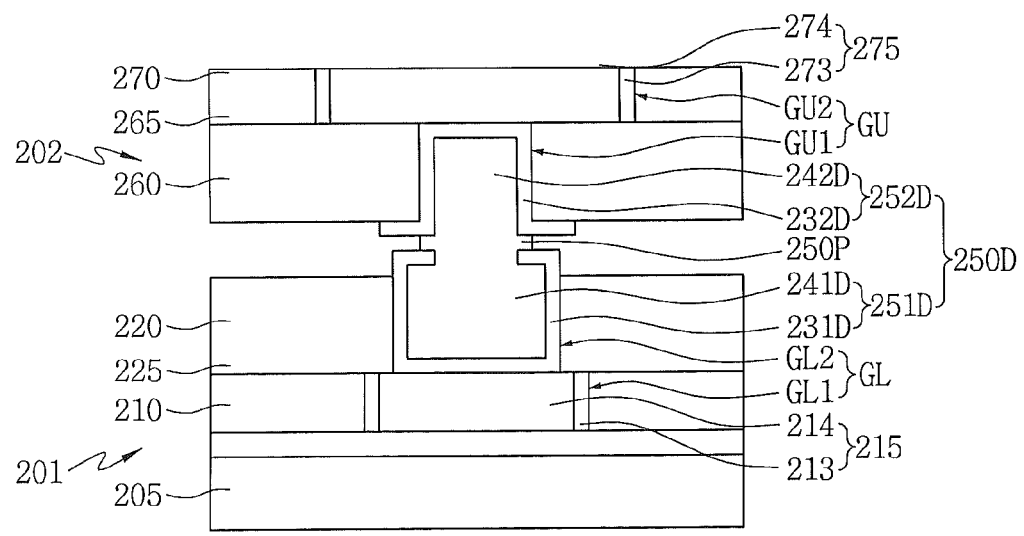

Referring to FIG. 2C, an electrode-connecting structure 200C according to another embodiment of the inventive concept may include a substrate part 201 and a redistribution part 202 disposed on the substrate part 201. The substrate part 201 and the redistribution part 202 may be electrically connected through an electrode structure 250C. The electrode structure 250C may include a lower electrode structure 251C and an upper electrode structure 252C. The lower electrode structure 251C may include a lower electrode barrier layer 231C and a lower metal electrode 241C. The upper electrode structure 252C may include an upper electrode barrier layer 232C and an upper metal electrode 242C.

The lower electrode barrier layer 231C may surround the upper electrode barrier layer 232C and the lower metal electrode 241C, which may protrude or extend under a bottom surface of the upper insulating layer 260. The lower electrode barrier layer 231C may be in direct contact with the upper electrode barrier layer 232C. Other unmentioned components and a further detailed description will be understood with reference to components equal or similar to those of FIGS. 1C and 2A through 2B.

Referring to FIG. 2B, an electrode-connecting structure 200D according to another embodiment of the inventive concept may include a substrate part 201 and a redistribution part 202 disposed on the substrate part 201. The substrate part 201 and the redistribution part 202 may be electrically connected through an electrode structure 250D. The electrode structure 250D may include a lower electrode structure 251D and an upper electrode structure 252D. The lower electrode structure 251D may include a lower electrode barrier layer 231D and a lower metal electrode 241D. The upper electrode structure 252D may include an upper electrode barrier layer 232D and an upper metal electrode 242D.

A protrusion 250P may be formed between the lower and upper electrode barrier layers 231D and 232D. The protrusion 250P may be a portion of the lower metal electrode 241D, a portion of the upper metal electrode 242D, a combination thereof, or an added metal. Other unmentioned components and a further detailed description will be understood with reference to components equal or similar to those of FIGS. 1D and 2A through 2C.

Figure 2E:
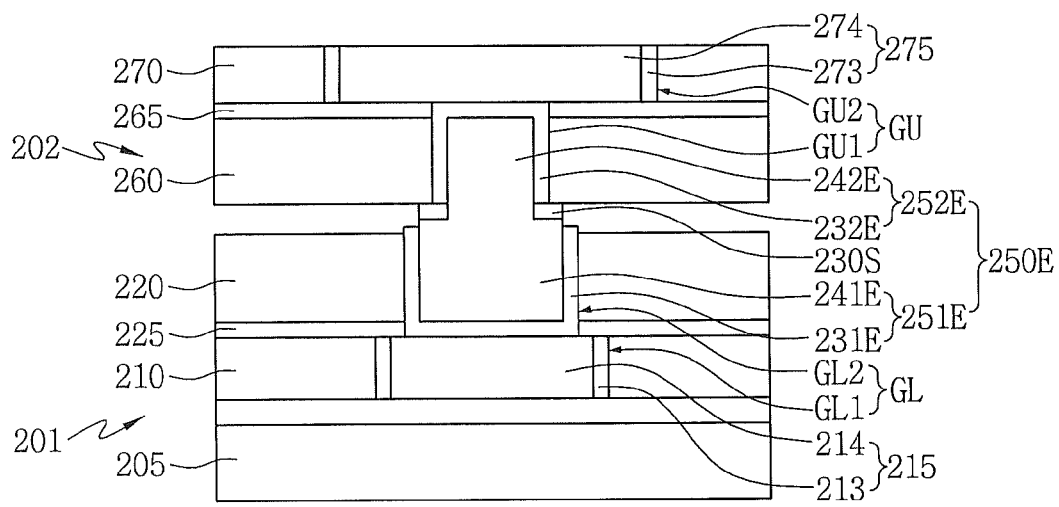

Referring to FIG. 2E, an electrode-connecting structure 200E according to another embodiment of the inventive concept may include a substrate part 201 and a redistribution part 202 disposed on the substrate part 201. The substrate part 201 and the redistribution part 202 may be electrically connected through an electrode structure 250E. The electrode structure 250E may include a lower electrode 251E and an upper electrode structure 252E. The lower electrode structure 251E may include a lower electrode barrier layer 231e and a lower metal electrode 241E. The upper electrode structure 252E may include an upper electrode barrier layer 232E and an upper metal electrode 242E.

A surface electrode barrier layer 230S may be partially formed on a top surface of the lower metal electrode 241E. The surface electrode barrier layer 230S may be partially formed on an outer region of the top surface of the lower metal electrode 241E. The surface electrode barrier layer 230S may not be formed on lateral surfaces of the lower metal electrode 241E. That is, the lateral surfaces of the lower metal electrode 241E may be exposed. In addition, lateral ends of the surface electrode barrier layer 230S may be vertically aligned with the lower metal electrode 241E.

In another embodiment, the surface electrode barrier layer 230S may be interpreted as a portion of the upper electrode barrier layer 232E with further reference to FIG. 2A. That is, at least one of the end portions of the upper electrode barrier layer 232E may be interpreted as being vertically aligned with one of the lateral surfaces of the lower metal electrode 241E. Other unmentioned components and a further detailed description will be understood with reference to components equal or similar to those of FIGS. 1E and 2A through 2D.

Figure 2F:
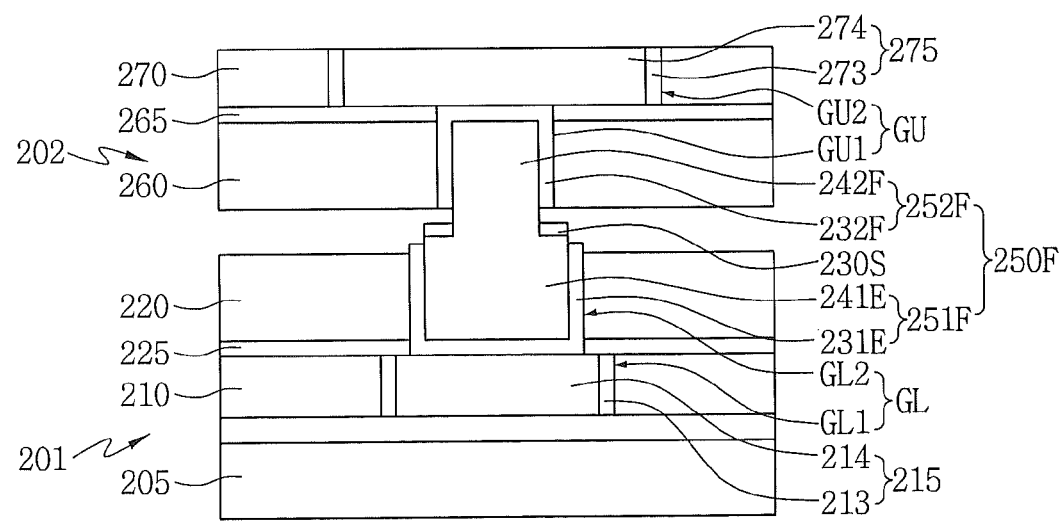

Referring to FIG. 2F, an electrode-connecting structure 200F according to another embodiment of the inventive concept may include a substrate part 201 and a redistribution part 202 disposed on the substrate part 201. The substrate part 201 and the redistribution part 202 may be electrically connected through an electrode structure 250F. The electrode structure 250F may include a lower electrode structure 251F and an upper electrode structure 252F. The lower electrode structure 251F may include a lower electrode barrier layer 231F and a lower metal electrode 241F. The upper electrode structure 252F may include an upper electrode barrier layer 232F and an upper metal electrode 242F.

A surface electrode barrier layer 230S may be formed apart from the upper electrode barrier layer 232F.

In another embodiment, with further reference to FIG. 1D, one or both of the lower metal electrode 241F and the upper metal electrode 242F may protrude between the upper electrode barrier layer 232F and the surface electrode barrier layer 230S. Other unmentioned components and a further detailed description will be understood with reference to components equal or similar to those of FIGS. 1F and 2A through 2E.

Figure 2G:
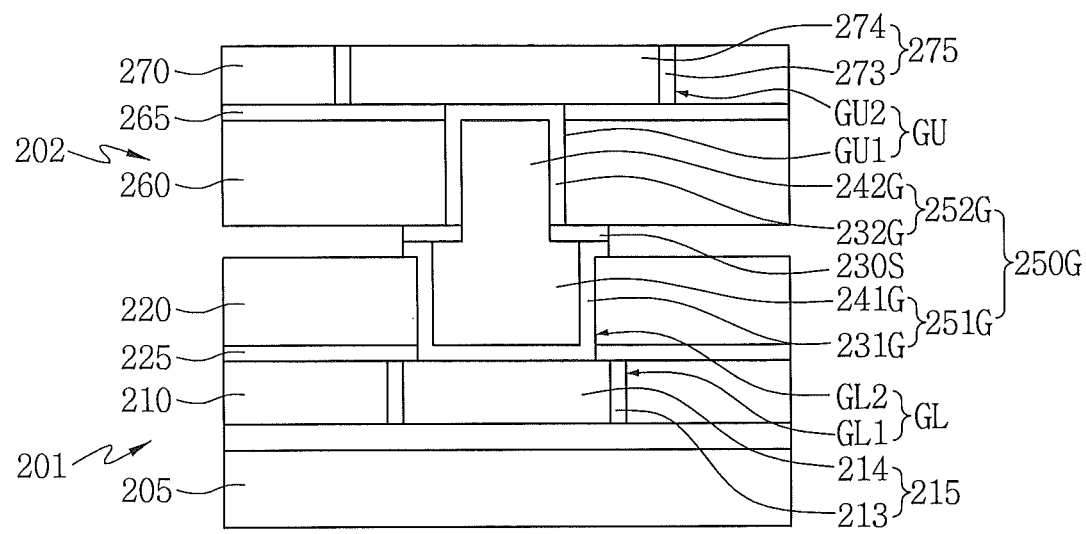

Referring to FIG. 2G, an electrode-connecting structure 200G according to another embodiment of the inventive concept may include a substrate part 201 and a redistribution part 202 disposed on the substrate part 201. The substrate part 201 and the redistribution part 202 may be electrically connected through an electrode structure 250G. The electrode structure 250G may include a lower electrode structure 251G and an upper electrode structure 252G. The lower electrode structure 251G may include a lower electrode barrier layer 231G, a lower metal electrode 241G, and a lower surface electrode barrier layer 230S. The upper electrode structure 252G may include an upper electrode barrier layer 232G and an upper metal electrode 242G.

A lower electrode barrier layer 231G may extend onto a lower insulating layer 220. The surface electrode barrier layer 230S may be formed not only on a partial surface of a lower metal electrode 241G but also on an upper electrode barrier layer 231G, the lower electrode barrier layer 231G extending on the lower insulating layer 220. The surface electrode barrier layer 230S may be an independent component or a portion of an upper electrode barrier layer 232G. When the lower electrode barrier layer 231G and the surface electrode barrier layer 230S are formed of the same material, the boundary therebetween may disappear. That is, the lower electrode barrier layer 231G and the surface electrode barrier layer 230S may be integrally formed or materially in continuity with each other. Other unmentioned components will be understood with reference to components equal or similar to those of FIGS. 2A through 2F.

FIGS. 3A through 3G are conceptual longitudinal sectional views of electrode-connecting structures 300A through 300G according to various embodiments of the inventive concept.

Figure 3A:
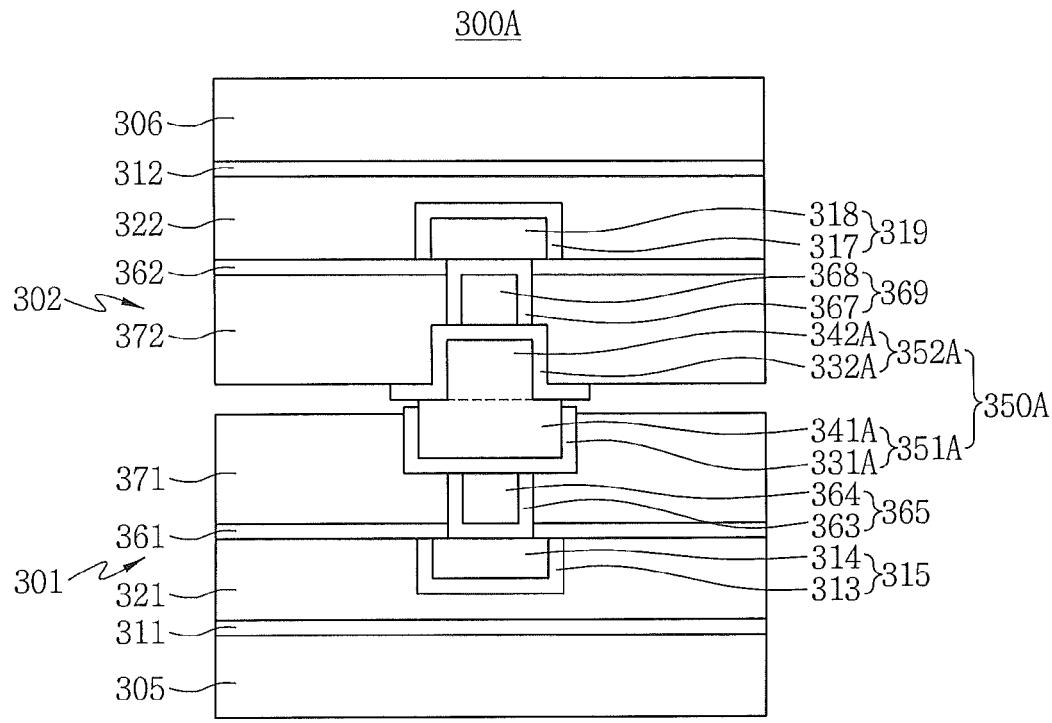
FIGS. 3A through 3G are conceptual longitudinal sectional views of electrode-connecting structures according to various embodiments of the inventive concept.

Referring to FIG. 3A, an electrode-connecting structure 300A according to an embodiment of the inventive concept may include a lower device 301 and an upper device 302 that are connected. The lower and upper devices 301 and 302 may be electrically connected using an electrode structure 350A. The electrode structure 350A may include a lower electrode structure 351A and an upper electrode structure 352A.

The lower device 301 may include a lower substrate 305, a lower interlayer insulating layer 321, a lower interconnection 315, a lower insulating layer 371, a lower via structure 365, and a lower electrode structure 351A. A lower stopper layer 311 may be formed between the lower substrate 305 and the lower interlayer insulating layer 321. A lower interlayer barrier layer 361 may be formed between the lower interlayer insulating layer 321 and the lower insulating layer 371. The lower interconnection 315 may be formed in the lower interlayer insulating layer 321. The lower via structure 365 may be formed in the lower insulating layer 371. The lower electrode structure 351A may be formed on the lower via structure 365 and in the lower insulating layer 371. The lower electrode structure 351A may include a lower electrode barrier layer 331A and a lower metal electrode 341A.

The lower substrate 305 may include a silicon wafer, a SOI wafer, a SiGe wafer, a SiC wafer, a glass substrate, a ceramic substrate, or a packaged semiconductor device. In the present embodiment, the lower substrate 305 may exemplarily include a silicon wafer.

The lower stopper layer 311 may include silicon oxide, silicon nitride, or silicon oxynitride.

The lower interlayer insulating layer 321 may include silicon oxide. The silicon oxide may include impurities, such as hydrogen (H), carbon (C), boron (B), phosphorus (P), chlorine (Cl), fluorine (F), or nitrogen (N).

The lower interconnection 315 may be formed in the lower interlayer insulating layer 321. A top surface of the lower interconnection 315 may be at the same level as a top surface of the lower interlayer insulating layer 321. The lower interconnection 315 may include a lower interconnection barrier layer 313 and a lower metal interconnection 314. The lower interconnection barrier layer 313 may surround a bottom surface and lateral surfaces of the lower metal interconnection 314. The lower interconnection barrier layer 313 may include Ti, Ti/TiN, TiN, TiW, Ta, Ta/TaN, TaN, or another metal/metal nitride layer. In another embodiment, the lower interconnection barrier layer 313 may include silicon nitride. The lower metal interconnection 314 may include copper. In another embodiment, the lower metal interconnection 314 may include a metal, such as aluminum or tungsten (W), or a metal silicide.

The lower interlayer barrier layer 361 may be formed on the lower interlayer insulating layer 321 and the lower interconnection 315. The lower interlayer barrier layer 361 may cover a portion of the top surface of the lower interconnection 315. The lower interlayer barrier layer 361 may include silicon oxide, silicon nitride, or silicon oxynitride.

The lower insulating layer 371 may include silicon oxide. The silicon oxide may include impurities, such as hydrogen, carbon, boron, phosphorus, chlorine, fluorine, or nitrogen. In another embodiment, the lower insulating layer 371 may include polyimide or an epoxy resin.

The lower via structure 365 may include a lower via barrier layer 363 and a lower via plug 364. The lower via barrier layer 363 may surround a bottom surface and lateral surfaces of the lower via plug 364. The lower via barrier layer 363 may be in direct contact with the lower interconnection 315. The lower via barrier layer 363 may include Ti, Ti/TiN, TiN, TiW, Ta, Ta/TaN, TaN, or another metal/metal nitride layer. In another embodiment, the lower via barrier layer 363 may include silicon nitride. The lower via plug 364 may include a metal, such as copper.

The lower electrode structure 351A may include a lower electrode barrier layer 331A and a lower metal electrode 341A. The lower electrode barrier layer 331A may surround a bottom surface and lateral surfaces of the lower metal electrode 341A.

The lower electrode barrier layer 331A may include Ti, Ti/TiN, TiN, TiW, Ta, Ta/TaN, TaN, or another metal/metal nitride layer. In another embodiment, the lower electrode barrier layer 331A may include silicon nitride. The lower metal electrode 341A may include a metal, such as copper. The lower electrode structure 351A will be understood in detail with further reference to FIG. 1A.

For brevity, it is assumed that upper and lower portions of the upper device 302 are inverted.

The upper device 302 may include an upper substrate 306, an upper interlayer insulating layer 322, an upper interconnection 316, an upper insulating layer 372, an upper via structure 366, and the upper electrode structure 352A. An upper stopper layer 312 may be formed between the upper substrate 306 and the upper interlayer insulating layer 322. An upper interlayer barrier layer 362 may be formed between the upper interlayer insulating layer and the upper insulating layer 372. The upper interconnection 316 may be formed in the upper interlayer insulating layer 322. The upper via structure 366 may be formed in the upper insulating layer 372. The upper electrode structure 352A may be formed on the upper via structure 366 and in the upper insulating layer 372. The upper electrode structure 352A may include an upper electrode barrier layer 332A and an upper metal electrode 342A.

The upper substrate 306 may include a silicon wafer, a SOI wafer, a SiGe wafer, a SiC wafer, a glass substrate, a ceramic substrate, or a packaged semiconductor device. In the present embodiment, the upper substrate 306 may exemplarily include a silicon wafer.

The upper stopper layer 312 may include silicon oxide, silicon nitride, or silicon oxynitride.

The upper interlayer insulating layer 322 may include silicon oxide. The silicon oxide may include impurities, such as hydrogen, carbon, boron, phosphorus, chlorine, fluorine, or nitrogen.

An upper interconnection 319 may be formed in the upper interlayer insulating layer 322. A top surface of the upper interconnection 319 may be at the same level as a top surface of the upper interlayer insulating layer 322. The upper interconnection 319 may include an upper interlayer insulating layer 317 and an upper metal interconnection 318. The lower interconnection barrier layer 313 may surround a bottom surface and lateral surfaces of the lower metal interconnection 314. The lower interconnection barrier layer 313 may include Ti, Ti/TiN, TiN, TiW, Ta, Ta/TaN, TaN, or another metal/metal nitride layer. In another embodiment, the lower interconnection barrier layer 313 may include silicon nitride. The lower metal interconnection 314 may include copper. In another embodiment, the lower metal interconnection 314 may include a metal, such as aluminum or tungsten, or a metal silicide.

The upper interlayer barrier layer 362 may be formed on the upper interlayer insulating layer 322 and the upper interconnection 319. The upper interlayer barrier layer 362 may cover a portion of the top surface of the upper interconnection 319. The upper interlayer barrier layer 362 may include silicon oxide, silicon nitride, or silicon oxynitride.

The upper insulating layer 372 may include silicon oxide. The silicon oxide may include impurities, such as hydrogen, carbon, boron, phosphorus, chlorine, fluorine, or nitrogen. In another embodiment, the upper insulating layer 372 may include polyimide or an epoxy resin.

An upper via structure 369 may include an upper via barrier layer 367 and an upper via plug 368. The upper via barrier layer 367 may surround a bottom surface and lateral surfaces of the upper via plug 368. The upper via barrier layer 367 may be in direct contact with the upper interconnection 319. The upper via barrier layer 367 may include Ti, Ti/TiN, TiN, TiW, Ta, Ta/TaN, TaN, or another metal/metal nitride layer. In another embodiment, the upper via barrier layer 367 may include silicon nitride. The upper via plug 368 may include a metal, such as copper.

The upper electrode structure 352A may include the upper electrode barrier layer 332A and the upper metal electrode 342A. The upper electrode barrier layer 332A may surround a bottom surface and lateral surfaces of the upper metal electrode 342A.

The upper electrode barrier layer 332A may include Ti, Ti/TiN, TiN, TiW, Ta, Ta/TaN, TaN, or another metal/metal nitride layer. In another embodiment, the upper electrode barrier layer 332A may include silicon nitride. The upper metal electrode 342A may include a metal, such as copper. The upper electrode structure 352A will be understood in detail with further reference to FIG. 1A.

Figure 3B:
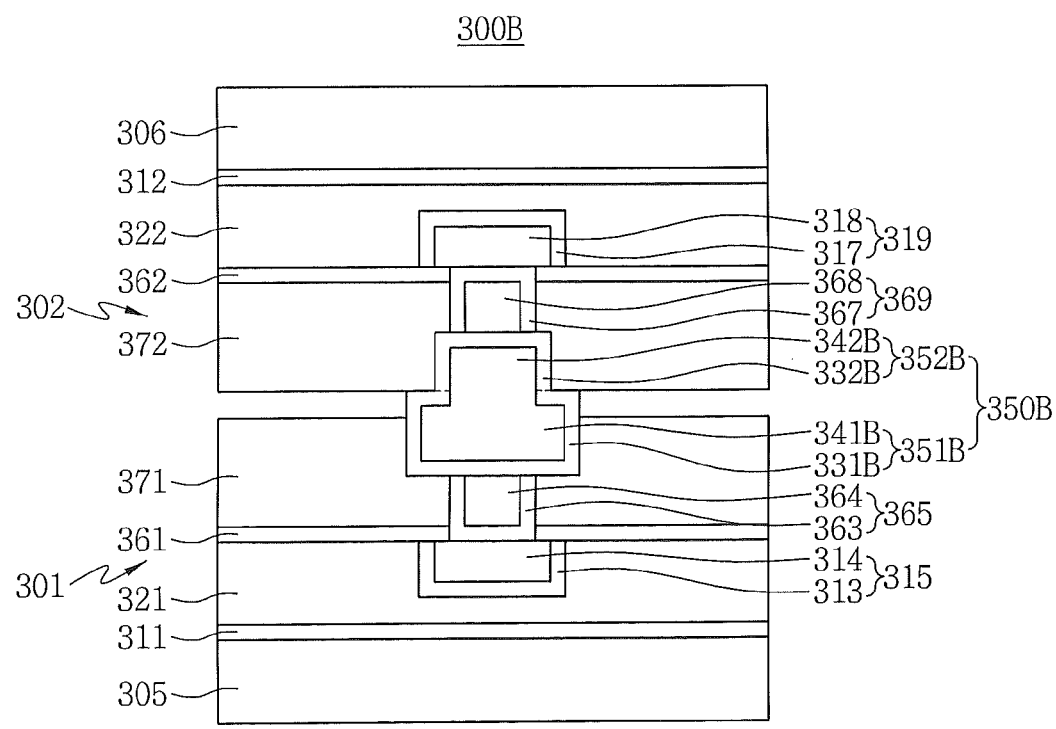

Referring to FIG. 3B, an electrode-connecting structure 300B according to another embodiment of the inventive concept may include a lower device 301 and an upper device 302 that are connected. The lower and upper devices 301 and 302 may be electrically connected through an electrode structure 350B. The electrode structure 350B may include a lower electrode structure 351B and an upper electrode structure 352B.

A lower electrode barrier layer 331B may surround lateral surfaces of the lower metal electrode 341B. In addition, the lower electrode barrier layer 331B may cover a portion of a top surface of the lower metal electrode 341B. In other words, the lower electrode barrier layer 331B may surround peripheral regions of the lateral and top surfaces of the lower metal electrode 341B. Other unmentioned components will be understood with reference to components equal or similar to those of FIGS. 1B and 3A.

Figure 3C:
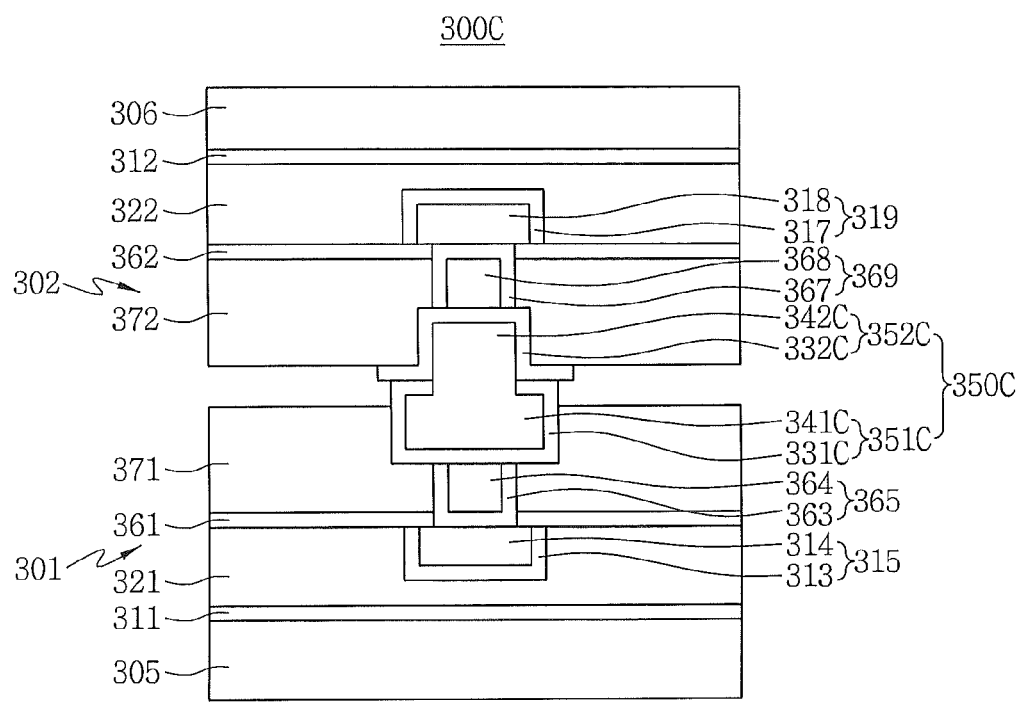

Referring to FIG. 3C, an electrode-connecting structure 300C according to another embodiment of the inventive concept may include a lower device 301 and an upper device 302. Also, the electrode-connecting structure 300C may include an upper electrode barrier layer 332C, which may protrude or extend onto a top surface of the upper insulating layer 372, and a lower electrode barrier layer 331C configured to surround a lower metal electrode 341C. The lower and upper devices 301 and 302 may be electrically connected through an electrode structure 350C. The electrode structure 350C may include a lower electrode structure 351C and an upper electrode structure 352C.

The lower electrode barrier layer 331C will be understood with reference to FIG. 1B or 2B, and the upper electrode barrier layer 332C will be understood with reference to FIG. 1A or 2A. The lower and upper electrode barrier layers 331C and 332C may be in direct contact with each other.

The lower and upper metal electrodes 341C and 342C may be integrally formed. Accordingly, a boundary between the lower and upper metal electrodes 341C and 342D is omitted.

In addition, the boundary between the lower and upper metal electrodes 341C and 342C may be disposed at the same level as or at a lower level than a top surface of the upper electrode barrier layer 332C, as will be understood in further detail with reference to the drawings and the descriptions of forming methods. Other unmentioned components will be understood with reference to components equal or similar to those of FIGS. 1C and 3A.

Figure 3D:
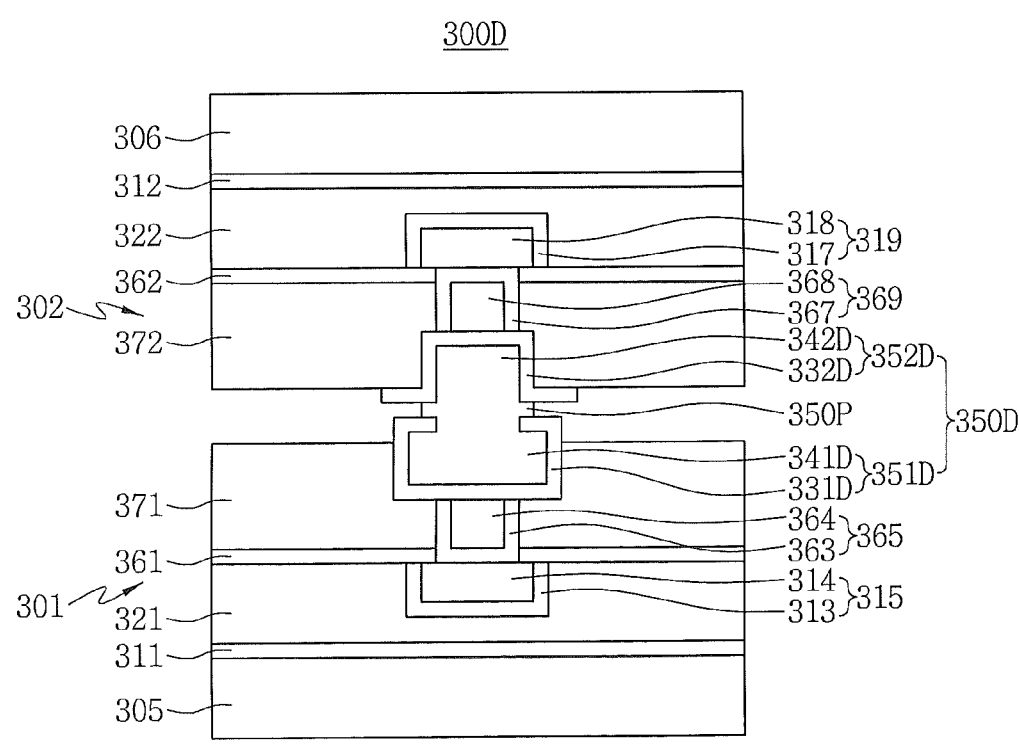

Referring to FIG. 3D, an electrode-connecting structure 300D according to another embodiment of the inventive concept may include a lower device 301 and an upper device 302, and include a protrusion 350P interposed between a lower electrode barrier layer 331D and an upper electrode barrier layer 332D. The lower and upper devices 301 and 302 may be electrically connected through an electrode structure 350D. The electrode structure 350D may include a lower electrode structure 351D and an upper electrode structure 352D.

The protrusion 350P may be a portion of a lower metal electrode 341D, a portion of an upper metal electrode 342D, a combination thereof, or an added metal.

In another embodiment, the lower and upper metal barrier layers 331D and 332D may be spaced apart from each other. In other words, the lower and upper electrode barrier layers 331D and 331D may be independently spaced apart from each other irrespective of the presence or absence of the protrusion 350P. In this case, the protrusion 350P may be in direct contact with the lower electrode barrier layer 331D and spaced apart from the upper electrode barrier layer 332D. Alternatively, the protrusion 350P may be in direct contact with the upper electrode barrier layer 332D and spaced apart from the lower electrode barrier layer 331D. The present embodiment will be understood in further detail with reference to FIGS. 1F, 2F, and/or 3F. Other unmentioned components will be understood with reference to components equal or similar to those of FIGS. 1D and 3A through 3C.

Figure 3E:
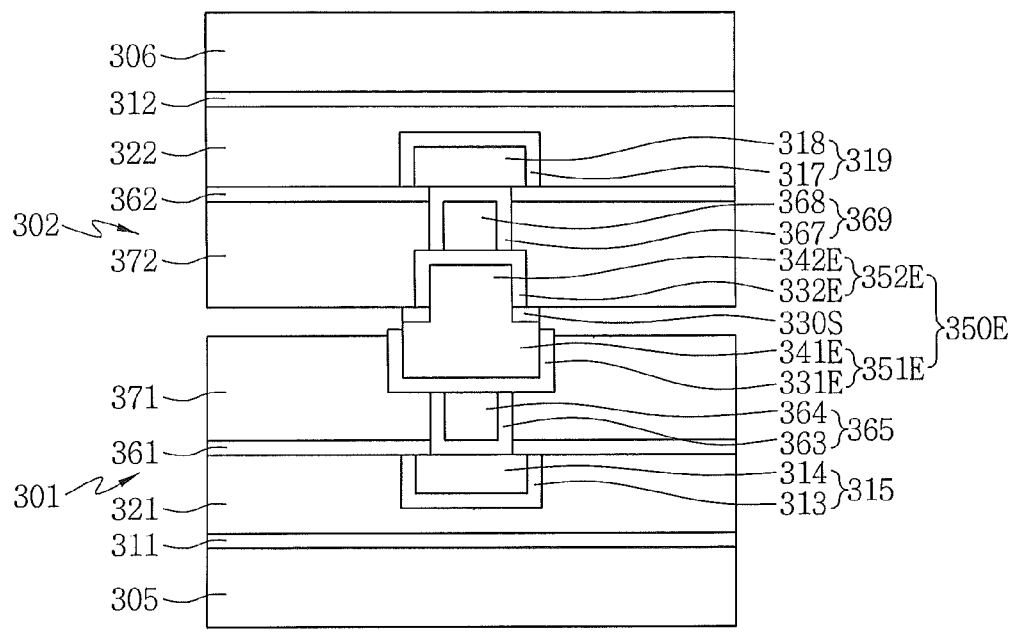

Referring to FIG. 3E, an electrode-connecting structure 300E according to another embodiment of the inventive concept may include a lower device 301 and an upper device 302, and include a surface electrode barrier layer 330S partially formed on a top surface of a lower metal electrode 341E. The lower and upper devices 301 and 302 may be electrically connected through an electrode structure 350E. The electrode structure 350E may include a lower electrode structure 351E and an upper electrode structure 352E.

The surface electrode barrier layer 330S may be partially formed on an outer region of the top surface of the lower metal electrode 341E. The surface electrode barrier layer 330S may not be formed on lateral surfaces of the lower metal electrode 341E. That is, the lateral surfaces of the lower metal electrode 341E may be exposed. In addition, lateral ends of the surface electrode barrier layer 330S may be vertically aligned with the lateral surfaces of the lower metal electrode 341E.

In another embodiment, with further reference to FIG. 3A, the surface electrode barrier layer 330S may be interpreted as a portion of an upper electrode barrier layer 332E. That is, at least one of the end portions of the upper electrode barrier layer 332E may be interpreted as being vertically aligned with one of the lateral surfaces of the lower metal electrode 341E. Other unmentioned components will be understood with reference to components equal or similar to those of FIGS. 1E and 3A through 3D.

Figure 3F:
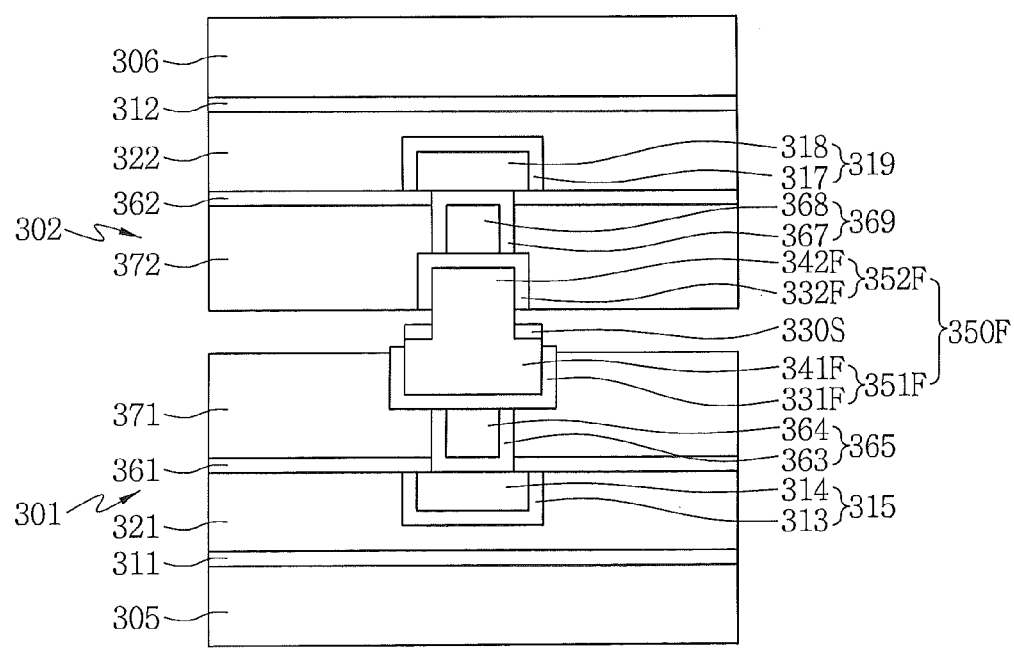

Referring to FIG. 3F, an electrode-connecting structure 300F according to another embodiment of the inventive concept may include a lower device 301 and an upper device 302, and include a surface electrode barrier layer 330S spaced apart from an upper electrode barrier layer 332F. The lower and upper devices 301 and 302 may be electrically connected through an electrode structure 350F. The electrode structure 350F may include a lower electrode structure 351F and an upper electrode structure 352F.

In another embodiment, with further reference to FIG. 3D, one or both of a lower metal electrode 341F and an upper metal electrode 342F may protrude between the upper electrode barrier layer 332F and the surface electrode barrier layer 330S. Other unmentioned components will be understood with reference to components equal or similar to those of FIGS. 1F and 3A through 3E.

Figure 3G:
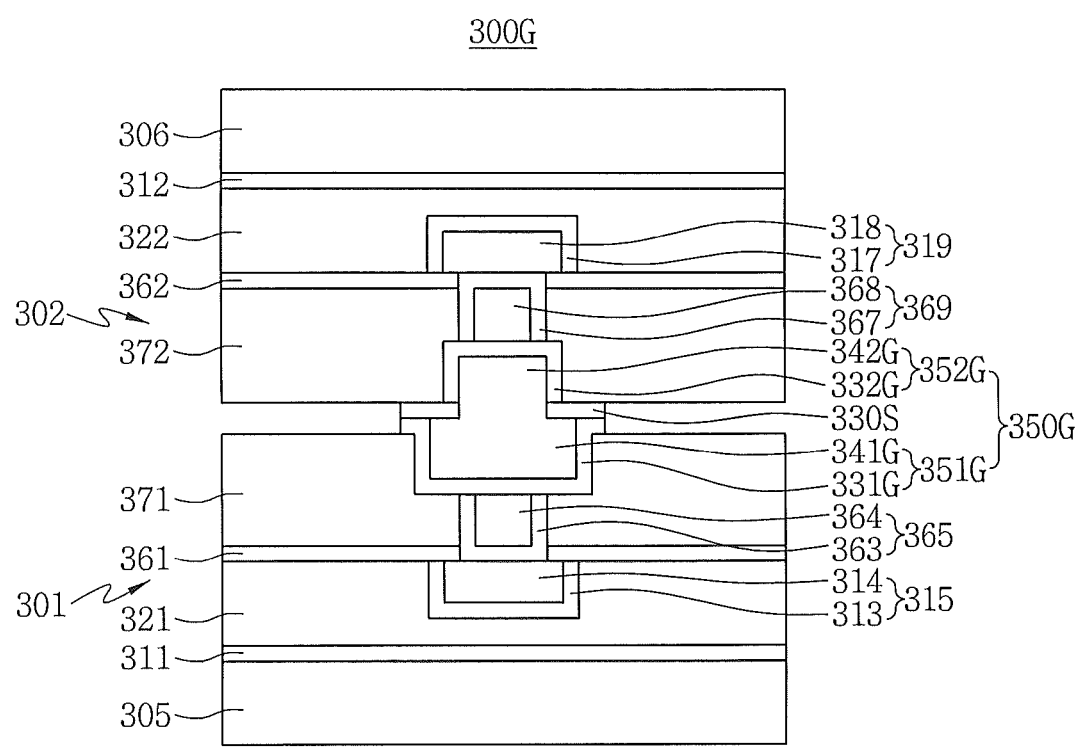

Referring to FIG. 3G, an electrode-connecting structure 300G according to another embodiment of the inventive concept may include a lower device 301 and an upper device 302. The electrode-connecting structure 300G may include a lower electrode barrier layer 331G, which may extend onto a surface of a lower insulating layer 371, and a surface electrode barrier layer 330S, which may be formed on a portion of a surface of a lower metal electrode 341G and the lower electrode barrier layer 331G.

The surface electrode barrier layer 330S may be an independent component, or a portion of an upper electrode barrier layer 332G as will be understood with reference to FIG. 3A. Other unmentioned components will be understood with reference to components equal or similar to those of FIGS. 1G and 3A through 3F.

In the present embodiments, positions of the lower and upper devices 301 and 302 may be exchanged. That is, upper and lower portions of the electrode structures 350A to 350G may be inverted.

FIGS. 4A through 4G are conceptual longitudinal sectional views of electrode-connecting structures 400A to 400G according to various embodiments of the inventive concept.

Figure 4A:
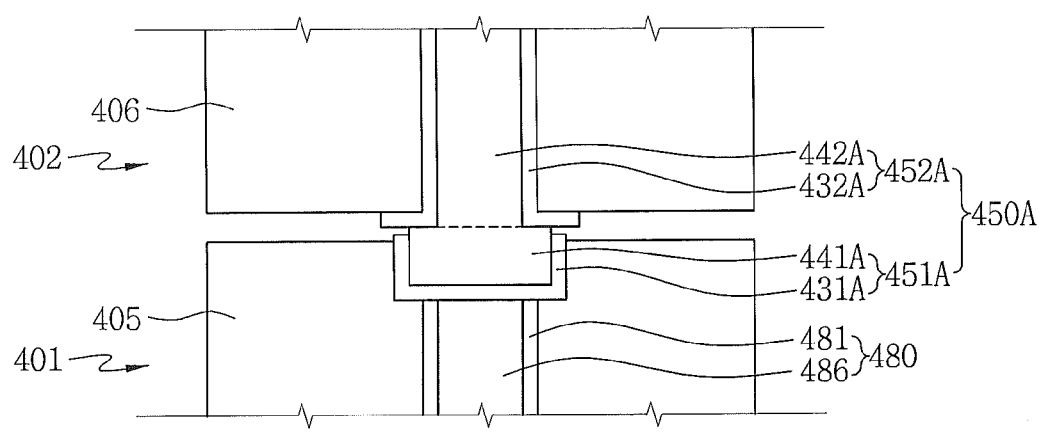
FIGS. 4A through 4G are conceptual longitudinal sectional views of electrode-connecting structures according to various embodiments of the inventive concept.

Referring to FIG. 4A, an electrode-connecting structure 400A according to an embodiment of the inventive concept may include a lower device 401 and an upper device 402. The lower and upper devices 401 and 402 may be electrically connected through an electrode structure 450A. The electrode structure 450A may include a lower electrode structure 451A and an upper electrode structure 452A.

The lower device 401 may include a lower substrate 405. The lower electrode structure 451A may be formed in the lower substrate 405. The lower device 401 may include a lower via structure 490 formed in the lower substrate 405. The lower via structure 490 may be electrically connected to the lower electrode structure 451A.

The lower substrate 405 may include a silicon wafer, a SOI wafer, a SiGe wafer, a SiC wafer, a glass substrate, a ceramic substrate, or a packaged semiconductor device. In the present embodiment, the lower substrate 405 may exemplarily include a silicon wafer.

The lower electrode structure 451A may include a lower electrode barrier layer 431A and a lower metal electrode 441A. The lower electrode barrier layer 431A may surround a bottom surface and lateral surfaces of the lower metal electrode 441A. A top surface of the lower metal electrode 441A may protrude upward from topmost ends of the lower electrode barrier layer 431A. The topmost ends of the lower electrode barrier layer 431A may protrude upward from a top surface of the lower substrate 405. In another embodiment, the topmost ends of the lower electrode barrier layer 431A may be disposed at the same level as or at a lower level than the top surface of the lower substrate 405.

The lower electrode barrier layer 431A may include Ti, Ti/TiN, TiN, TiW, Ta, Ta/TaN, TaN, or another metal/metal nitride layer. In another embodiment, the lower electrode barrier layer 431A may include silicon nitride. The lower metal electrode 441A may include a metal, such as copper.

The lower via structure 480 may be formed in a shape that penetrates the lower substrate 405. The lower via structure 480 may include a lower via barrier layer 481 and a lower via plug 486. The lower via barrier layer 481 may include silicon nitride. In another embodiment, the lower via barrier layer 481 may include Ti, Ti/TiN, TiN, TiW, Ta, Ta/TaN, TaN, or another metal/metal nitride layer. The lower via plug 486 may include a metal, such as copper.

The upper device 402 may include an upper substrate 406. The upper electrode structure 452A may be formed in the upper substrate 406. The upper electrode structure 452A may include an upper electrode barrier layer 432A and an upper metal electrode 442A. The upper electrode barrier layer 432A may extend onto a bottom surface of the upper substrate 402.

The upper electrode barrier layer 432A may include Ti, Ti/TiN, TiN, TiW, Ta, Ta/TaN, TaN, or another metal/metal nitride layer. In another embodiment, the upper electrode barrier layer 432A may include silicon nitride. The upper metal electrode 442A may include a metal, such as copper.

A horizontal width of the lower metal electrode 441A may be greater than a horizontal width of the upper metal electrode 442A. A horizontal width of the upper electrode barrier layer 432A extending onto the bottom surface of the upper substrate 402 may be greater than a horizontal width of the lower metal electrode 441A.

The upper electrode structure 452A may be formed in the shape of a via structure.

Figure 4B:
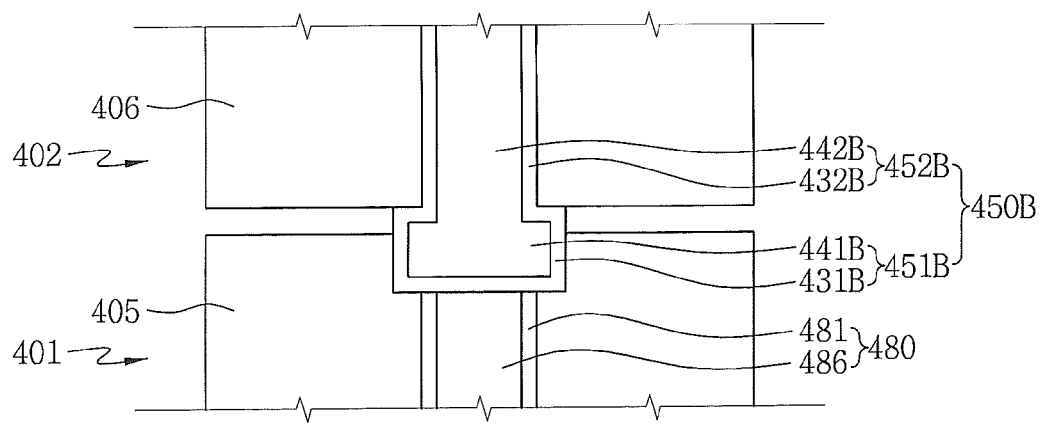

Referring to FIG. 4B, an electrode-connecting structure 400B according to another embodiment of the inventive concept may include a lower device 401 and an upper device 402. The lower and upper devices 401 and 402 may be electrically connected through an electrode structure 450B. The electrode structure 450B may include a lower electrode structure 451B and an upper electrode structure 452B.

A lower electrode barrier layer 431B may surround lateral surfaces of a lower metal electrode 441B. In addition, the lower electrode barrier layer 431B may cover a portion of a top surface of the lower metal electrode 441B. Accordingly, the lower electrode barrier layer 431B may surround not only the lateral surfaces of the lower metal electrode 441B but also peripheral regions of the top surface thereof. Other unmentioned components and a further detailed description will be understood with reference to components equal or similar to those of FIGS. 1B and 4A.

Figure 4C:
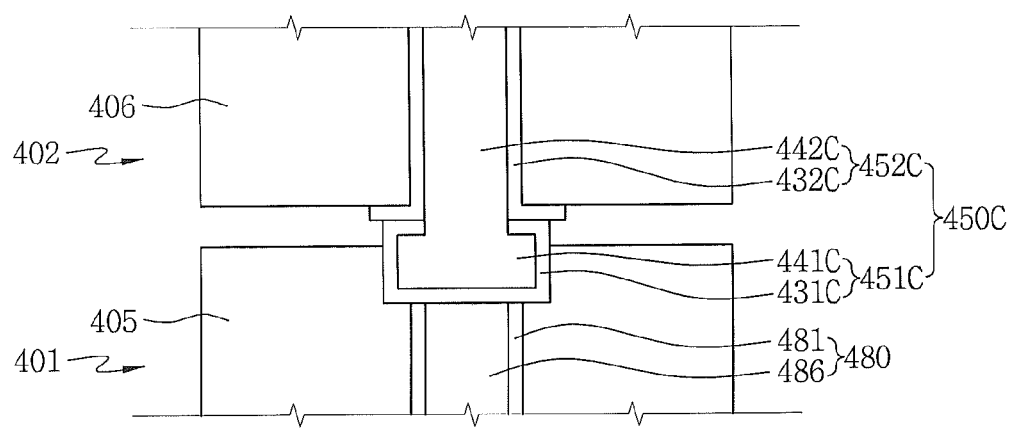

Referring to FIG. 4C, an electrode-connecting structure 400C according to another embodiment of the inventive concept may include a lower device 401 and an upper device 402. The lower and upper devices 401 and 402 may be electrically connected through an electrode structure 450C. The electrode structure 450C may include a lower electrode structure 451C and an upper electrode structure 452C.

A lower electrode barrier layer 431C will be understood with reference to FIG. 1C, and an upper electrode barrier layer 432C will be understood with reference to FIGS. 1A and 4A. The lower and upper electrode barrier layers 431C and 432C may be in direct contact with each other.

A lower metal electrode 441C and an upper metal electrode 442C may be integrally formed. Accordingly, a boundary between the lower and upper metal electrodes 441C and 442C is omitted. In addition, the boundary between the lower and upper metal electrodes 441C and 442C may be disposed at the same level as or at a lower level than a top surface of the upper metal barrier layer 432C. Other unmentioned components and a further detailed description will be understood with reference to components equal or similar to those of FIGS. 1C, 4A, and 4B.

Figure 4D:
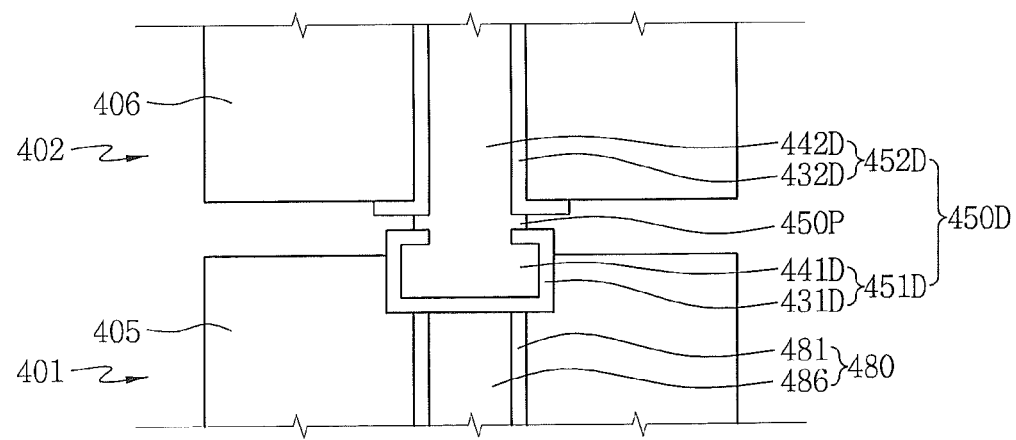

Referring to FIG. 4D, an electrode-connecting structure 400D according to another embodiment of the inventive concept may include a lower device 401 and an upper device 402. The lower and upper devices 401 and 402 may be electrically connected through an electrode structure 450D. The electrode structure 450D may include a lower electrode structure 451D and an upper electrode structure 452D. The electrode structure 450D may include a protrusion 450P interposed between a lower electrode barrier layer 431D and an upper electrode barrier layer 432D.

The protrusion 450P may be a portion of a lower metal electrode 441D, a portion of an upper metal electrode 442D, a combination thereof, or an added metal.

In another embodiment, the lower and upper electrode barrier layers 431D and 432D may be spaced apart from each other. In other words, the lower and upper electrode barrier layers 431D and 432D may be independently spaced apart from each other irrespective of the presence or absence of the protrusion 450P. In this case, the protrusion 450P may be in direct contact with the lower electrode barrier layer 431D and spaced apart from the upper electrode barrier layer 432D. Alternatively, the protrusion 450P may be in direct contact with the upper electrode barrier layer 432D and spaced apart from the lower electrode barrier layer 431D. The present embodiment will be understood in further detail with reference to FIGS. 1F and 4F. Other unmentioned components and a further detailed description will be understood with reference to components equal or similar to those of FIGS. 1D and 4A through 4C.

Figure 4E:
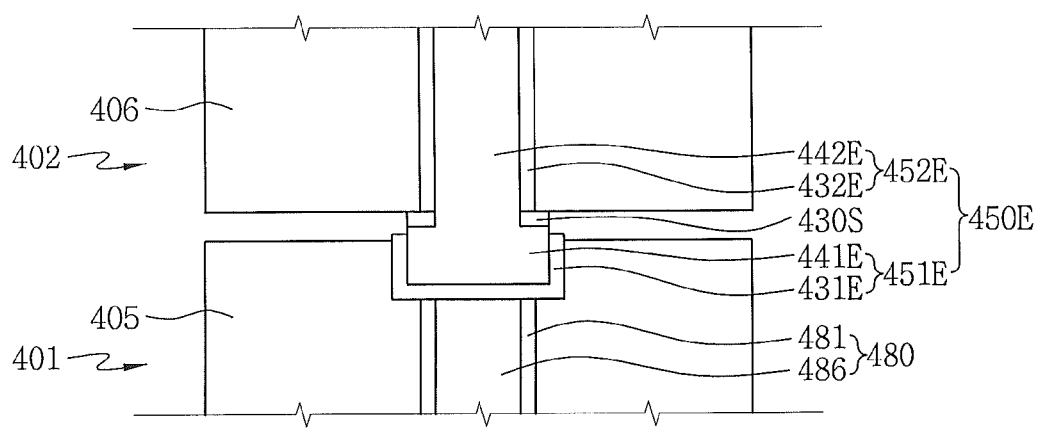

Referring to FIG. 4E, an electrode-connecting structure 400E according to another embodiment of the inventive concept may include a lower device 401 and an upper device 402. The lower and upper devices 401 and 402 may be electrically connected through an electrode structure 450E. The electrode structure 450E may include a lower electrode structure 451E and an upper electrode structure 452E. The electrode structure 450E may include a surface electrode barrier layer 430S partially formed on a top surface of a lower metal electrode 441E.

The surface electrode barrier layer 430S may be partially formed on an outer region of the top surface of the lower metal electrode 441E. The surface electrode barrier layer 430S may not be formed on lateral surfaces of the lower metal electrode 441E. That is, the lateral surfaces of the lower metal electrode 441E may be exposed. In addition, lateral ends of the surface electrode barrier layer 430S may be vertically aligned with the lateral surfaces of the lower metal electrode 441E.

In another embodiment, with further reference to FIG. 4A, the surface electrode barrier layer 430S may be interpreted as a portion of an upper electrode barrier layer 432E. That is, at least one of end portions of the upper electrode barrier layer 432E may be interpreted as being vertically aligned with one of the lateral surfaces of the lower metal electrode 441E. Other unmentioned components and a further detailed description will be understood with reference to components equal or similar to those of FIGS. 1E and 4A through 4D.

Figure 4F:
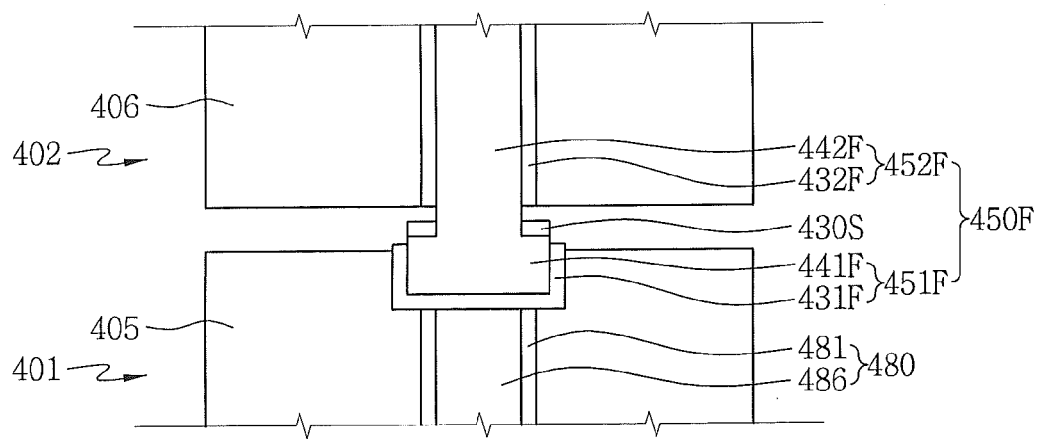

Referring to FIG. 4F, an electrode-connecting structure 400F according to another embodiment of the inventive concept may include a lower device 401 and an upper device 402. The lower and upper devices 401 and 402 may be electrically connected through an electrode structure 450F. The electrode structure 450F may include a lower electrode structure 451F and an upper electrode structure 452F. The electrode structure 450F may include a surface electrode barrier layer 430S, which may be spaced apart from an upper electrode barrier layer 432F.

In another embodiment, with further reference to FIG. 4D, one or both of a lower metal electrode 441F and an upper metal electrode 442F may protrude between the upper electrode barrier layer 432F and the surface electrode barrier layer 430S. Other unmentioned components and a further detailed description will be understood with reference to components equal or similar to those of FIGS. 1F and 4A through 4E.

Figure 4G:
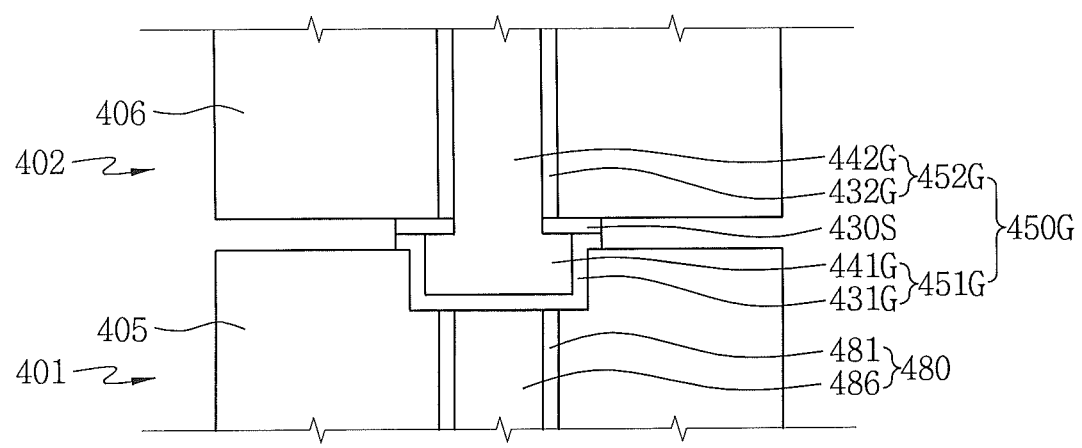

Referring to FIG. 4G, an electrode-connecting structure 400G according to another embodiment of the inventive concept may include a lower device 401 and an upper device 402. The lower and upper devices 401 and 402 may be electrically connected through an electrode structure 450G. The electrode structure 450G may include a lower electrode structure 451G and an upper electrode structure 452G. The electrode structure 450G may include a lower electrode barrier layer 431G, which may extend onto a surface of a lower substrate 405, and a surface electrode barrier layer 430S, which may be formed not only on a portion of a top surface of a lower metal electrode 441G but also on the lower electrode barrier layer 431G extending onto the surface of the lower substrate 405. Other unmentioned components and a further detailed description will be understood with reference to components equal or similar to those of FIGS. 1G and 4A through 4F.

In the present embodiments, positions of the lower and upper devices 401 and 402 may be exchanged. That is, upper and lower portions of the electrode structures 450A to 450G may be inverted.

FIGS. 5A through 5G are conceptual longitudinal sectional views of device-stacking structures 500A to 500G according to various embodiments of the inventive concept.

Figure 5A:
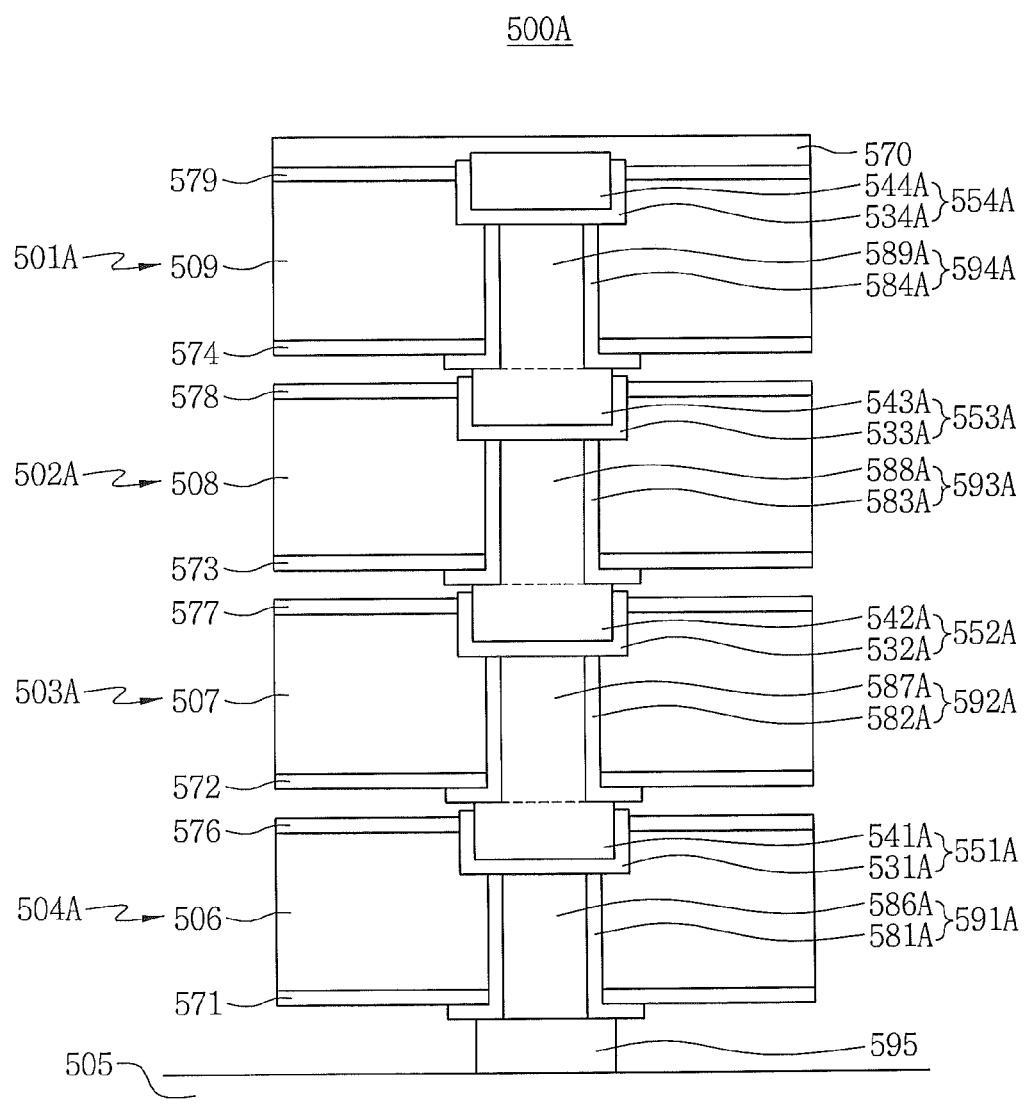
FIGS. 5A through 5G are conceptual longitudinal sectional views of device-stacking structures according to various embodiments of the inventive concept.

Referring to FIG. 5A, a device-stacking structure 500A according to an embodiment of the inventive concept may include semiconductor devices 501A to 504A stacked on a circuit substrate 505. The stacked semiconductor devices 501A to 504A may include electrode structures 551A to 554A and via structures 591A to 594A, which may be formed in substrates 506 to 509, respectively. The stacked semiconductor devices 501A to 504A may be electrically connected using the electrode structures 551A to 554A and the via structures 591A to 594A. The circuit substrate 505 may include a printed circuit board (PCB).

The electrode structures 551A to 554A may include electrode barrier layers 531A to 534A and metal electrodes 541A to 544A, respectively. The electrode barrier layers 531A to 534A may surround bottom surfaces and lateral surfaces of the metal electrodes 541A to 544A, respectively. The electrode barrier layers 531A to 534A may include Ti, Ti/TiN, TiN, TiW, Ta, Ta/TaN, TaN, or another metal/metal nitride layer. In another embodiment, the electrode barrier layers 531A to 534A may include silicon nitride. The metal electrodes 541A to 544A may include a metal, such as copper. Top surfaces of the metal electrodes 541A to 544A may protrude upward from topmost ends of the electrode barrier layers 531A to 534A. The electrode structures 551A to 554A will be understood in further detail with reference to the lower electrode structures 151A, 251A, 351A, and 451A shown in other drawings.

Via structures 591 to 594 may include via barrier layers 581A to 584A and via plugs 586A to 589A, respectively. The via barrier layers 581A to 584A may surround lateral surfaces of the via plugs 586A to 589A, respectively. The via barrier layers 581A to 584A may extend onto bottom surfaces of the substrates 506 to 509, respectively. The via barrier layers 581A to 584A may include Ti, Ti/TiN, TiN, TiW, Ta, Ta/TaN, TaN, or another metal/metal nitride layer. In another embodiment, the via barrier layers 581A to 584A may include silicon nitride. The via plugs 586A to 589A may include a metal, such as copper. The via structures 591A to 594A will be understood in further detail with reference to the lower via structure 480 shown in FIGS. 5A through 5F. The metal electrodes 541A to 544A may be integrally formed with the via plugs 586A to 589A, respectively. That is, the metal electrodes 541A to 544A may be materially in continuity with the via plugs 586A to 589A, respectively.

The stacked semiconductor devices 501 to 504 may include lower insulating layers 571 to 574 and upper insulating layers 576 to 579, which may be respectively formed on bottom and top surfaces of the stacked semiconductor devices 501 to 504. The via barrier layers 581A to 584A may extend onto the lower insulating layers 571 to 574, respectively. Topmost ends of the electrode barrier layers 531A to 534A may not be covered with the upper insulating layers 576 to 579 but may be exposed. The semiconductor device 504 disposed at the uppermost level may include an upper capping layer 570. The upper capping layer 570 may cover a surface of the substrate 509 disposed at the uppermost level, a surface of the upper insulating layer 579 disposed at the uppermost level, and/or the electrode structure 554A disposed at the uppermost level. The via plug 586A of the semiconductor device 506 disposed at the lowermost level may be electrically connected to a metal connector 595 formed on the circuit substrate 505. The metal connector 595 may include copper, nickel, aluminum, tin, a noble metal, or a solder material.

Figure 5B:
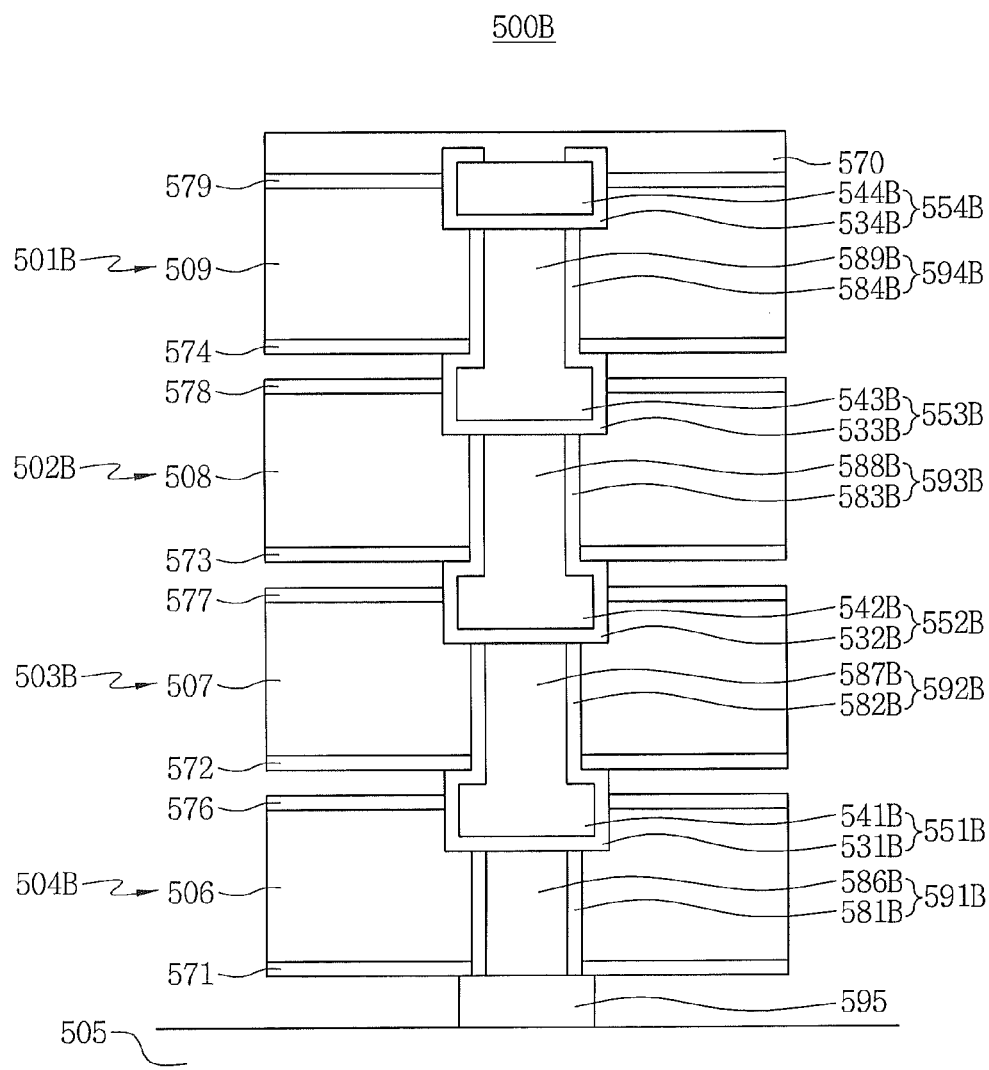

Referring to FIG. 5B, a device-stacking structure 500B according to another embodiment of the inventive concept may include semiconductor devices 501B to 504B stacked on a circuit substrate 505. The stacked semiconductor devices 501B to 504B may include electrode structures 551B to 554B and via structures 591B to 594B, which may be formed in substrates 506 to 509, respectively. The stacked semiconductor devices 501B to 504B may be electrically connected using the electrode structures 551B to 554B and the via structures 591B to 594B, respectively.

The electrode barrier layers 531B to 534B may surround lateral surfaces of metal electrodes 541B to 544B, respectively. In addition, the electrode barrier layers 531B to 534B may cover portions of top surfaces of the metal electrodes 541B to 544B, respectively. In other words, the electrode barrier layers 531B to 534B may surround not only the lateral surfaces of the metal electrodes 541B to 544B but also peripheral regions of the top surfaces thereof. Other unmentioned components will be understood with reference to components equal or similar to those of FIGS. 1B and 5A.

Figure 5C:
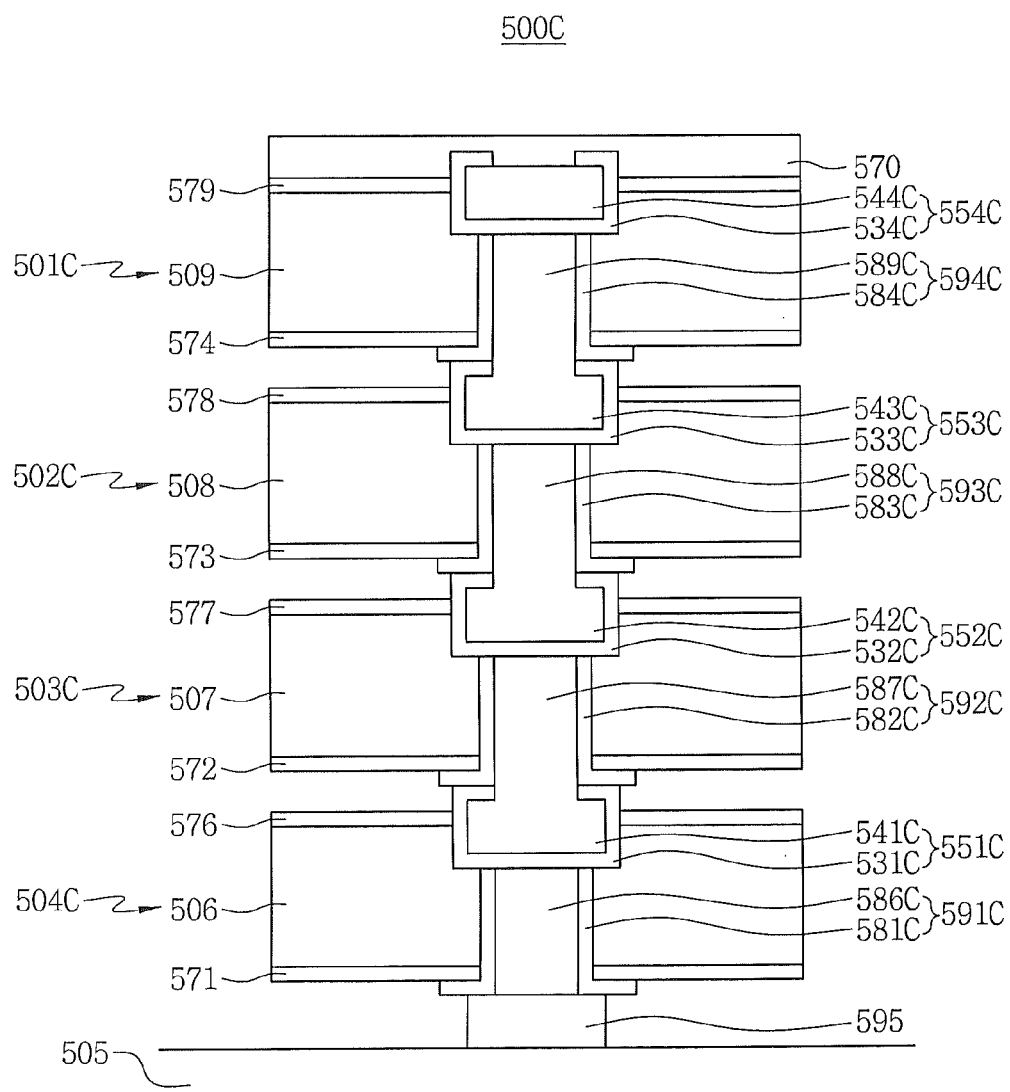

Referring to FIG. 5C, a device-stacking structure 500C according to another embodiment of the inventive concept may include semiconductor devices 501C to 504C stacked on a circuit substrate 505. The stacked semiconductor devices 501C to 504C may include electrode structures 551C to 554C and via structures 591C to 594C, which may be formed in substrates 506 to 509, respectively. The stacked semiconductor devices 501C to 504C may be electrically connected using the electrode structures 551C to 554C and the via structures 591C to 594C.

Electrode barrier layers 531C to 534C will be understood with reference to FIG. 1C, and via barrier layers 581C to 584C will be understood with reference to FIGS. 1A and 5A. The electrode barrier layers 531C to 534C may be in direct contact with the via barrier layers 581C to 584C, respectively.

Metal electrodes 541C to 544C may be integrally formed with via plugs 586C to 589C, respectively. Accordingly, boundaries between the metal electrodes 541C to 544C and the via plugs 586C to 589C may be disposed at the same level as or at a lower level than top surfaces of the via barrier layers 581C to 584C, respectively. Other unmentioned components will be understood with reference to components equal or similar to those of FIGS. 1C, 5A, and 5B.

Figure 5D:
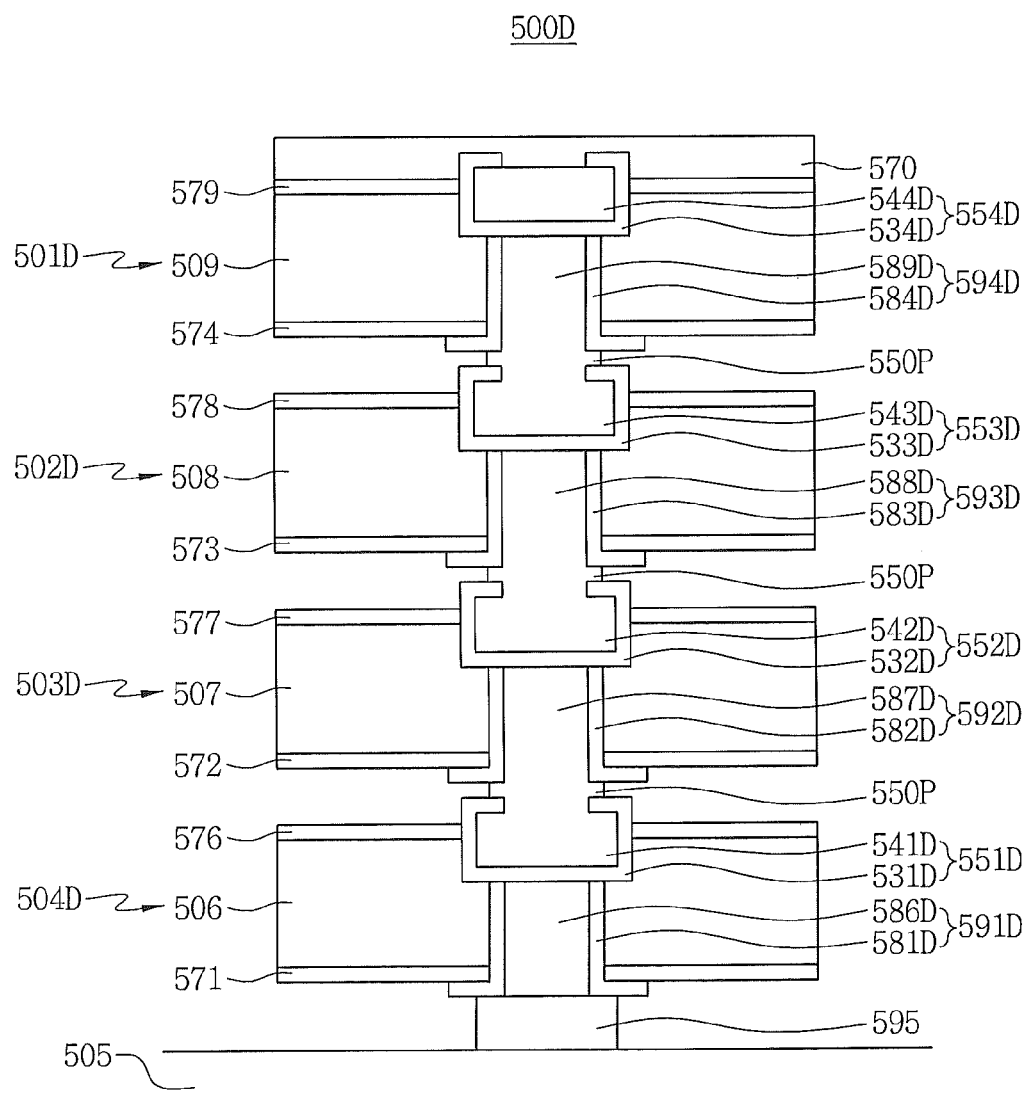

Referring to FIG. 5D, a device-stacking structure 500D according to another embodiment of the inventive concept may include semiconductor devices 501D to 504D stacked on a circuit substrate 505. The stacked semiconductor devices 501D to 504D may include electrode structures 551D to 554D and via structures 591D to 594D, which may be formed in substrates 506 to 509, respectively. The stacked semiconductor devices 501D to 504D may be electrically connected using the electrode structures 551D to 554D and the via structures 591D to 591D, respectively.

Protrusions 550P may be portions of metal electrodes 541D to 544D, portions of via plugs 586D to 589D, combinations thereof, or added metals.

In another embodiment, electrode barrier layers 531D to 534D may be spaced apart from via barrier layers 581D to 584D, respectively. In other words, the electrode barrier layers 531D to 534D may be independently spaced apart from the via barrier layers 581D to 584D irrespective of the presence or absence of the protrusions 550P. In this case, the protrusions 550P may be in direct contact with the electrode barrier layers 531D to 534D and spaced apart from the via barrier layers 581D to 584D, respectively. Alternatively, the protrusions 550P may be in direct contact with the via barrier layers 581D to 584D and spaced apart from the electrode barrier layers 531D to 534D, respectively. The present embodiment will be understood in further detail with reference to FIGS. 1F and 5F. Other unmentioned components and a further detailed description will be understood with reference to components equal or similar to those of FIGS. 1E and 5A through 5C.

Figure 5E:
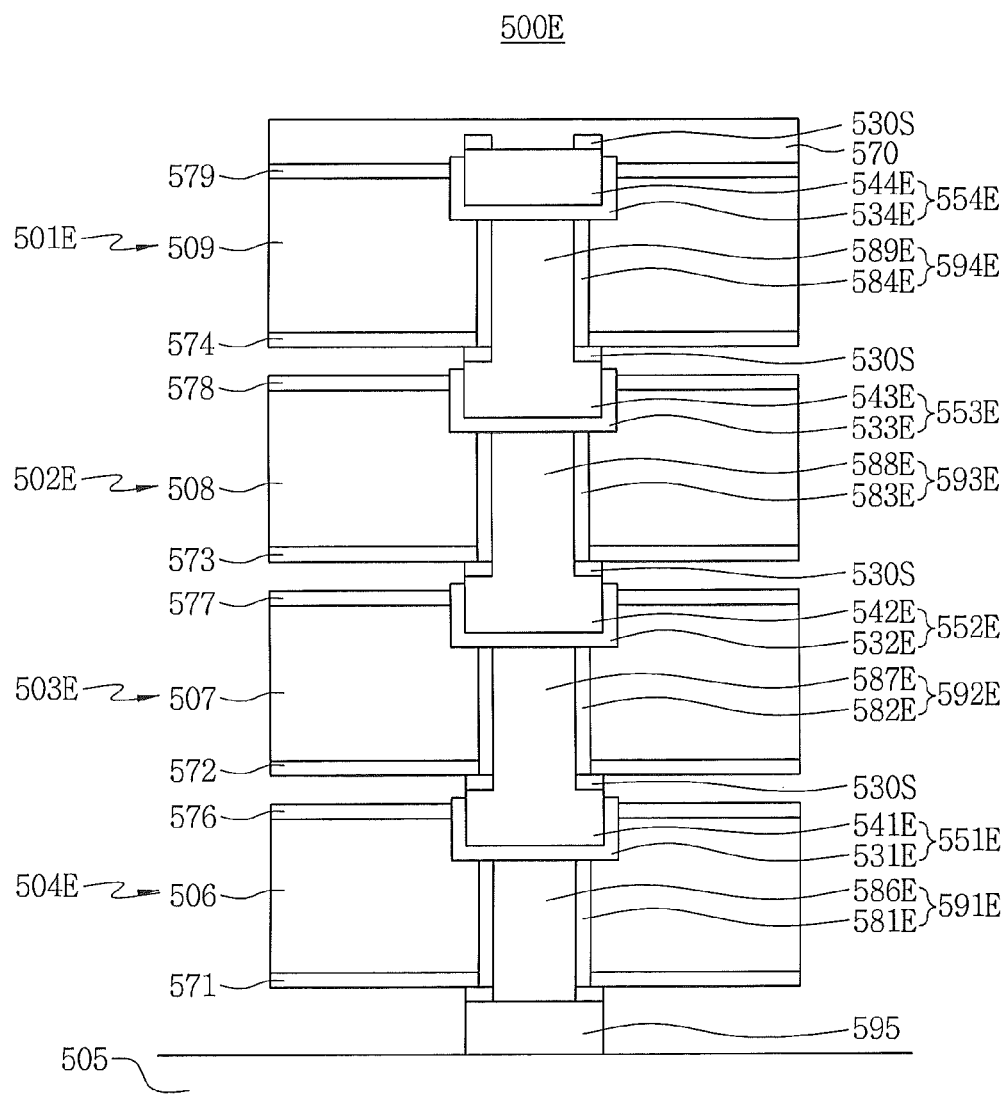

Referring to FIG. 5E, a device-stacking structure 500E according to another embodiment of the inventive concept may include semiconductor devices 501E to 504E stacked on a circuit substrate 505. The stacked semiconductor devices 501E to 504E may include electrode structures 551E to 554E and via structures 591E to 594E, which may be formed in substrates 506 to 509, respectively. The stacked semiconductor devices 501E to 504E may be electrically connected using electrode structures 551E to 554E and via structures 591E to 594E.

Surface electrode barrier layers 530S may be partially formed on outer regions of top surfaces of metal electrodes 541E to 544E. The surface electrode barrier layers 530S may not be formed on lateral surfaces of the metal electrodes 541E to 544E. That is, the lateral surfaces of the metal electrodes 541E to 544E may be exposed. In addition, lateral ends of the surface electrode barrier layers 530S may be vertically aligned with the lateral surfaces of the metal electrodes 541E to 544E. The surface electrode barrier layers 530S may also be formed on a metal connector 595. In another embodiment, the surface electrode barrier layer 530S may not be formed on the metal connector 595.

In another embodiment, with further reference to FIG. 5A, the surface electrode barrier layers 530S may be interpreted as portions of via barrier layers 581E to 584E. That is, at least portions of the end portions of the via barrier layers 581E to 584E may be interpreted as being vertically aligned with ones of the lateral surfaces of the metal electrodes 541E to 544E. Other unmentioned components and a further detailed description will be understood with reference to components equal or similar to those of FIGS. 1E and 5A through 5D.

Figure 5F:
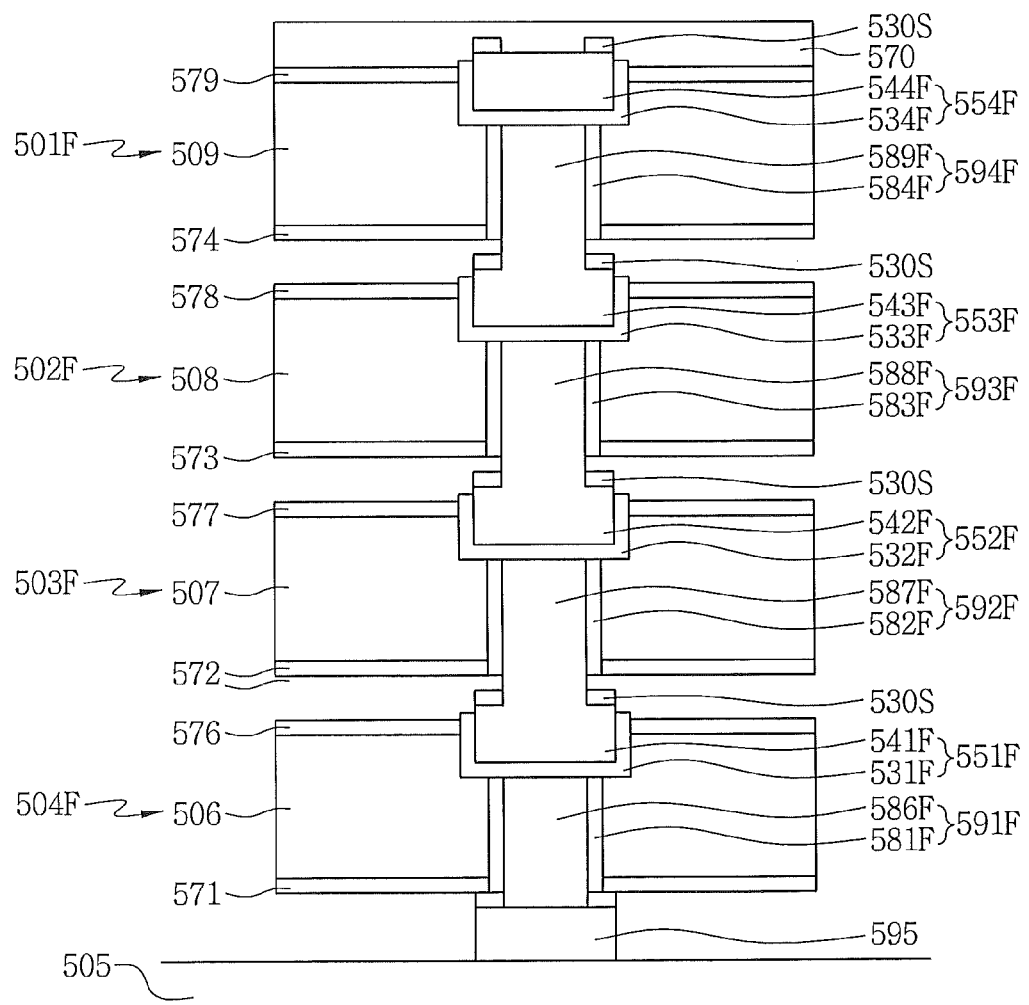

Referring to FIG. 5F, a device-stacking structure 500F according to another embodiment of the inventive concept may include semiconductor devices 501F to 504F stacked on a circuit substrate 505. The stacked semiconductor devices 501F to 504F may include electrode structures 551F to 554F and via structures 591F to 594F, which may be formed in substrates 506 to 509, respectively. The stacked semiconductor devices 501F to 504F may be electrically connected using the electrode structures 551F to 554F and the via structures 591F to 594F.

A surface electrode barrier layer 530S may also be formed on a metal connector 595. In another embodiment, the surface electrode barrier layer 530S may not be formed on the metal connector 595.

In another embodiment, ones or both of the metal electrodes 541F to 544F and the via plugs 586F to 589F may protrude between the via barrier layers 581F to 584F and the surface electrode barrier layers 530S, respectively. Other unmentioned components and a further detailed description will be understood with reference to components equal or similar to those of FIGS. 1F and 5A through 5E.

Figure 5G:
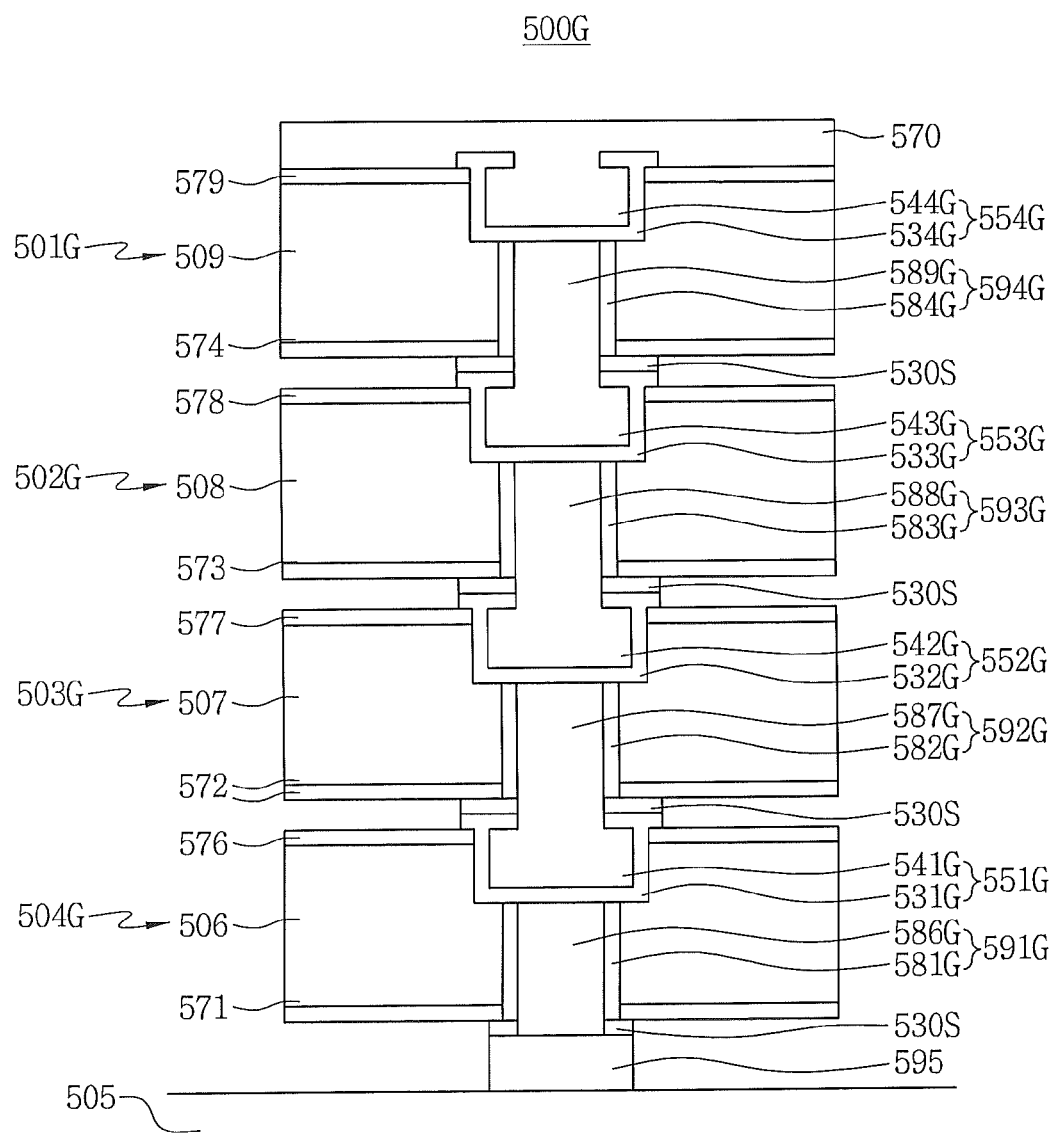

Referring to FIG. 5G, a device-stacking structure 500G according to another embodiment of the inventive concept may include semiconductor devices 501G to 504G stacked on a circuit substrate 505. The stacked semiconductor devices 501G to 504G may include electrode structures 551G to 554G and via structures 591G to 594G, which may be formed in substrates 506 to 509, respectively. The stacked semiconductor devices 501G to 504G may be electrically connected using the electrode structures 551G to 554G and the via structures 591G to 594G.

Electrode structures may include lower electrode barrier layers 531G to 534G, which may extend onto surfaces of the substrates 506-509, and surface electrode barrier layers 530S, which may be formed not only on portions of top surfaces of lower metal electrodes 541G to 544G but also on the lower electrode barrier layers 531G to 534G extending onto the surface of the substrates 506 to 509. Other unmentioned components and a further detailed description will be understood with reference to components equal or similar to those of FIGS. 1G and 5A through 5F.

FIGS. 6A through 6G are conceptual longitudinal sectional views of electrode-connecting structures 600A to 600F according to various embodiments of the inventive concept.

Figure 6A:
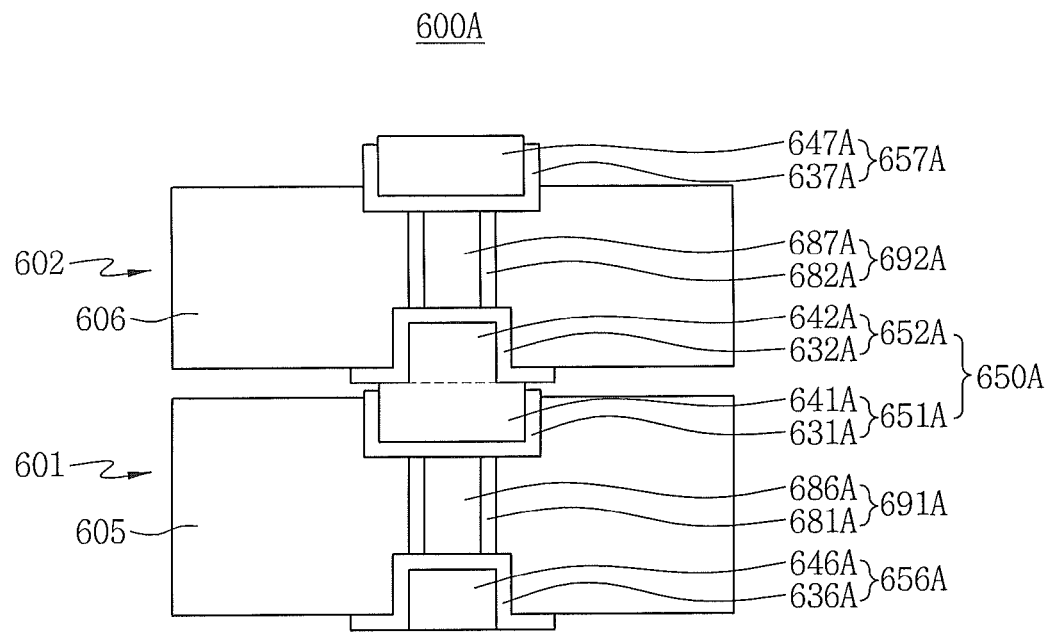
FIGS. 6A through 6G are conceptual longitudinal sectional views of electrode-connecting structures according to various embodiments of the inventive concept.

Referring to FIG. 6A, an electrode-connecting structure 600A according to an embodiment of the inventive concept may include a lower device 601 and an upper device 602. The lower device 601 may include a lower electrode structure 656A, an upper electrode structure 651A, and a via structure 691A, which may be formed in a lower substrate 605. Similarly, the upper device 602 may include a lower electrode structure 652A, an upper electrode structure 657A, and a via structure 692A, which may be formed in an upper substrate 606.

The lower electrode structure 656A of the lower device 601 may have a shape substantially equal to or similar to that of the upper electrode structure 657A of the upper device 602. The via structure 691A of the lower device 601 may have a shape substantially equal to or similar to that of the via structure 692A of the upper device 602.

The lower electrode structures 656A and 652A of the lower and upper devices 601 and 602 may respectively include lower metal electrodes 646A and 642A and lower electrode barrier layers 636A and 632A configured to surround top and lateral surfaces of the lower metal electrodes 646A and 642A. The lower electrode barrier layers 636A and 632A may extend onto bottom surfaces of the lower and upper devices 601 and 602, respectively.

The upper electrode structures 651A and 657A of the lower and upper devices 601 and 602 may respectively include upper metal electrodes 641A and 647A and upper electrode barrier layers 631A to 637A configured to surround bottom and lateral surfaces of the upper metal electrodes 641A and 647A. Topmost ends of the upper electrode barrier layers 631A and 637A may be exposed on top surfaces of the lower and upper substrates 605 and 606, respectively.

The lower electrode barrier layers 632A and 636A may have greater horizontal widths than the upper metal electrodes 641A and 647A. The lower metal electrodes 642A and 646A may have smaller horizontal widths than the upper metal electrodes 641A and 647A.

The via structure 691A of the lower device 601 and the via structure 692A of the upper device 602 may respectively include via plugs 686A and 687A and via barrier layers 681A and 682A configured to surround lateral surfaces of the via plugs 686A and 687A.

The lower metal electrodes 642A and 646A, the upper metal electrodes 641A and 647A, and the via plugs 686A and 687A may include a metal, such as copper. The lower electrode barrier layers 632A and 636A, the upper electrode barrier layers 631A and 637A, and the via barrier layers 681A and 682A may include Ti, Ti/TiN, TiN, TiW, Ta, Ta/TaN, TaN, or another metal/metal nitride layer. In another embodiment, the lower electrode barrier layers 632A and 636A, the upper electrode barrier layers 631A and 637A, and the via barrier layers 681A and 682A may include silicon nitride.

The upper electrode structure 651A of the lower device 601 and the lower electrode structure 652A of the upper device 602 may constitute an electrode structure 650A.

Figure 6B:
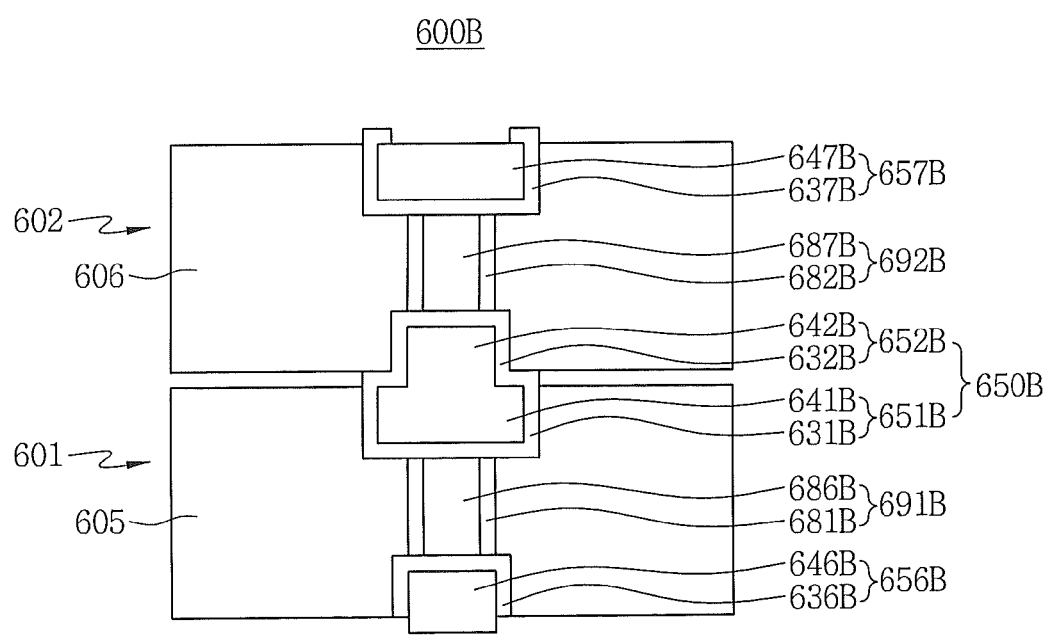
Figure 6C:
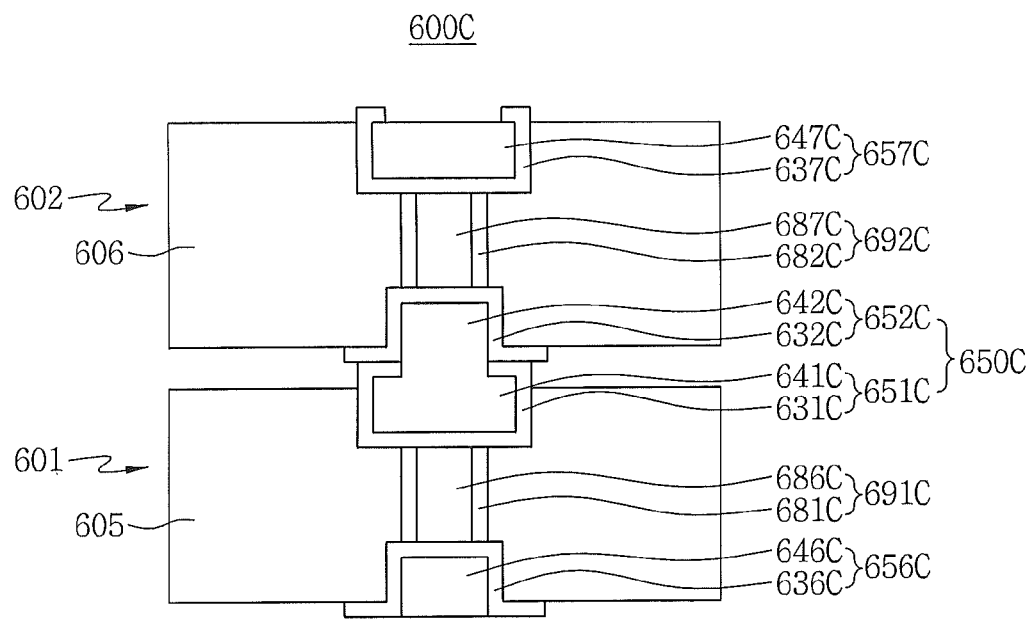

Referring to FIG. 6B, an electrode-connecting structure 600B according to another embodiment of the inventive concept may include a lower device 601 and an upper device 602. The lower device 601 may include a lower electrode structure 656B, an upper electrode structure 651B, and a via structure 691B, which may be formed in a lower substrate 605. Similarly, the upper device 602 may include a lower electrode structure 652B, an upper electrode structure 657B, and a via structure 692B, which may be formed in an upper substrate 606.

Lower metal electrodes 642B and 646B may protrude outward from bottom surfaces of the lower and upper substrates 605 and 606, respectively. Topmost ends of lower electrode barrier layers 632B and 636B may be at the same level as or protrude from bottom surfaces of the lower and upper substrates 605 and 606.

Top surfaces of upper metal electrodes 641B and 647B may be partially or wholly at the same level as top surfaces of the lower substrate 605 and/or the upper substrate 606.

Topmost ends of upper electrode barrier layers 631B and 637B may be exposed on the top surfaces of the lower and upper substrates 605 and 606, respectively.

The via structures 691B and 692B of the lower and upper devices 601 and 602 may respectively include via plugs 686B and 687B and via barrier layers 681B and 682B configured to surround lateral surfaces of the via plugs 686B and 687B.

The upper electrode structure 651B of the lower device 601 and the lower electrode structure 652B of the upper device 602 may constitute an, electrode structure 650B. Other unmentioned components will be understood with reference to components equal or similar to those of FIG. 6A.

Referring to 6C, an electrode-connecting structure 600C according to another embodiment of the inventive concept may include a lower device 601 and an upper device 602. The lower device 601 may include a lower electrode structure 656C, an upper electrode structure 651C, and a via structure 691C, which may be formed in a lower substrate 605. The upper device 602 may include a lower electrode 652C, an upper electrode structure 657C, and a via structure 692C, which may be formed in an upper substrate 606.

Lower metal electrodes 642C and 646C may protrude outward from bottom surfaces of the lower and upper substrates 605 and 606, respectively. Lower electrode barrier layers 632C and 636C may be formed to extend onto bottom surfaces of the lower and upper substrates 605 and 606, respectively.

Top surfaces of upper metal electrodes 641C and 647C may be partially or wholly at the same level as top surfaces of the lower substrate 605 and/or the upper substrate 606.

Upper electrode barrier layers 631C and 637C may be exposed on the top surfaces of the upper metal electrodes 641C and 647C, respectively.

The via structure 691C of the lower device 601 and the via structure 692C of the upper device 602 may respectively include via plugs 686C and 687C and via barrier layers 681C and 682C configured to surround lateral surfaces of the via plugs 686C and 687C.

The upper electrode structure 651C of the lower device 601 and the lower electrode structure 652C of the upper device 602 may constitute an electrode structure 650C. Other unmentioned components will be understood with reference to components equal or similar to those of FIGS. 6A and 6B.

Figure 6D:
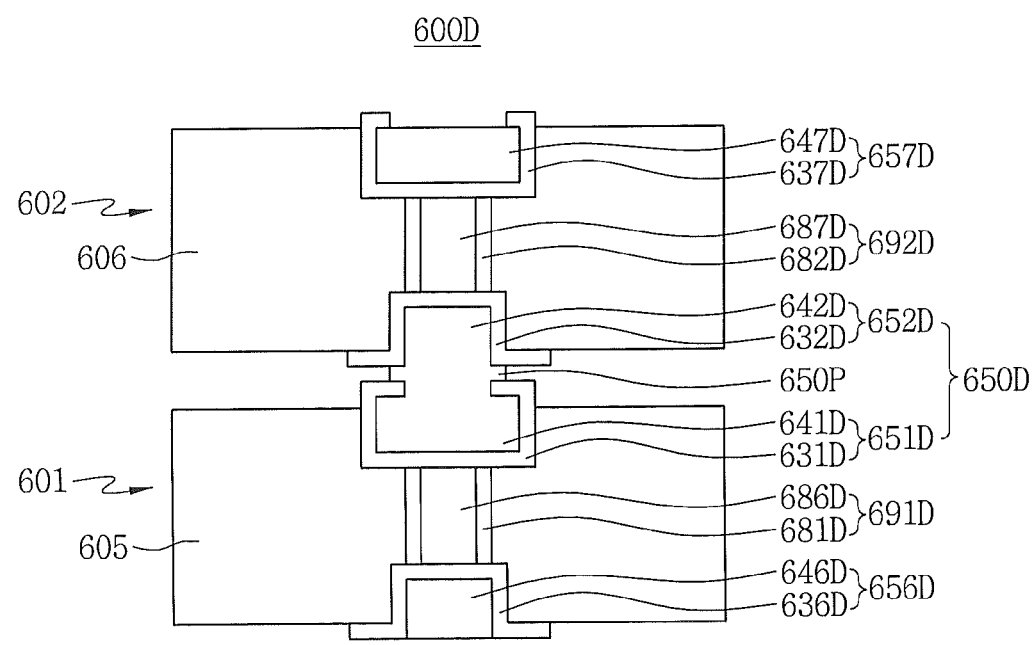

Referring to FIG. 6D, an electrode-connecting structure 600D according to another embodiment of the inventive concept may include a lower device 601 and an upper device 602. The lower device 601 may include a lower electrode 656D, an upper electrode structure 651D, and a via structure 691D, which may be formed in a lower substrate 605. Similarly, the upper device 602 may include a lower electrode structure 652D, an upper electrode structure 657D, and a via structure 692D, which may be formed in an upper substrate 606.

The upper electrode structure 651D of the lower device 601 and the lower electrode structure 652D of the upper device 602 may constitute an electrode structure 650D. The electrode structure 650D may include a protrusion 650D. The protrusion 650P may be a portion of an upper metal electrode 641D of the upper electrode structure 651D of the lower device 605, a portion of a lower metal electrode 652D of the lower metal electrode 652D of the upper device 602, a combination thereof, or an added metal. Other unmentioned components will be understood with reference to components equal or similar to those of FIGS. 6A through 6C.

Figure 6E:
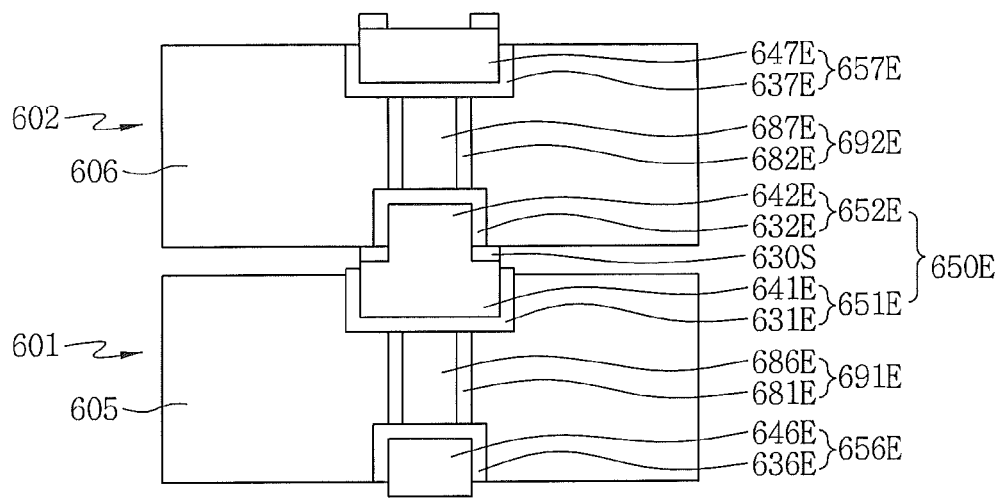

Referring to FIG. 6E, an electrode-connecting structure 600E according to another embodiment of the inventive concept may include a lower device 601 and an upper device 602. The lower device 601 may include a lower electrode structure 656E, an upper electrode structure 651E, and a via structure 691E, which may be formed in a lower substrate 605. The upper device 602 may include a lower electrode structure 652E, an upper electrode structure 657E, and a via structure 692E, which may be formed in an upper substrate 606.

A surface electrode barrier layer 630S may be partially formed on outer regions of top surfaces of upper metal electrodes 641E and 647E. The surface electrode barrier layer 630S may not be formed on lateral surfaces of the upper metal electrodes 641E and 647E. That is, lateral surfaces of the upper metal electrodes 641E and 647E may be exposed. In addition, lateral ends of the surface electrode barrier layer 630S may be vertically aligned with the lateral surfaces of the upper metal electrode 641E. In another embodiment, with further reference to FIG. 6A, the surface electrode barrier layer 630S may be interpreted as a portion of a lower electrode barrier layer 632E of the upper device 602. That is, at least one of the end portions of the lower electrode barrier layer 632E of the upper device 602 may be interpreted as being vertically aligned with one of the lateral surfaces of the upper metal electrode 641E of the lower device 601. Other unmentioned components will be understood with reference to components equal or similar to those of FIGS. 6A through 6D.

Figure 6F:
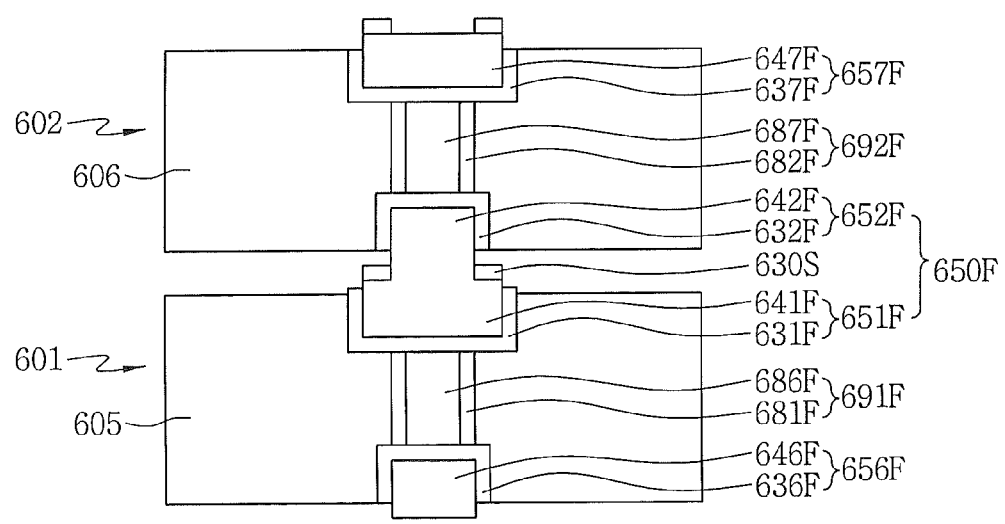

Referring to FIG. 6F, an electrode-connecting structure 600F according to another embodiment of the inventive concept may include a lower device 601 and an upper device 602. The lower device 601 may include a lower electrode structure 656F, an upper electrode structure 651F, and a via structure 691F, which may be formed in a lower substrate 605. Similarly, the upper device 602 may include a lower electrode structure 652F, an upper electrode structure 657F, and a via structure 692F, which may be formed in an upper substrate 606.

A surface electrode barrier layer 630S may be spaced apart from a lower electrode barrier layer 632F of the upper device 602. Other unmentioned components will be understood with reference to components equal or similar to those of FIGS. 6A through 6E.

Figure 6G:
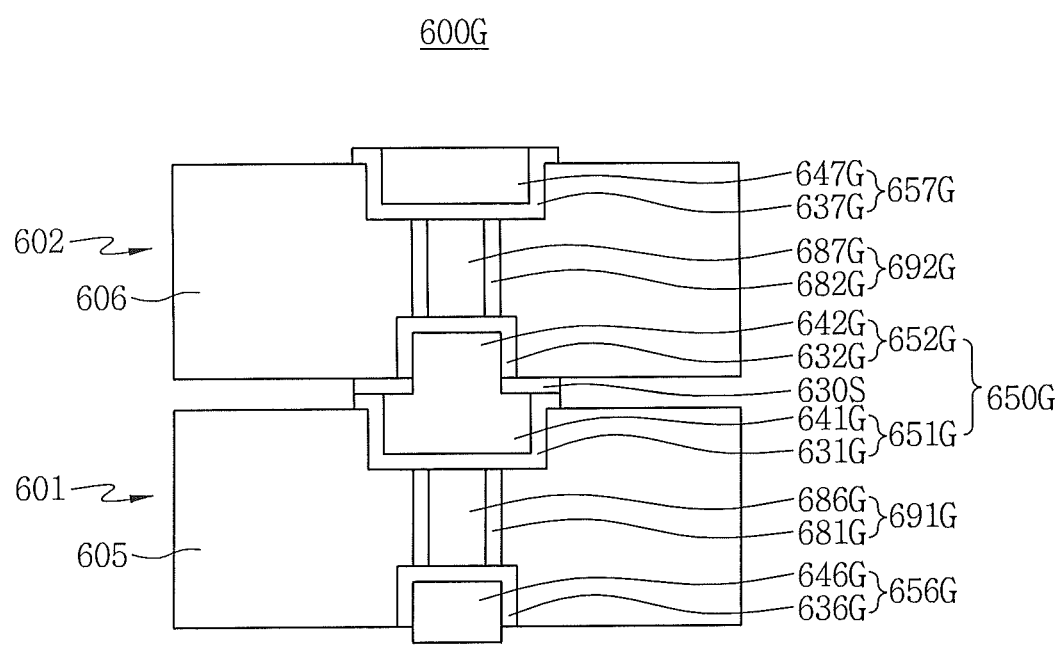

Referring to FIG. 6G, an electrode-connecting structure 600G according to another embodiment of the inventive concept may include a lower device 601 and an upper device 602. The lower device 601 may include a lower electrode structure 656G, an upper electrode structure 651G, and a via structure 691G, which may be formed in a lower substrate 605. Similarly, the upper device 602 may include a lower electrode structure 652G, an upper electrode structure 657, and a via structure 692G, which may be formed in an upper substrate 606.

The upper electrode structure 651G of the lower device 601 may include a lower electrode barrier layer 631G of the lower device 601, which may extend onto a surface of the lower substrate 605, and a surface electrode barrier layer 630S, which may be formed not only on a portion of a top surface of an upper metal electrode 641G of the lower device 601 but also on the lower electrode barrier layer 631G of the lower device 601, which may extend onto the surface of the lower substrate 605. Other unmentioned components and a further detailed description will be understood with reference to components equal or similar to those of FIGS. 1G and 6A through 6F.

FIGS. 7A through 7D and FIGS. 8A through 13D are conceptual flowcharts and longitudinal sectional views illustrating methods of forming lower devices constituting electrode-connecting structures according to various embodiments of the inventive concept.

Figure 7A:
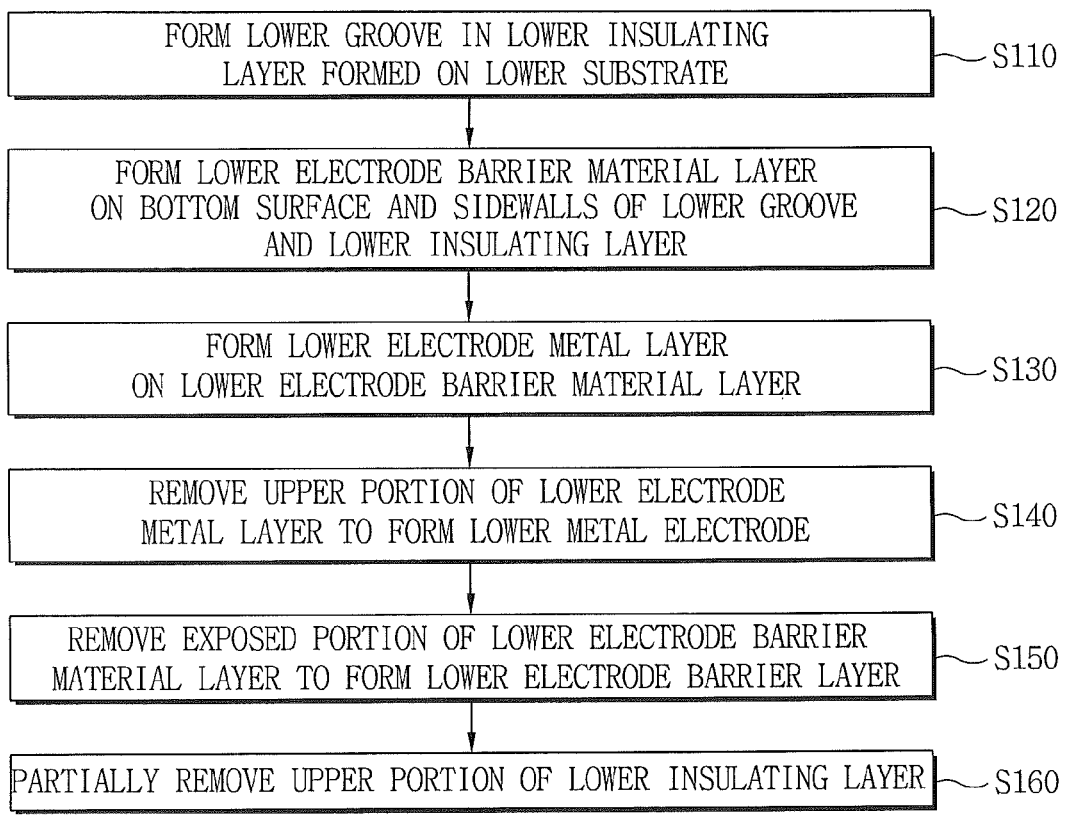
FIGS. 7A through 7D are conceptual flowcharts illustrating methods of forming lower devices constituting electrode-connecting structures according to various embodiments of the inventive concept.
Figure 8A:
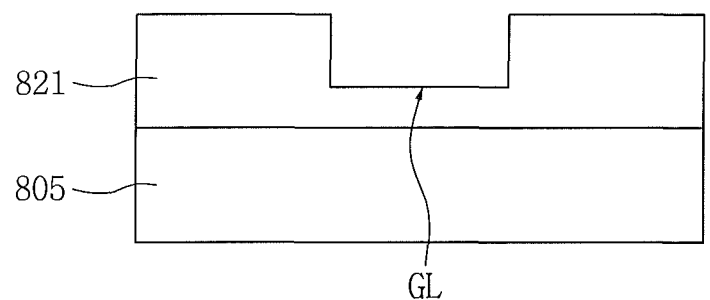
FIGS. 8A through 13D are conceptual longitudinal sectional views illustrating methods of forming lower devices constituting electrode-connecting structures according to various embodiments of the inventive concept.

Referring to FIGS. 7A and 8A, a method of forming a lower device 801A according to an embodiment of the inventive concept may include forming a lower groove GL in a lower insulating layer 821 formed on a lower substrate 805 (operation S110). The lower substrate 805 may include a silicon wafer, a SOI wafer, a SiGe wafer, a SiC wafer, a glass substrate, or a ceramic substrate. In the present embodiment, the lower substrate 805 may exemplarily include a silicon wafer. The lower insulating layer 821 may include oxygen. For example, the lower insulating layer 821 may include silicon oxide. In another embodiment, the lower insulating layer 821 may include an insulating material, such as silicon nitride, silicon oxynitride, or polyimide. The lower groove GL may be formed using a photolithography process and an etching process. From a plan view, the lower groove GL may have a substantially tetragonal recess shape or a line-type trench shape.

Figure 8B:
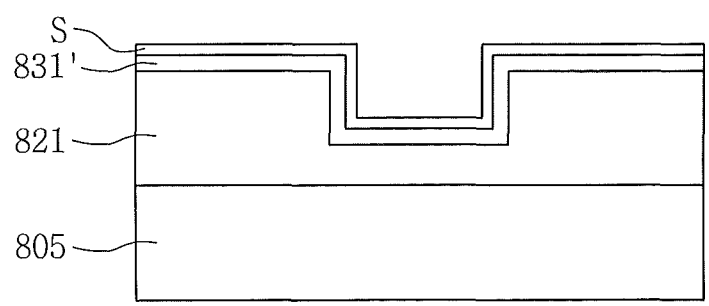

Referring to FIGS. 7A and 8B, the method of forming the lower device 801A according to the present embodiment of the inventive concept may include conformally forming a lower electrode barrier material layer 831' to wholly cover bottom and lateral surfaces of the lower groove GL and a surface of the lower insulating layer 821 (operation S120). The lower electrode barrier material layer 831' may include a metal layer and/or a metal nitride layer. For example, the lower electrode barrier layer 831' may include Ti, Ti/TiN, TiN, TiW, Ta, Ta/TaN, or TaN. The lower electrode barrier material layer 831' may be formed using a physical vapor deposition (PVD) process and/or a chemical vapor deposition (CVD) process. For example, when the lower electrode barrier material layer 831' includes a Ta/TaN layer, forming a Ta layer on the lower insulating layer 821 using a PVD process may be sequentially followed by forming a TaN layer on the Ta layer using a CVD process. The TaN layer may be obtained by nitriding a surface of the Ta layer. When the lower electrode barrier material layer 831' includes a Ti/TiN layer, the lower electrode material layer 831' may be formed in the same way as described above. When a Ta layer and a Ti layer are nitrided, only one of a TaN layer and TiN layer may be formed. In another embodiment, the lower electrode barrier layer 831' may include silicon nitride. Thereafter, the method of forming the lower device 801A according to the present embodiment of the inventive concept may include forming a lower seed layer S on the lower electrode barrier material layer 831'. The lower seed layer S may be formed using a PVD process, such as a sputtering process. The lower seed layer S may include copper.

Figure 8C:
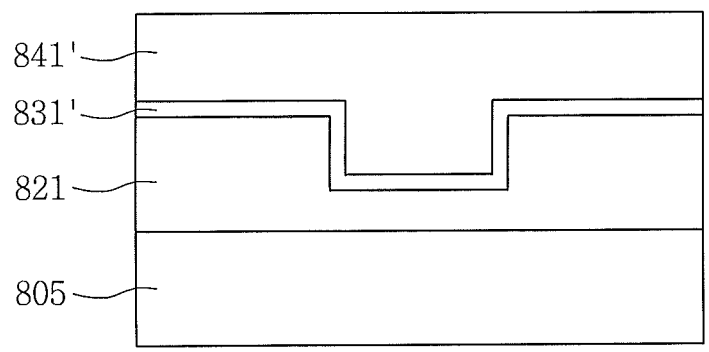

Referring to FIGS. 7A and 8C, the method of forming the lower device 801A according to the present embodiment of the inventive concept may include forming a lower electrode metal layer 841' on the lower electrode barrier material layer 831' (operation S130). The lower electrode metal layer 841' may include copper. The lower electrode metal layer 841' may be formed using a plating process. The lower seed layer S may be absorbed as a portion of the lower electrode metal layer 841'. That is, a boundary between the lower seed layer S and the lower electrode metal layer 841' may not be seen.

Figure 8D:
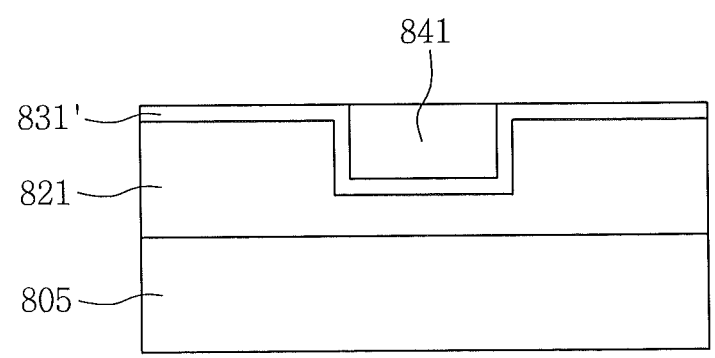

Referring to FIGS. 7A and 8D, the method of forming the lower device 801A according to the present embodiment of the inventive concept may include removing an upper portion of the lower electrode metal layer 841' using a chemical mechanical polishing (CMP) process to form a lower metal electrode 841 (operation S140). Simultaneously, the lower electrode barrier material layer 831' may be exposed around the lower metal electrode 841.

Figure 8E:
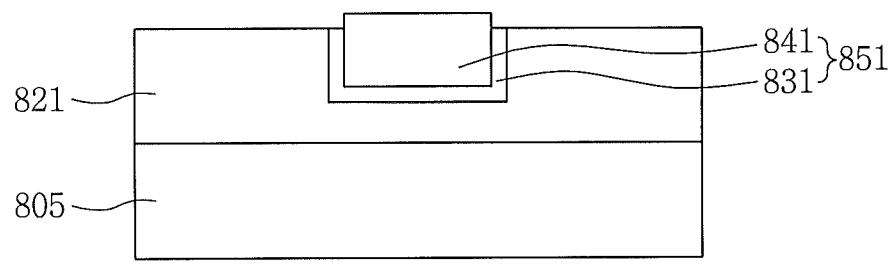

Referring to FIGS. 7A and 8E, the method of forming the lower device 801A according to the present embodiment of the inventive concept may include removing an exposed portion of the lower electrode barrier material layer 831' until the lower insulating layer 821 is exposed to form a lower electrode structure 851 (operation S150). That is, a lower electrode barrier layer 831 may be formed. Topmost ends of the lower electrode barrier layer 831 may be disposed at a lower level than a bottom surface of the lower metal electrode 841. Although FIG. 8E illustrates that the topmost ends of the lower electrode barrier layer 831 are disposed at the same level as a top surface of the lower insulating layer 821, the topmost ends of the lower electrode barrier layer 831 may be disposed at a lower level than the top surface of the lower insulating layer 821. In the above-described operations, the lower device 801A, according to the present embodiment of the inventive concept, may be formed.

Figure 8F:
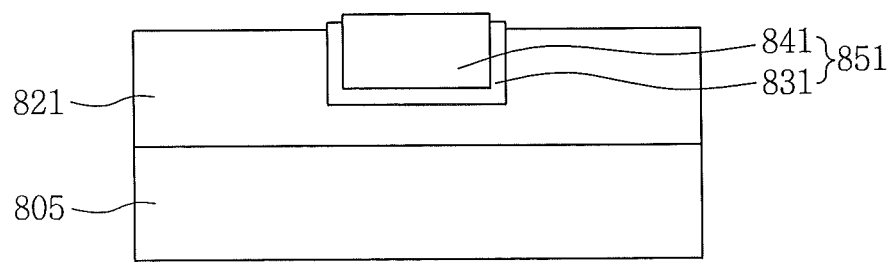

Referring to FIGS. 7A and 8F, the method of forming the lower device 801A according to the present embodiment of the inventive concept may further include partially removing an upper portion of the lower insulating layer 821. Due to the current process, the topmost ends of the lower electrode barrier layer 831 may protrude more than the top surface of the lower insulating layer 821 (operation S160).

FIGS. 7B and 9A through 9D are a conceptual flowchart and conceptual longitudinal sectional views illustrating methods of forming lower devices 801B, 801C, and 801D according to other embodiments of the inventive concept.

Figure 7B:
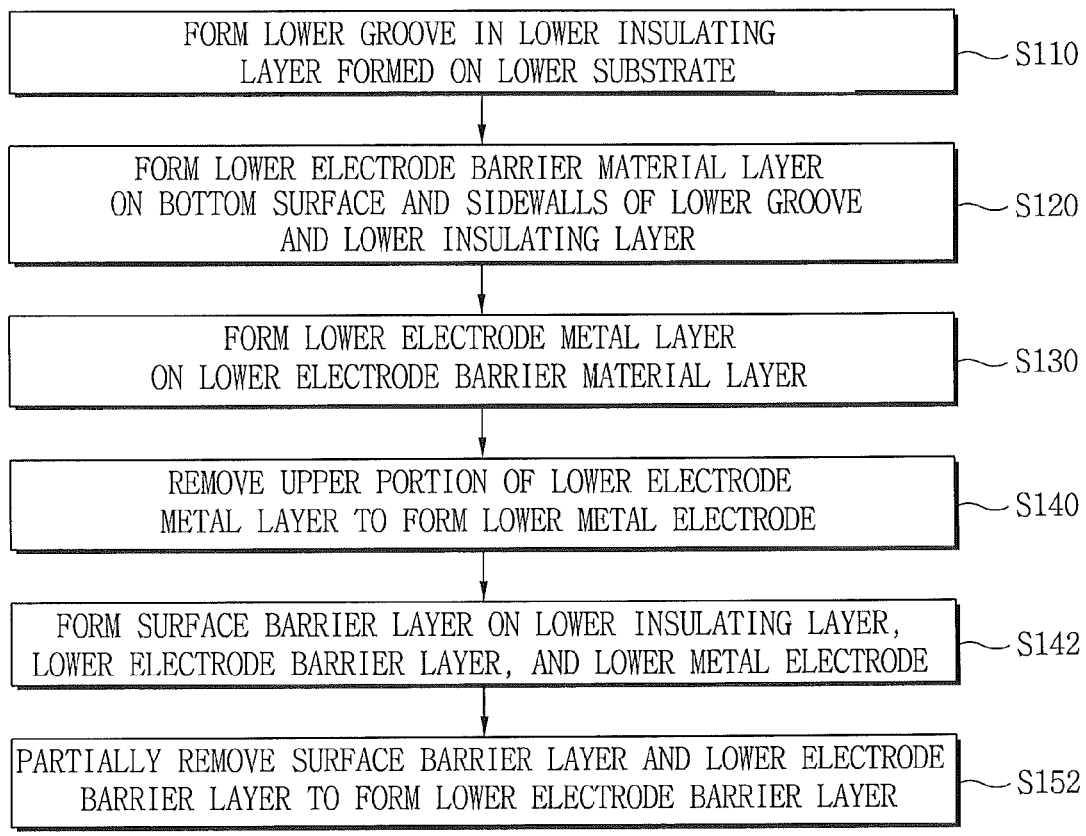
Figure 9A:
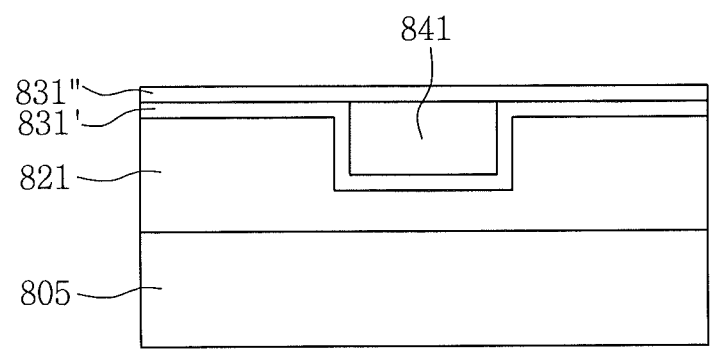

Referring to FIGS. 7B and 9A, the method of forming the lower device 801B according to the present embodiment of the inventive concept may include further forming a surface electrode barrier layer 830' on the lower insulating layer 821, the lower electrode barrier material layer 831', and the lower metal electrode 841 after the operation of FIG. 8D (operation S142). A surface electrode barrier layer 830" may include Ti, Ti/TiN, TiN, TiW, Ta, Ta/TaN, TaN, or silicon nitride.

Figure 9B:
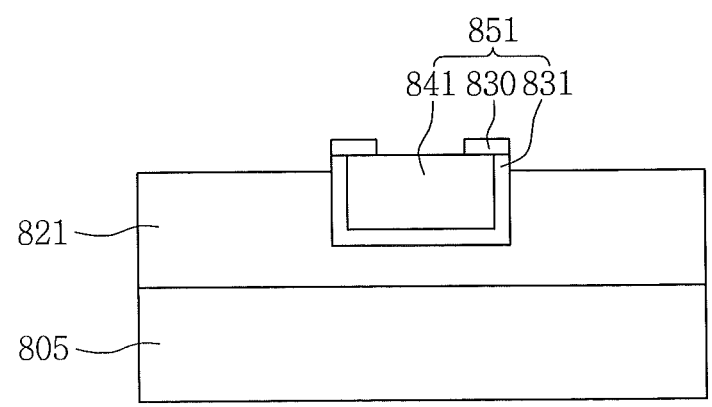

Referring to FIGS. 7B and 9B, the method of forming the lower device 801B according to the present embodiment of the inventive concept may include partially removing the surface electrode barrier layer 830' and the lower electrode barrier material layer 831' (operation S152). For example, the method of forming the lower device 801B according to the present embodiment of the inventive concept may include partially removing the surface electrode barrier layer 830' and the lower electrode barrier material layer 831' using photolithography and etching processes to expose a top surface of the lower metal electrode 841 and a top surface of the lower insulating layer 821. That is, a surface electrode barrier layer 830 may be formed. When the surface electrode barrier layer 830 includes the same material as a lower electrode barrier layer 831, the boundary therebetween may disappear.

Figure 9C:
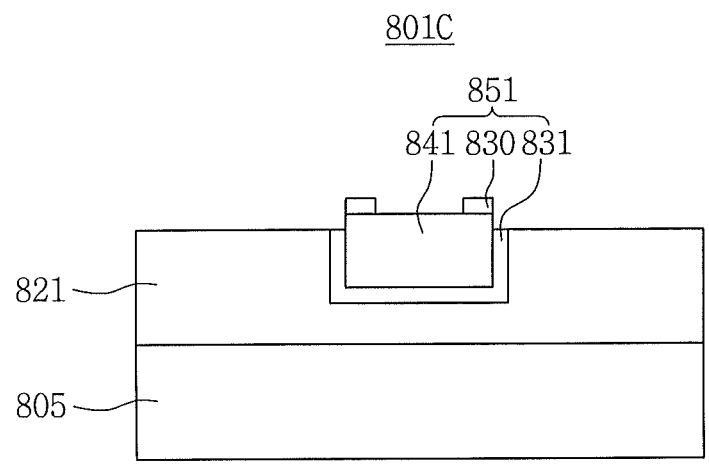

Referring further to FIG. 9C, a method of forming a lower device 801C according to another embodiment of the inventive concept may include the processes described with reference to FIG. 9B, and further include partially removing the surface electrode barrier layer 830' and the lower electrode barrier material layer 831' to expose lateral surfaces of the lower metal electrode 841. Accordingly, the surface electrode barrier layer 830 may be formed on a portion of the top surface of the lower metal electrode 841, and portions of the lateral surfaces of the lower metal electrode 841 may be exposed.

Figure 9D:
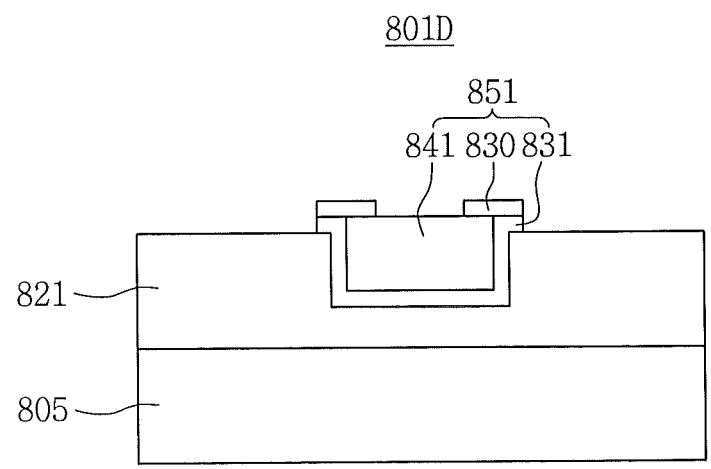

Referring further to FIG. 9D, a method of forming a lower device 801D according to another embodiment of the inventive concept may include the processes described with reference to FIG. 9B, and further include partially removing the surface electrode barrier layer 830' and the lower electrode barrier material layer 831' in order not to expose lateral surfaces of the lower metal electrode 841. Accordingly, a surface electrode barrier layer 830 may be formed on a portion of a top surface of the lower metal electrode 841, the lateral surfaces of the lower metal electrode 841, and a portion of a top surface of the lower insulating layer 821. As described above, when the surface electrode barrier layer 830 includes the same material as the lower electrode barrier layer 831, the boundary therebetween may disappear.

Figure 7C:
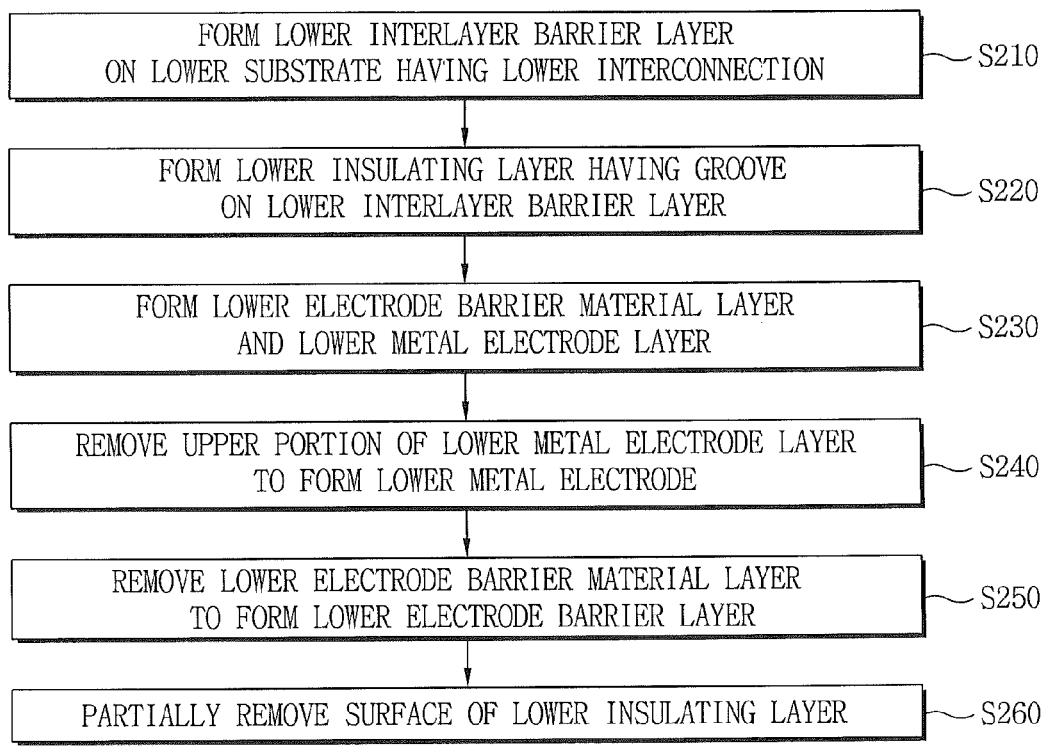
Figure 10A:
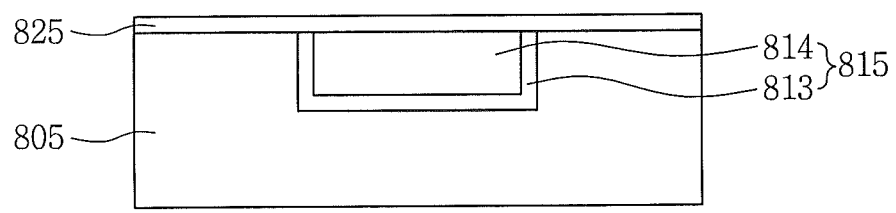

Referring to FIGS. 7C and 10A, a method of forming a lower device 801E according to another embodiment of the inventive concept may include forming a lower interlayer barrier layer 825 on a lower substrate 805 having a lower interconnection 815 (operation S210). The lower interconnection 815 may include a lower metal interconnection 814 and a lower interconnection barrier layer 813 configured to surround the lower metal interconnection 814. The lower metal interconnection 814 may include a metal, such as copper, and the lower interconnection barrier layer 813 may include any one of Ti, Ti/TiN, TiN, TiW, Ta, Ta/TaN, or TaN. The lower interlayer barrier layer 825 may directly cover top surfaces of the lower metal interconnection 814 and the lower interconnection barrier layer 813. The lower interlayer barrier layer 825 may include silicon oxide or silicon nitride.

Figure 10B:
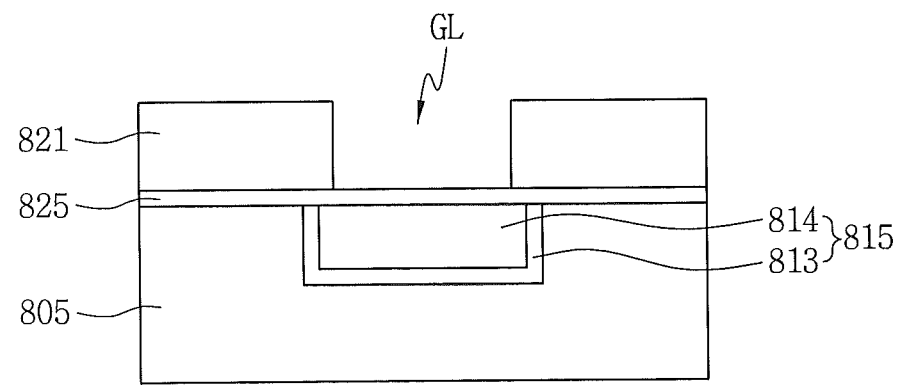

Referring to FIGS. 7C and 10B, the method of forming the lower device 801E according to the present embodiment of the inventive concept may include forming a lower insulating layer 821 having a lower groove GL on the lower interlayer barrier layer 825 (operation S220). The lower groove GL may expose a portion of the top surface of the lower metal interconnection 814. The lower insulating layer 821 may include silicon oxide.

Figure 10C:
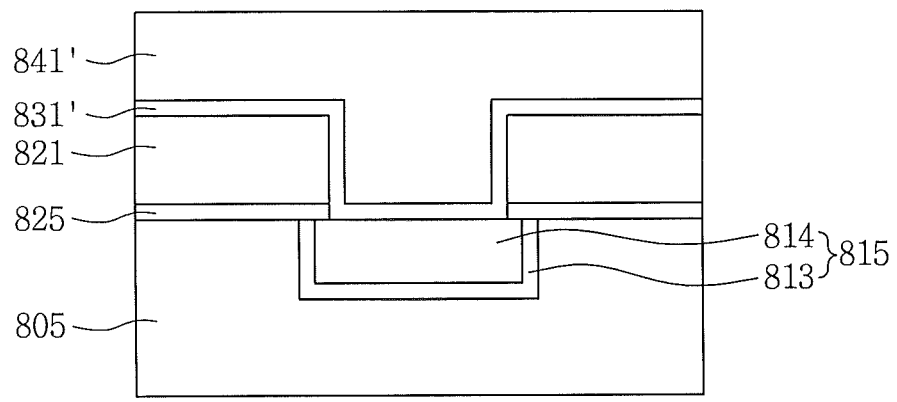

Referring to FIGS. 7C and 10C, the method of forming the lower device 801E according to the present embodiment of the inventive concept may include conformally forming a lower electrode barrier material layer 831' on bottom and lateral surfaces of the lower groove GL and a top surface of the lower insulating layer 825, and forming a lower electrode metal layer 841' (operation S230). The lower electrode barrier material layer 831' may include any one of Ti, Ti/TiN, TiN, TiW, Ta, Ta/TaN, or TaN. The lower electrode metal layer 841' may include copper.

Figure 10D:
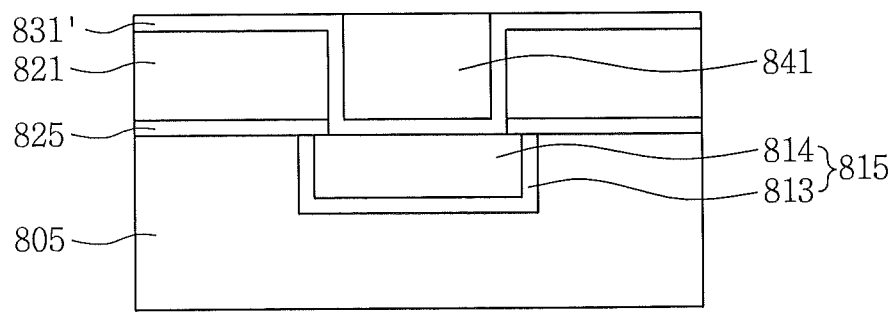

Referring to FIGS. 7C and 10D, the method of forming the lower device 801E according to the present embodiment of the inventive concept may include removing an upper portion of the lower electrode metal layer 841' to form a lower metal electrode 841 (operation S240). During this process, a top surface of the lower electrode barrier material layer 831' may be exposed. The removal of the upper portion of the lower electrode metal layer 841' may be performed using a CMP process.

Figure 10E:
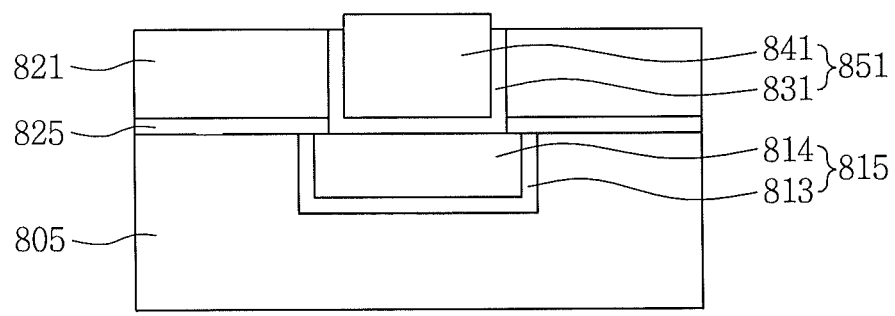

Referring to FIGS. 7C and 10E, the method of forming the lower device 801E according to the present embodiment of the inventive concept may include removing an exposed portion of the lower electrode barrier material layer 831' to form a lower electrode barrier layer 831 (operation S250).

Figure 10F:
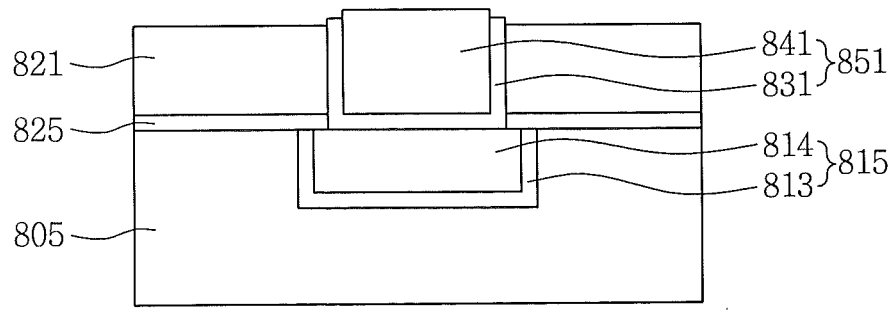

Referring further to FIGS. 7C and 10F, the method of forming the lower device 801E according to the present embodiment of the inventive concept may further include partially removing a surface of the lower insulating layer 821 (operation S260). Due to the current process, topmost ends of the lower electrode barrier layer 831 may protrude more than a top surface of the lower insulating layer 821.

FIGS. 11A through 11D are conceptual longitudinal sectional views illustrating methods of forming lower devices 801F, 801G, and 801H according to other embodiments of the inventive concept.

Figure 11A:
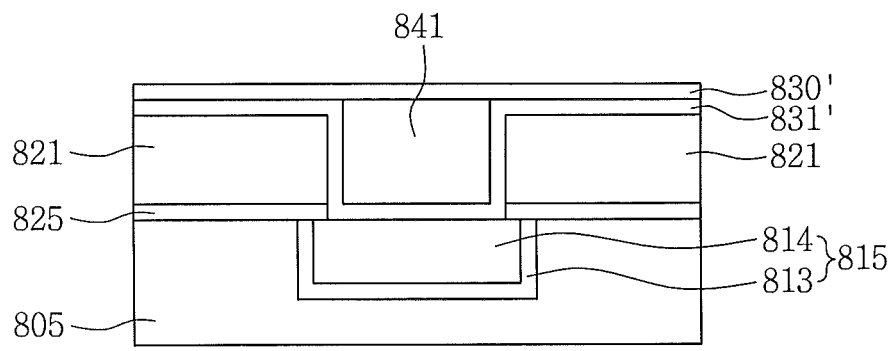

Referring to FIG. 11A, the method of forming the lower device 801F according to the present embodiment of the inventive concept may include further forming a surface electrode barrier layer 830' on the lower insulating layer 821, the lower electrode barrier material layer 831', and the lower metal electrode 841 following the operations of FIG. 10D. The surface electrode barrier layer 830' may include Ti, Ti/TiN, TiN, TiW, Ta, Ta/TaN, TaN, or silicon nitride.

Figure 11B:
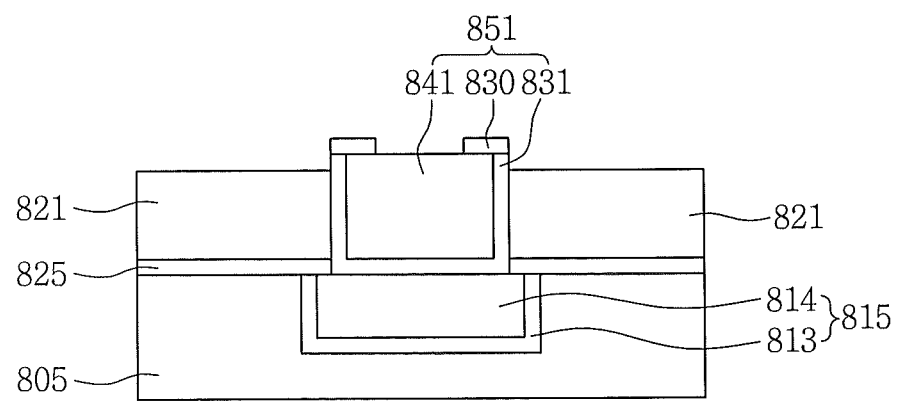

Referring to FIG. 11B, the method of forming the lower device 801F according to the present embodiment of the inventive concept may include partially removing the surface electrode barrier layer 830' and the lower electrode barrier material layer 831'. For example, the method of forming the lower device 801F according to the present embodiment of the inventive concept may include partially removing the surface electrode barrier layer 830' and the lower electrode barrier material layer 831' using photolithography and etching processes to expose a top surface of the lower metal electrode 841 and a top surface of the lower insulating layer 821. That is, a surface electrode barrier layer 830 may be formed. When the surface electrode barrier layer 830 includes the same material as the lower electrode barrier layer 831, the boundary therebetween may disappear.

Figure 11C:
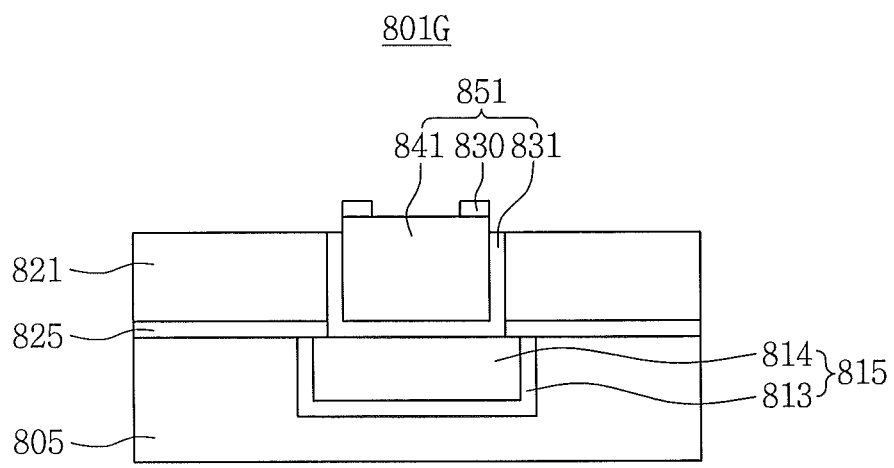

Referring further to FIG. 11C, a method of forming a lower device 801G according to another embodiment of the inventive concept may include the processes described with reference to FIG. 11B, and further include partially removing the surface electrode barrier layer 830' and the lower electrode barrier material layer 831' to expose lateral surfaces of the lower metal electrode 841. Accordingly, a surface electrode barrier layer 830 may be formed on a portion of the top surface of the lower metal electrode 841, and portions of the lateral surfaces of the lower metal electrode 841 may be exposed.

Figure 11D:
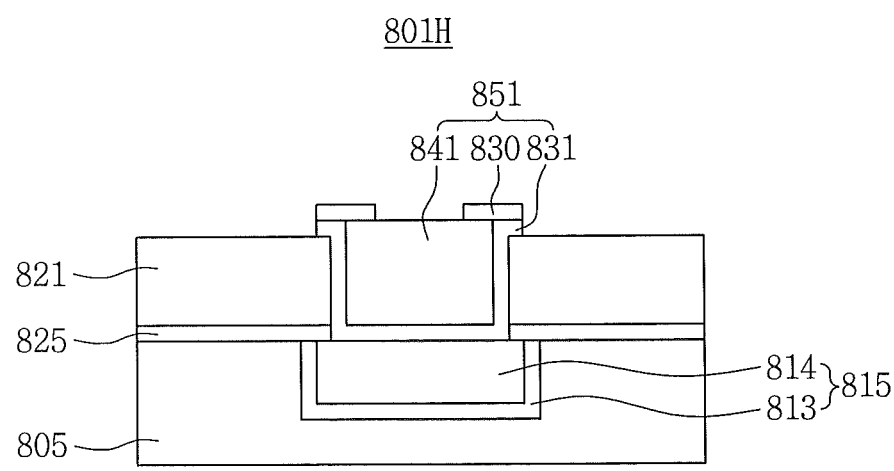

Referring further to FIG. 11D, a method of forming a lower device 801H according to another embodiment of the inventive concept may include the processes described with reference to FIG. 11B, and further include partially removing the surface electrode barrier layer 830' and the lower electrode barrier material layer 831' in order not to expose lateral surfaces of the lower metal electrode 841. Accordingly, a surface electrode barrier layer 830 may be formed on a portion of the top surface of the lower metal electrode 841, the lateral surfaces of the lower metal electrode 841, and a portion of the top surface of the lower insulating layer 821. As described above, when the surface electrode barrier layer 830 includes the same material as the lower electrode barrier layer 831, the boundary therebetween may disappear.

Figure 7D:
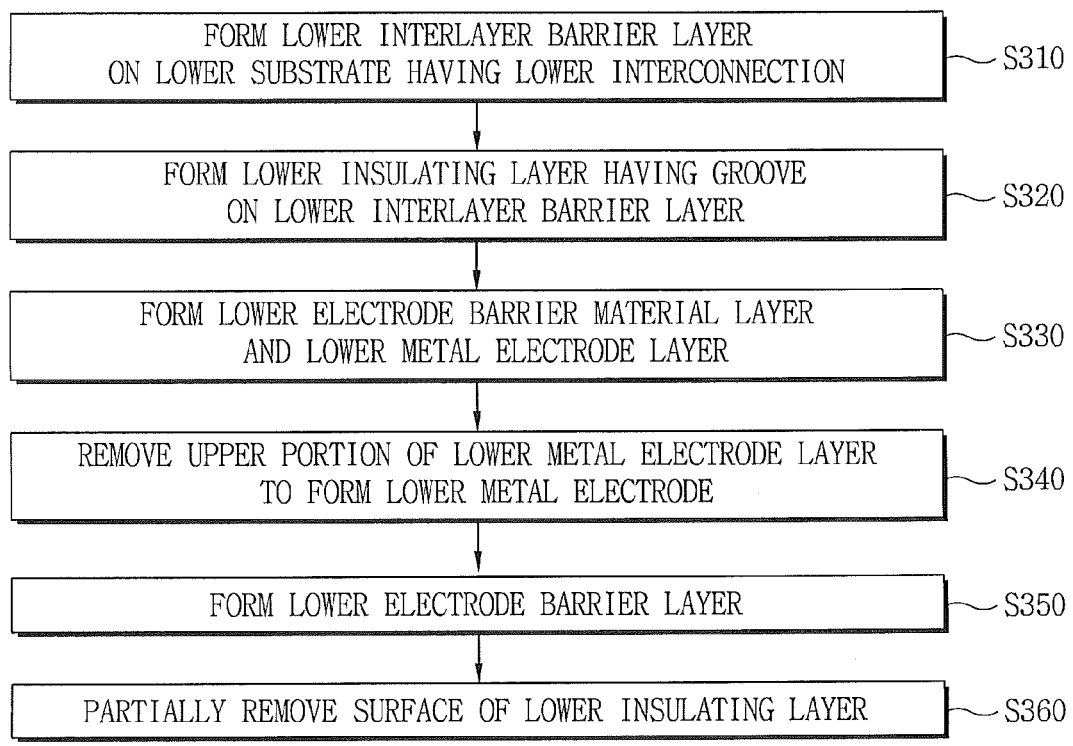
Figure 12A:
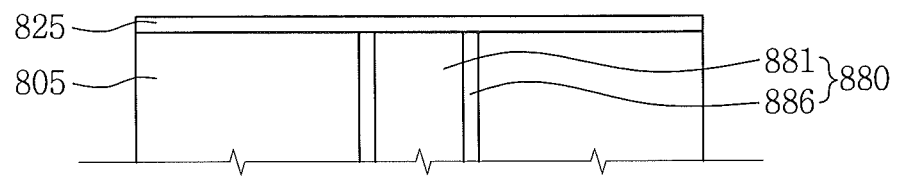

Referring to FIGS. 7D and 12A, a method of forming a lower device 801I according to another embodiment of the inventive concept may include forming a lower interlayer barrier layer 825 on a lower substrate 805 including a lower via structure 880 (operation S310). The lower via structure 880 may include a lower via plug 886 and a lower via barrier layer 881 configured to surround the lower via plug 886. The lower via plug 886 may include a metal, such as copper, and the lower via barrier layer 881 may include any one of Ti, Ti/TiN, TiN, TiW, Ta, Ta/TaN, TaN or SiN. The lower interlayer barrier layer 825 may directly cover top surfaces of the lower via plug 886 and the lower via barrier layer 881. The lower interlayer barrier layer 825 may include silicon oxide or silicon nitride.

Figure 12B:
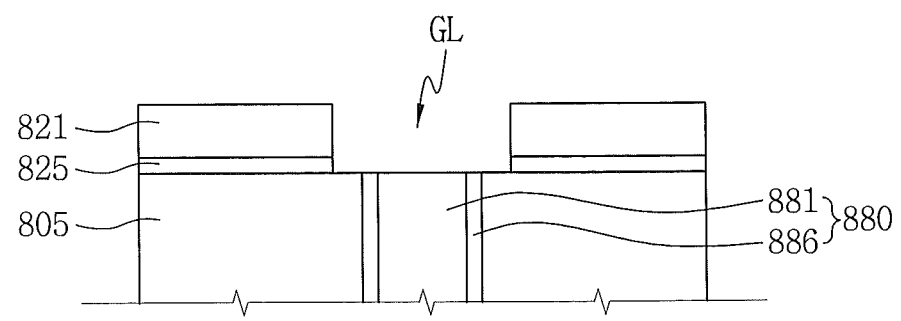

Referring to FIGS. 7D and 12B, the method of forming the lower device 801I according to the present embodiment of the inventive concept may include forming a lower insulating layer 821 having a lower groove GL on the lower interlayer barrier layer 825 (operation S320). The lower insulating layer 821 may include silicon oxide. The lower groove GL may expose a top surface of the lower via structure 880.

Figure 12C:
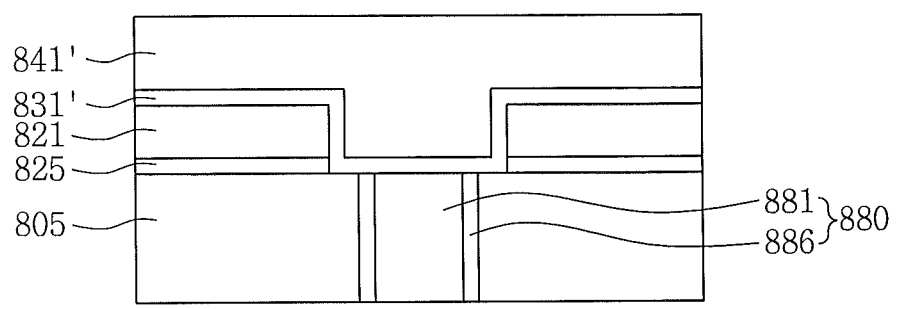

Referring to FIGS. 7D and 12C, the method of forming the lower device 801I according to the present embodiment of the inventive concept may include conformally forming a lower electrode barrier material layer 831' on bottom and lateral surfaces of the lower groove GL and a top surface of the lower insulating layer 825, and forming a lower electrode metal layer 841' (operation S330). The lower electrode barrier material layer 831' may include any one of Ti, Ti/TiN, TiN, TiW, Ta, Ta/TaN, or TaN. The lower electrode metal layer 841' may include copper.

Figure 12D:
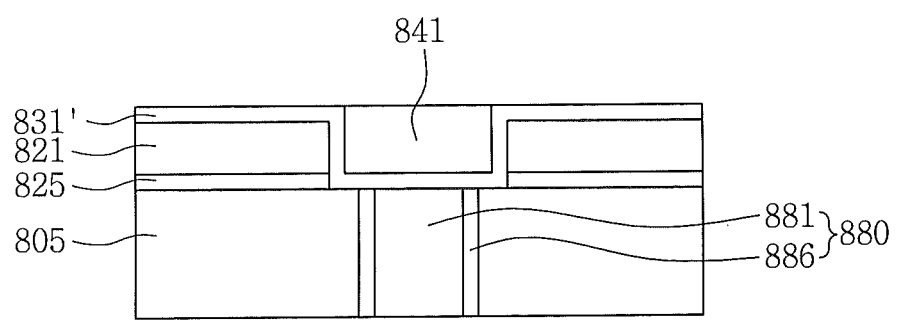

Referring to FIGS. 7D and 12D, the method of forming the lower device 801I according to the present embodiment of the inventive concept may include removing an upper portion of the lower electrode meta layer 841' to form a lower metal electrode 841 (operation S340). During this process, a top surface of the lower electrode barrier material layer 831' may be exposed. The removal of the upper portion of the lower electrode metal layer 841' may be performed using a CMP process.

Figure 12E:
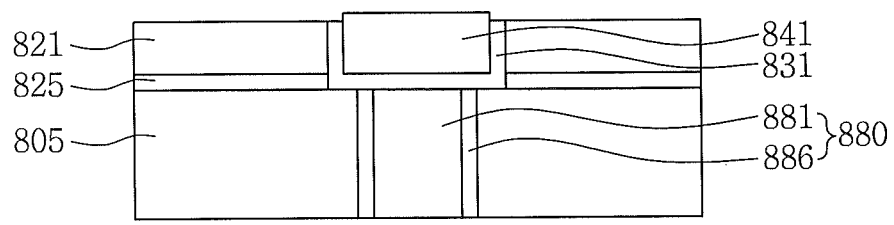

Referring to FIGS. 7D and 12E, the method of forming the lower device 801I according to the present embodiment of the inventive concept may include removing an exposed portion of the lower electrode barrier material layer 831' to form a lower electrode barrier layer 831 (operation S350).

Figure 12F:
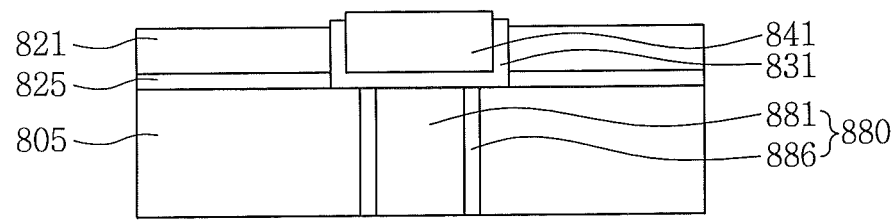

Referring further to FIGS. 7C and 12F, the method of forming the lower device 801I according to the present embodiment of the inventive concept may further include partially removing a surface of the lower insulating layer 821 (operation S360). Due to the current process, topmost ends of the lower electrode barrier layer 831 may protrude more than a top surface of the lower insulating layer 821.

FIGS. 13A through 13D are conceptual longitudinal sectional views illustrating methods of forming lower devices 801J, 801K, and 801L according to other embodiments of the inventive concept.

Figure 13A:
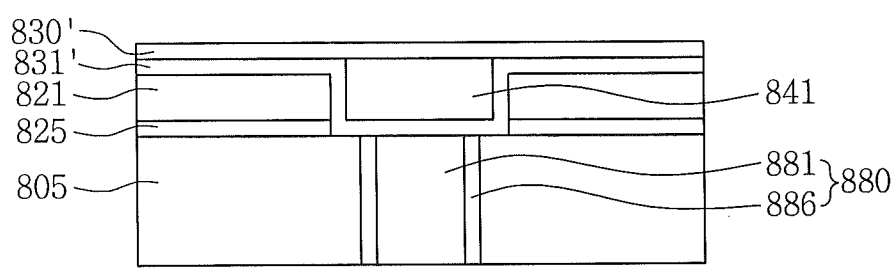

Referring to FIG. 13A, the method of forming the lower device 801J according to the present embodiment of the inventive concept may include further forming a surface electrode barrier layer 830' on the lower insulating layer 821, the lower electrode barrier material layer 831', and the lower metal electrode 841 following the operations of FIG. 12D. The surface electrode barrier layer 830' may include Ti, Ti/TiN, TiN, TiW, Ta, Ta/TaN, TaN, or silicon nitride.

Figure 13B:
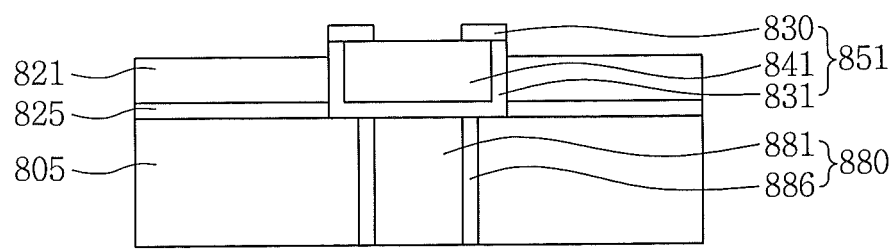

Referring to FIG. 13B, the method of forming the lower device 801J according to the present embodiment of the inventive concept may include partially removing the surface electrode barrier layer 830' and the lower electrode barrier material layer 831'. For example, the method of forming the lower device 801J according to the present embodiment of the inventive concept may include partially removing the surface electrode barrier layer 830' and the lower electrode barrier material layer 831' using photolithography and etching processes to expose a top surface of the lower metal electrode 841 and a top surface of the lower insulating layer 821. That is, a surface electrode barrier layer 830 may be formed. When the surface electrode barrier layer 830 includes the same material as a lower electrode barrier layer 831, the boundary therebetween may disappear.

Figure 13C:
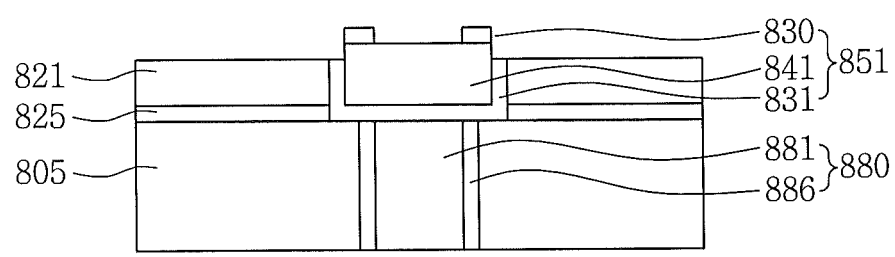

Referring further to FIG. 13C, a method of forming a lower device 801K according to another embodiment of the inventive concept may include the processes described with reference to FIG. 13B, and further include partially removing the surface electrode barrier layer 830' and the lower electrode barrier material layer 831' to expose lateral surfaces of the lower metal electrode 841. Accordingly, a surface electrode barrier layer 830 may be formed on a portion of the top surface of the lower metal electrode 841, and portions of the lateral surfaces of the lower metal electrode 841 may be exposed.

Figure 13D:
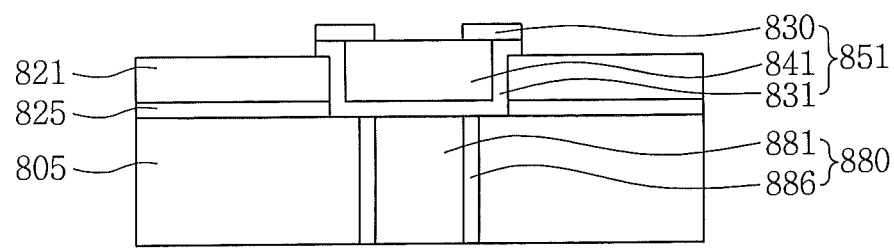

Referring further to FIG. 13D, a method of forming a lower device 801L according to another embodiment of the inventive concept may include the processes described with reference to FIG. 13B, and further include partially removing the surface electrode barrier layer 830' and the lower electrode barrier material layer 831' in order not to expose lateral surfaces of the lower metal electrode 841. Accordingly, a surface electrode barrier layer 830 may be formed on a portion of the top surface of the lower metal electrode 841, the lateral surfaces of the lower metal electrode 841, and a portion of the top surface of the lower insulating layer 821. As described above, when the surface electrode barrier layer 830 includes the same material as the lower electrode barrier layer 831, the boundary therebetween may disappear.

FIGS. 14A and 14B and 15A through 17E are conceptual flowcharts and longitudinal sectional views illustrating methods of forming upper devices constituting electrode-connecting structures according to various embodiments of the inventive concept.

Figure 14A:
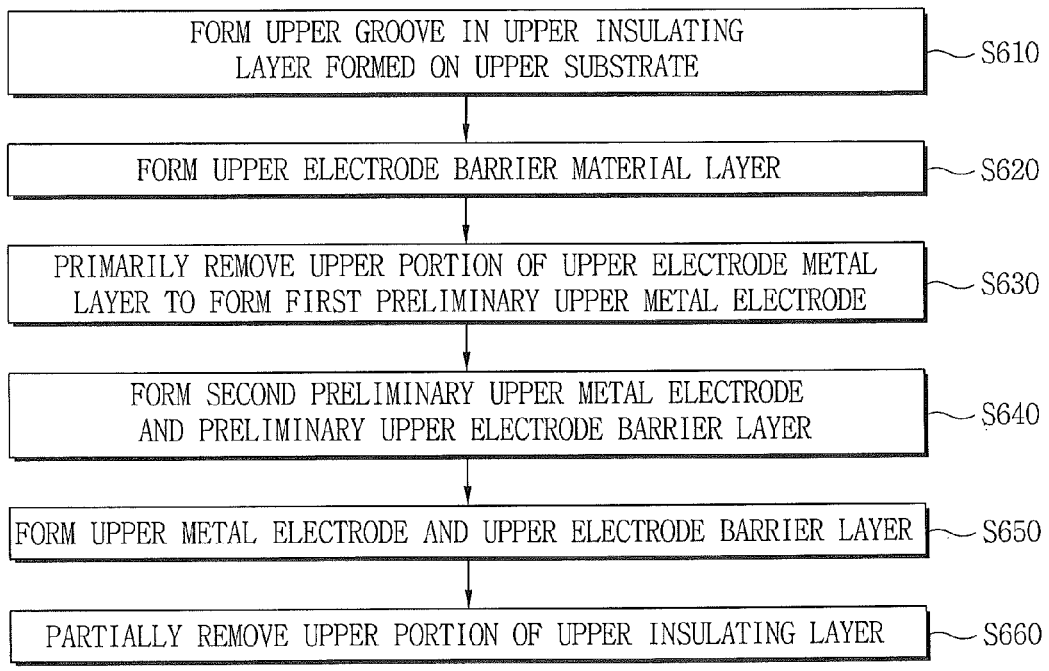
FIGS. 14A and 14B are conceptual flowcharts illustrating methods of forming upper devices constituting electrode-connecting structures according to various embodiments of the inventive concept.
Figure 15A:
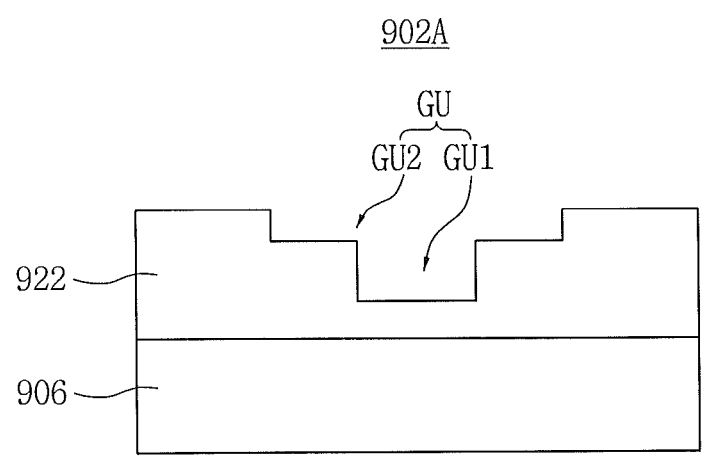
FIGS. 15A through 17E are conceptual longitudinal sectional views illustrating methods of forming upper devices constituting electrode-connecting structures according to various embodiments of the inventive concept.

Referring to FIGS. 14A and 15A, a method of forming an upper device 902 according to an embodiment of the inventive concept may include forming an upper groove GU in an upper insulating layer 922 formed on an upper substrate 906 (operation S610). The upper substrate 906 may include a silicon wafer, a SOI wafer, a SiGe wafer, a SiC wafer, a glass substrate, or a ceramic substrate. In the present embodiment, the upper substrate 906 may exemplarily include a silicon wafer. The upper insulating layer 922 may include oxygen. For instance, the upper insulating layer 922 may include silicon oxide. In another embodiment, the upper insulating layer 922 may include an insulating material, such as silicon nitride, silicon oxynitride, or polyimide. The upper groove GU may include a first upper groove GU1 having a relatively small horizontal width, and a second upper groove GU2 having a relatively great horizontal width. The upper groove GU may be formed using photolithography and etching processes. From a plan view, each of the first and second upper grooves GU1 and GU2 may have a substantially tetragonal recess shape or a line-type trench shape.

Figure 15B:
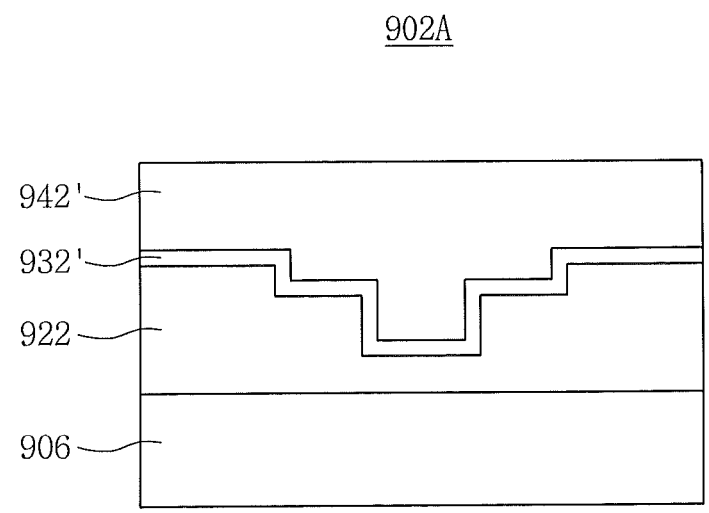

Referring to FIGS. 14A and 15B, the method of forming the upper device 902A according to the present embodiment of the inventive concept may include conformally forming an upper electrode barrier material layer 932' to wholly cover bottom and lateral surfaces of the upper groove GU and a surface of the upper insulating layer 922 (operation S620). The upper electrode barrier material layer 932' may include a metal layer and/or a metal nitride layer. For example, the upper electrode barrier layer 932' may include Ti, Ti/TiN, TiN, TiW, Ta, Ta/TaN, or TaN. The upper electrode barrier material layer 932' may be formed using a PVD process and/or a CVD process. For example, when the upper electrode barrier material layer 932' includes a Ta/TaN layer, forming a Ta layer on the upper insulating layer 922 using a PVD process may be sequentially followed by forming a TaN layer on the Ta layer using a CVD process. The TaN layer may be obtained by nitriding a surface of the Ta layer. When the upper electrode barrier material layer 932' includes a Ti/TiN layer, the upper electrode material layer 932' may be formed in the same way as described above. When a Ta layer and a Ti layer are nitrided, only one of a TaN layer and TiN layer may be formed. In another embodiment, the upper electrode barrier layer 932' may include silicon nitride. Thereafter, the method of forming the lower device 902A according to the present embodiment of the inventive concept may include forming an upper electrode metal layer 942' on the upper electrode barrier material layer 932' (operation S630). The upper electrode metal layer 942' may include copper. The upper electrode metal layer 942' may be formed using a plating process. In addition, an upper seed layer may be formed between the upper electrode barrier material layer 932' and the upper electrode metal layer 942'. The upper seed layer may be absorbed as a portion of the upper electrode metal layer 942'. That is, a boundary between the upper seed layer and the upper electrode metal layer 942' may not be seen.

Figure 15C:
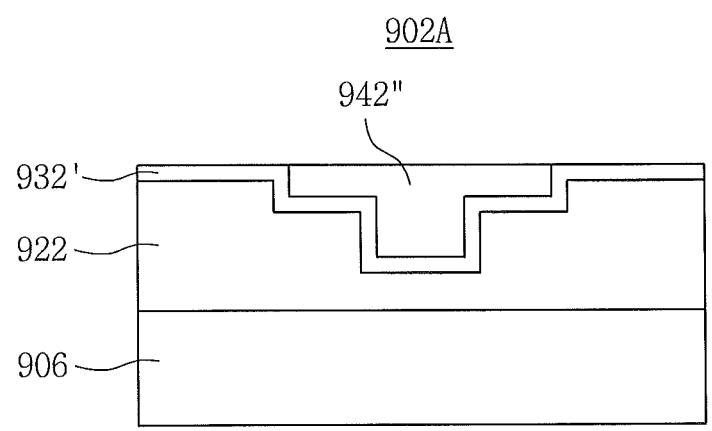

Referring to FIGS. 14A and 15C, the method of forming the upper device 902A according to the present embodiment of the inventive concept may include removing an upper portion of the upper electrode metal layer 942' using a first CMP process to form a first preliminary upper metal electrode 942" (operation S630). During this process, the upper electrode barrier material layer 932' may be exposed around the first preliminary upper metal electrode 942".

Figure 15D:
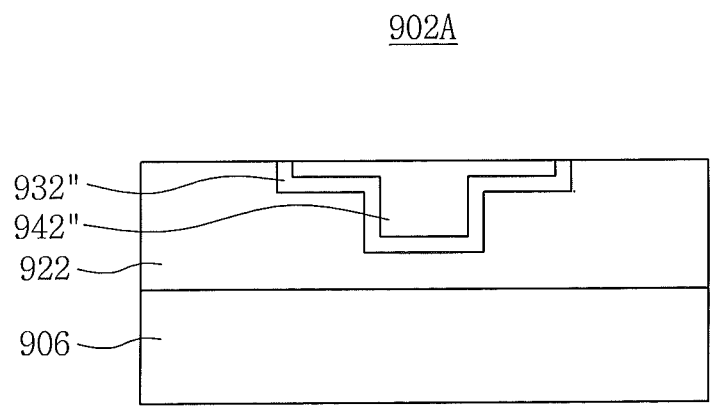

Referring to FIGS. 14A and 15D, the method of forming the upper device 902A according to the present embodiment of the inventive concept may include removing an upper portion of the first preliminary upper metal electrode 942" and an exposed portion of the upper electrode barrier material layer 932' using a second CMP process to form a second preliminary upper metal electrode 942''' and a preliminary upper electrode barrier layer 932" (operation S640). During this process, a top surface of the upper insulating layer 922 may be exposed. Topmost ends of the upper electrode barrier layer 932" may be exposed on a surface of the upper insulating layer 922.

Figure 15E:
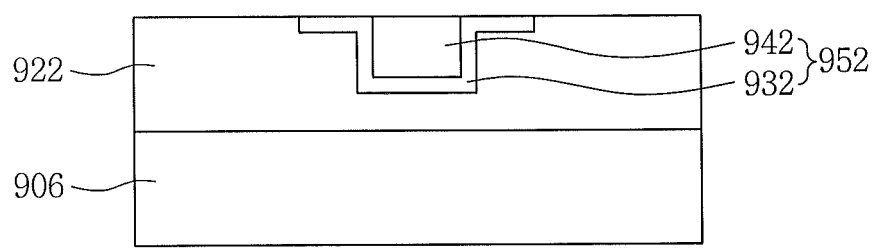

Referring to FIGS. 14A and 15E, the method of forming the upper device 901A according to the present embodiment of the inventive concept may include removing upper portions of the second preliminary upper metal electrode 942''', the preliminary upper electrode barrier layer 932", and the upper insulating layer 922 using a third CMP process to form an upper metal electrode 942 and an upper electrode barrier layer 932 (operation S650).

Figure 15F:
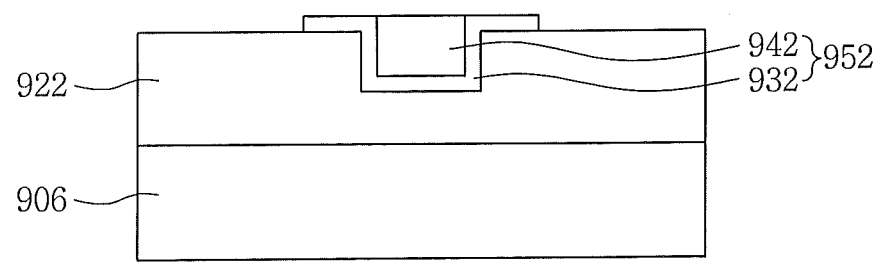

Referring to FIGS. 14A and 15F, the method of forming the upper device 902A according to the present embodiment may include partially removing an upper portion of the upper insulating layer 922 using an etchback process to protrude the upper metal electrode 942 and the upper electrode barrier layer 932 (operation S660).

Figure 16A:
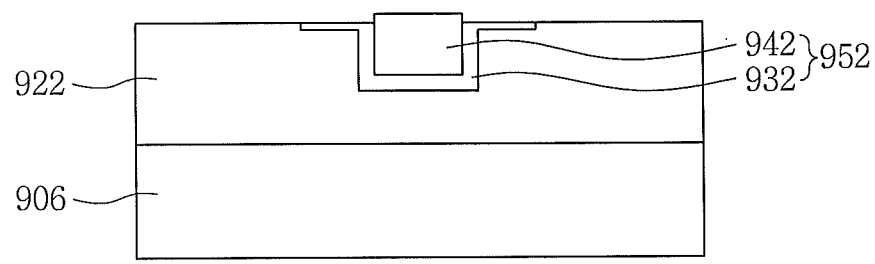
Figure 16B:
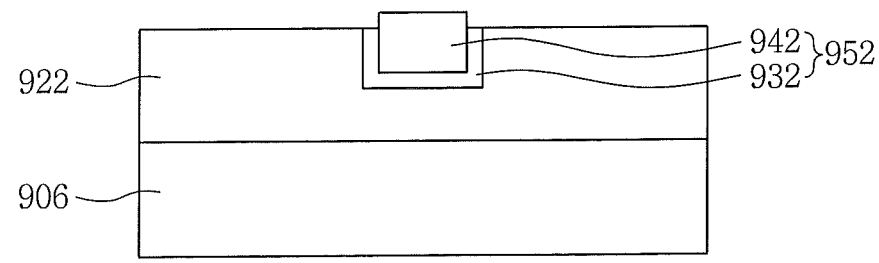
Figure 16C:
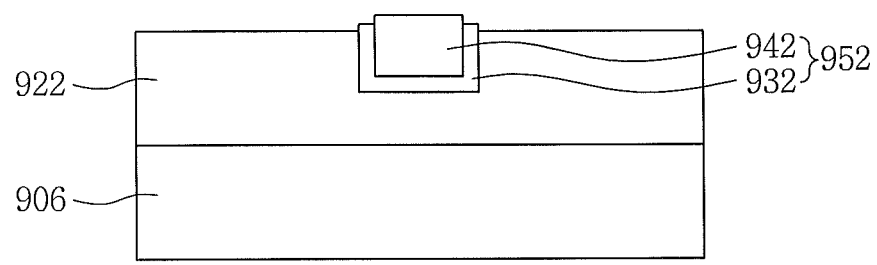

FIGS. 16A through 16C are conceptual longitudinal sectional views illustrating methods of forming upper devices according to other embodiments of the inventive concept.

Referring to FIG. 16A, a method of forming an upper device 902B according to another embodiment of the inventive concept may include partially removing exposed portions of the upper electrode barrier layer 932 and the upper insulating layer 922 using an etchback process to protrude the upper metal electrode 942 following operation S650 of FIGS. 14A and 15E.

Referring to FIG. 16B, a method of forming an upper device 902C according to another embodiment of the inventive concept may include partially removing the upper electrode barrier layer 932 remaining on the upper insulating layer 922, and an upper portion of the upper insulating layer 922 using an etchback process following the operation of FIG. 16A. Due to the current process, the upper metal electrode 942 may protrude.

Referring to FIG. 16C, a method of forming an upper device 902D according to another embodiment of the inventive concept may include partially removing an upper portion of the upper insulating layer 922 using an etchback process following the operation of FIG. 16A or 16B. Due to the current process, topmost ends of the upper electrode barrier layer 932 may protrude.

Figure 14B:
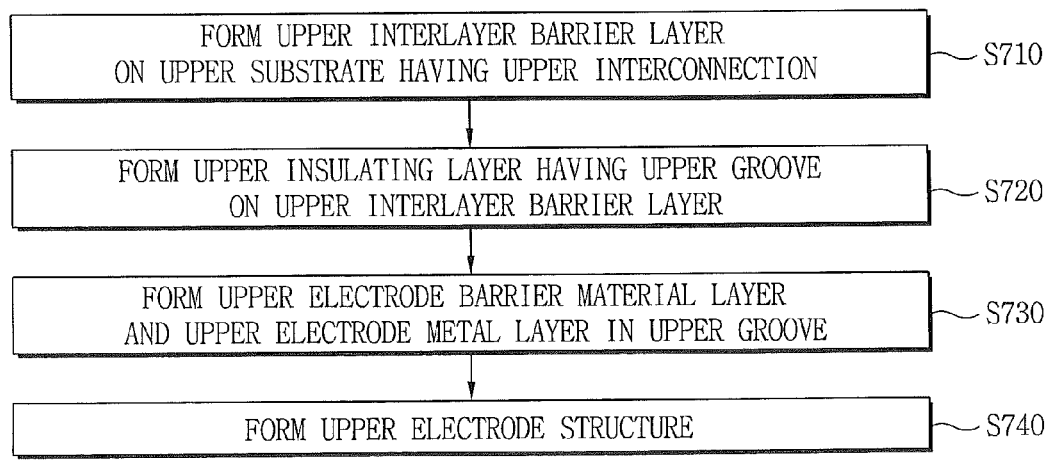
Figure 17A:
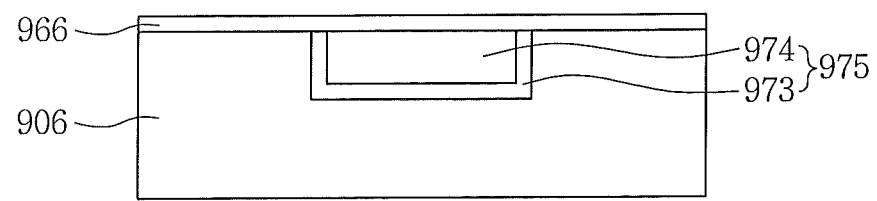

Referring to FIGS. 14B and 17A, a method of forming an upper device 902E according to another embodiment of the inventive concept may include forming an upper interlayer barrier layer 966 on an upper substrate 906 having an upper interconnection 975 (operation S710). The upper interconnection 975 may include an upper metal interconnection 974 and an upper interconnection barrier layer 973 configured to surround the upper metal interconnection 974. The upper metal interconnection 974 may include a metal, such as copper, and the upper interconnection barrier layer 973 may include any one of Ti, Ti/TiN, TiN, TiW, Ta, Ta/TaN, or TaN. The upper interlayer barrier layer 966 may directly cover top surfaces of the upper metal interconnection 974 and the upper interconnection barrier layer 973. The upper interlayer barrier layer 966 may include silicon oxide or silicon nitride.

Figure 17B:
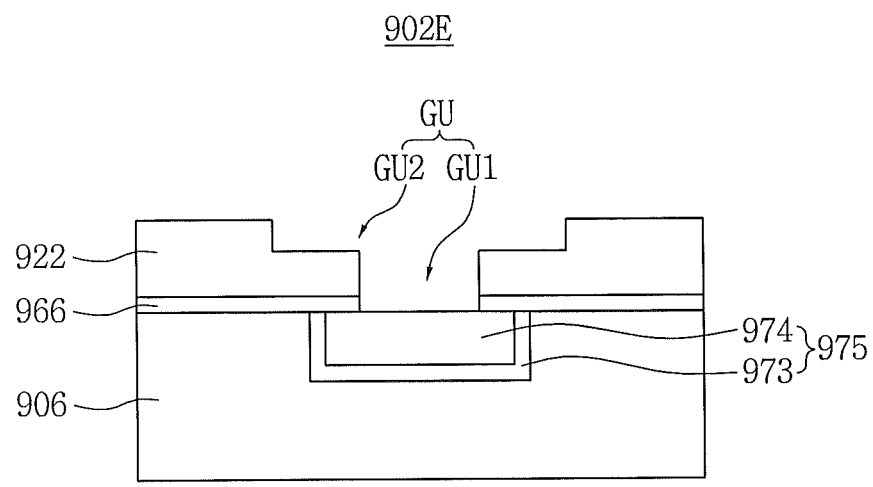

Referring to FIGS. 14B and 17B, the method of forming the upper device 902E according to the present embodiment of the inventive concept may include forming an upper insulating layer 922 having an upper groove GU on the upper interlayer barrier layer 965 (operation S720). The upper groove GU may include a first upper groove GU1 and a second upper groove GU2. The first upper groove GU1 may be formed near the upper interlayer barrier layer 966, while the second upper groove GU2 may be formed near a surface of the upper insulating layer 922. The first upper groove GU1 may partially expose a top surface of the upper metal interconnection 974. The upper insulating layer 922 may include silicon oxide.

Figure 17C:
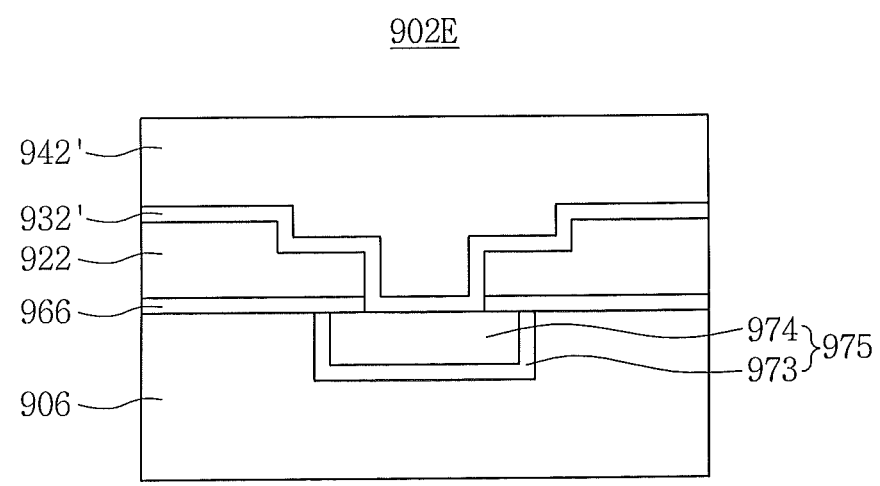

Referring to FIGS. 14B and 17C, the method of forming the upper device 902E according to the present embodiment of the inventive concept may include conformally forming an upper electrode barrier material layer 932' on sidewalls of the first upper groove GU1, a bottom surface and sidewalls of the second upper groove GU2, and an exposed surface of the upper metal interconnection 974, and forming an upper electrode metal layer 942' (operation S730). The upper electrode barrier material layer 932' may include any one of Ti, Ti/TiN, TiN, TiW, Ta, Ta/TaN, or TaN. The upper electrode metal layer 942' may include copper.

Figure 17D:
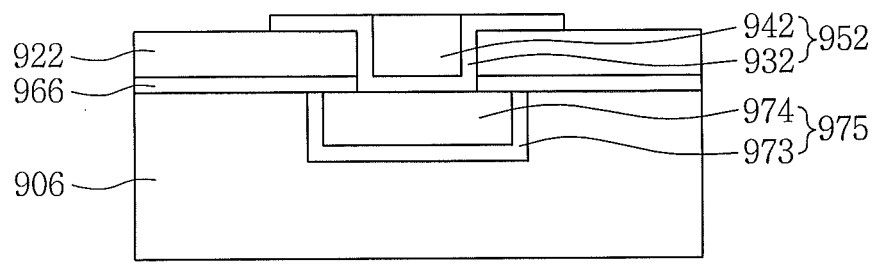

Referring to FIGS. 14B and 17D, the method of forming the lower device 902E according to the present embodiment of the inventive concept may include forming an upper electrode structure 952 with reference to FIGS. 15C through 15F (operation S740).

Figure 17E:
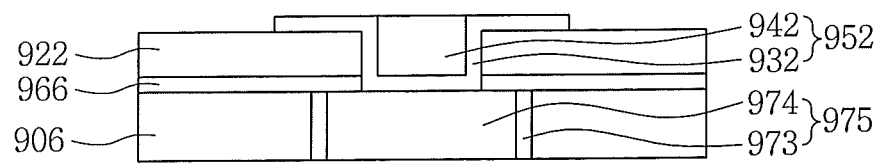

Referring further to FIG. 17E, a method of forming a lower device 902F according to another embodiment of the inventive concept may include partially removing a lower portion of a lower substrate 906 to expose an upper interconnection 975. The lower portion of the lower substrate 906 may be removed using a CMP process, a grinding process, or an etching process. As shown in FIG. 17E, a portion of an upper interconnection barrier layer 973 may be removed to expose an upper metal interconnection 974.

FIGS. 18A through 18G are longitudinal sectional views illustrating processes of bonding lower devices and upper devices to form electrode-connecting structures according to various embodiments of the inventive concept.

Referring to FIGS. 18A through 18G, forming electrode-connecting structures 1000A to 1000G according to various embodiments of the inventive concept may include various lower devices 1001A to 1001G and various upper devices 1002A to 1002G, which may be bonded to each other. The lower devices 1001A to 1001G and the upper devices 1002A to 1002G may have one of the various shapes described and illustrated in the present specification. For instance, the lower devices 1001A to 1001G may include lower electrode structures 1051A to 1051G having portions exposed in lower substrates 1005, respectively. The lower electrode structures 1051A to 1051G may include lower electrode barrier layers 1031A to 1031G and lower metal electrodes 1041A to 1041G, respectively. Also, the upper devices 1002A to 1002G may include upper electrode structures 1052A to 1052G having portions exposed in upper substrates 1006, respectively. The upper electrode structures 1052A to 1052G may include lower electrode barrier layers 1032A to 1032G and lower metal electrodes 1042A to 1042G, respectively. Respective components will be understood with reference to the appended various drawings. In FIGS. 18A through 18G, only features of the lower devices 1001A to 1001G and the upper devices 1002A to 1002G are briefly illustrated to encompass various embodiments. Positions of the lower devices 1001A to 1001G and the upper devices 1002A to 1002G may be changed in other embodiments of the inventive concept.

The processes of bonding the lower devices 1001A to 1001G and the upper devices 1002A to 1002G may include a thermal compression process.

The thermal compression process may include heating both the lower electrode metal electrodes 1041A to 1041G and the upper metal electrodes 1042A to 1042G to such a temperature as to enable direct bonding between them. For example, the thermal compression process may include heating the lower metal electrodes 1041A to 1041G and the upper metal electrodes 1042A to 1042G to a temperature of about 400° C. or more.

In addition, the thermal compression process may include bonding the lower metal electrodes 1041A to 1041G and the upper metal electrodes 1042A to 1042G together by applying a pressure of about 4 Bars.

Furthermore, before the thermal compression process, the bonding process may include cleaning surfaces of the lower metal electrodes 1041A to 1041G and the upper metal electrodes 1042A to 1042G. For example, the bonding process may include removing oxide from the surfaces of the lower metal electrodes 1041A to 1041G and the upper metal electrodes 1042A to 1042G using flux.

Figure 18A:
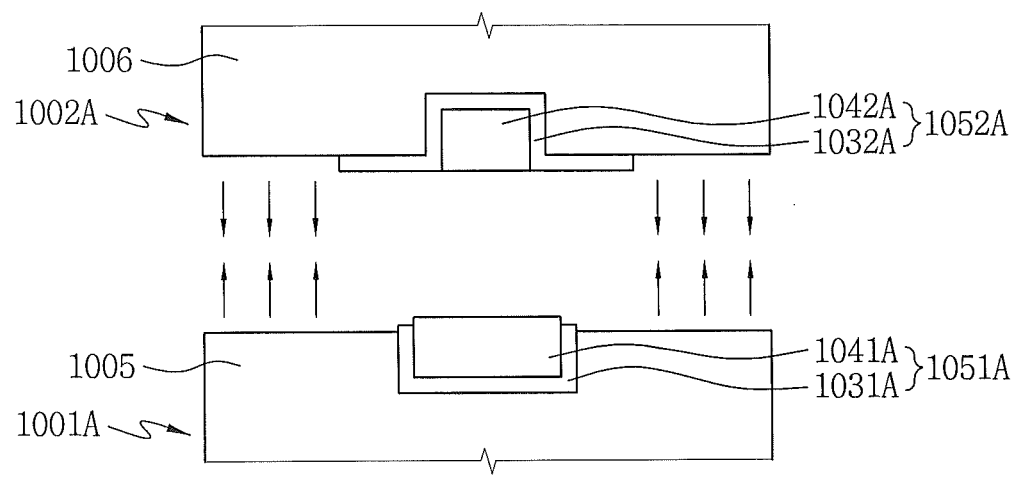
FIGS. 18A through 18H are longitudinal sectional views illustrating processes of bonding lower devices and upper devices to form electrode-connecting structures according to various embodiments of the inventive concept.
Figure 18B:
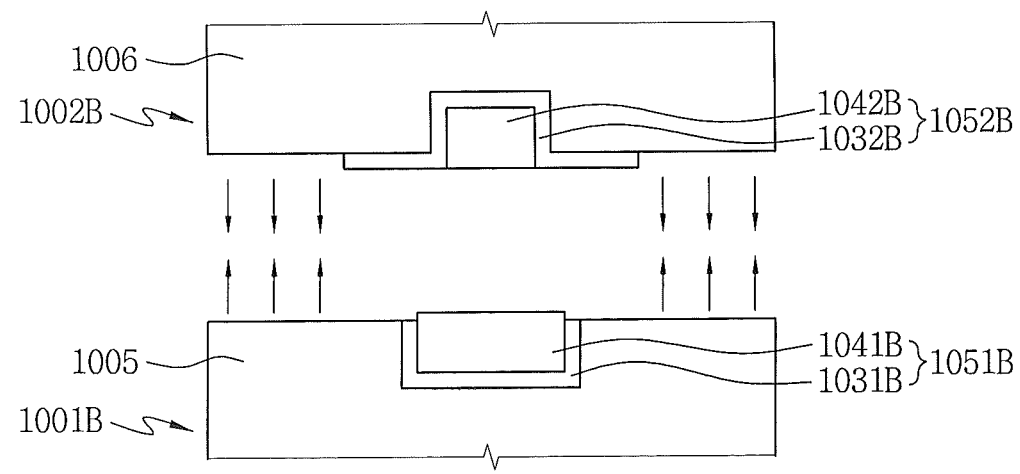
Figure 18C:
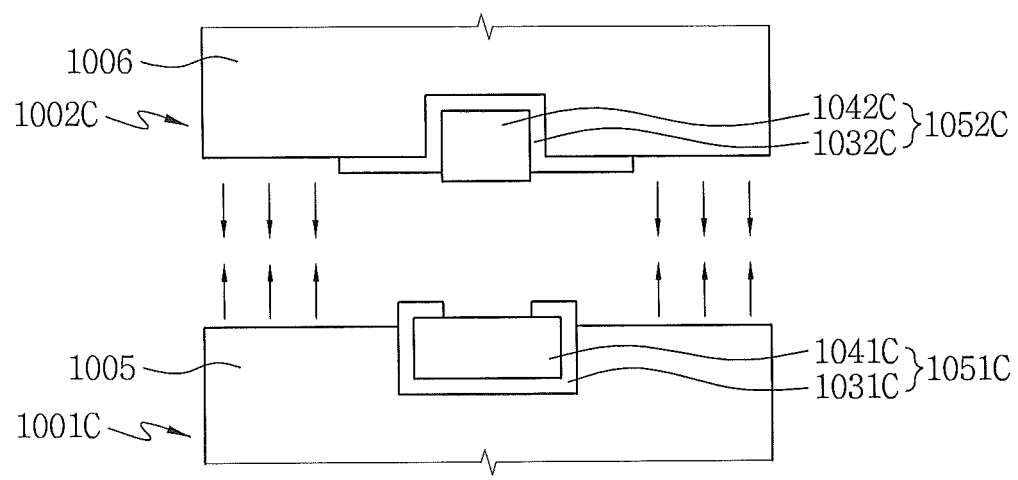
Figure 18D:
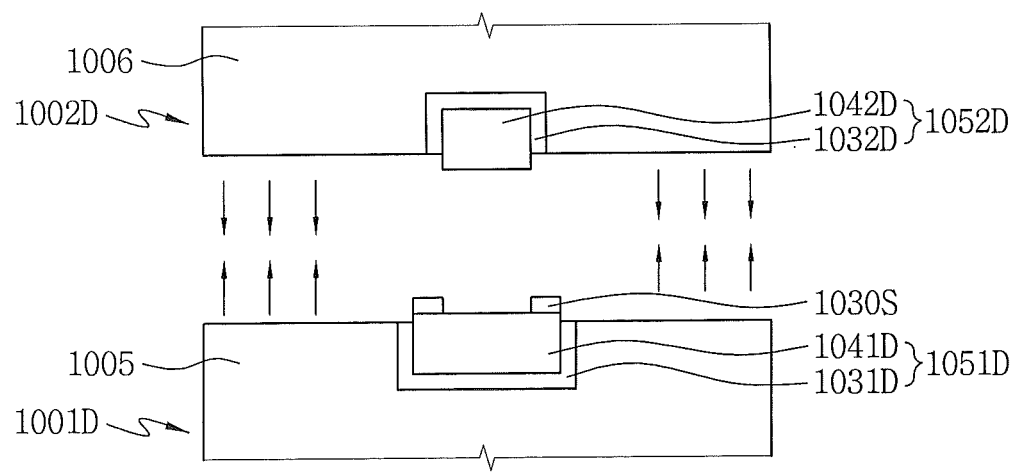
Figure 18E:
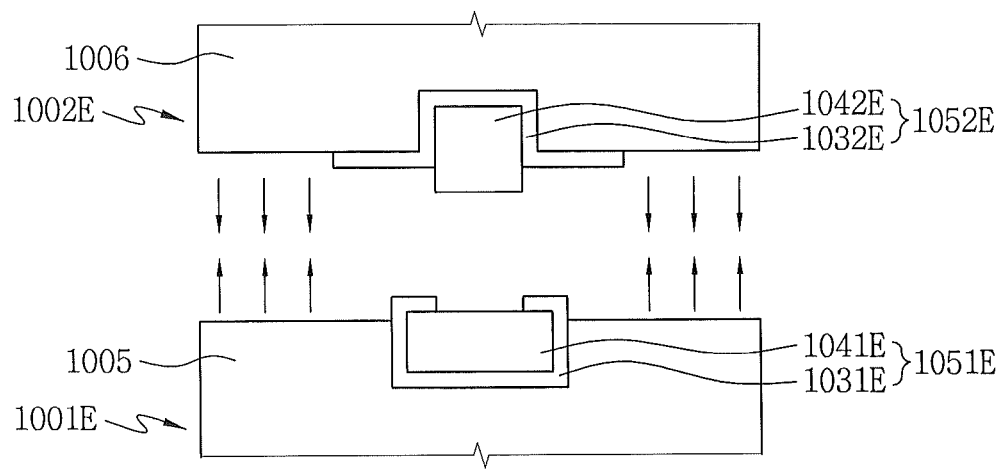
Figure 18F:
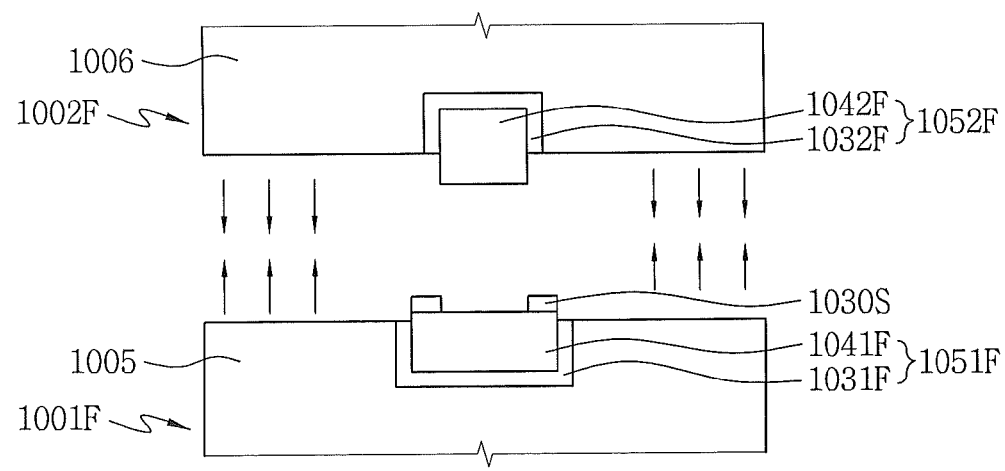
Figure 18G:
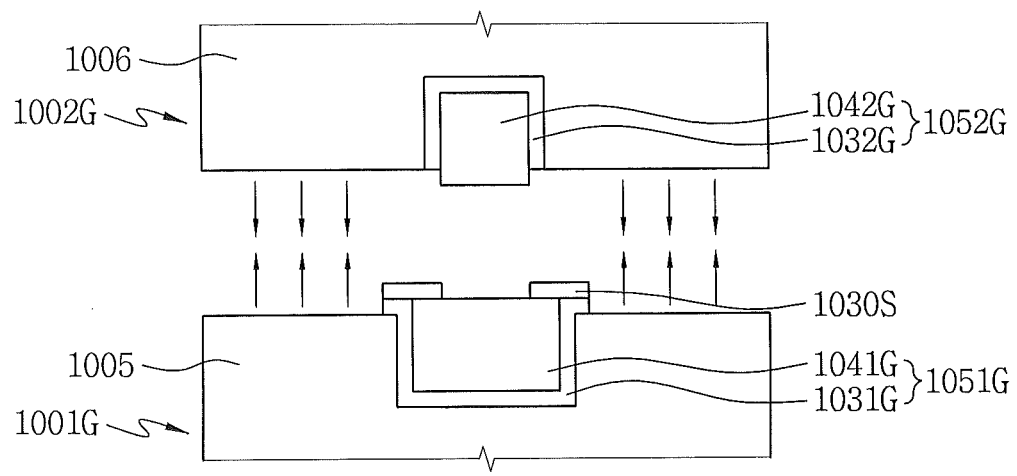
Figure 18H:
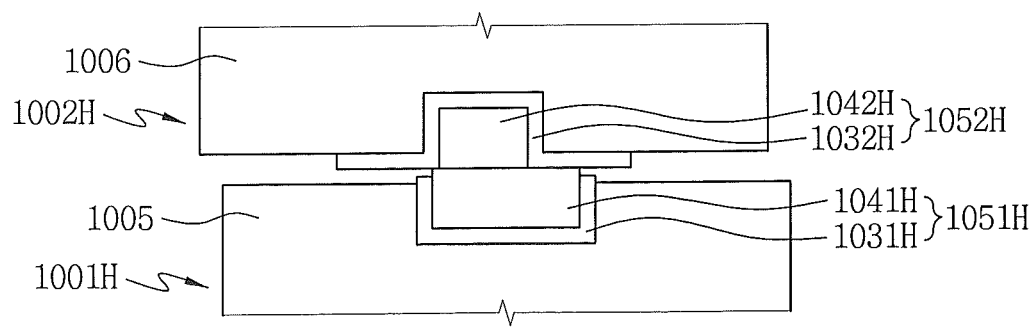

FIG. 18H is a conceptual longitudinal sectional view illustrating a case where a lower electrode structure 1051H is bonded to an upper electrode structure 1052H in a misaligned manner. Referring to FIG. 18H, an upper electrode barrier layer 1032H formed on a bottom surface of an upper substrate 1006 may prevent a lower metal electrode 1041H from directly contacting an upper substrate 1006. The concept of FIG. 18H may be applied to all the various embodiments described in the present specification.

Figure 19:
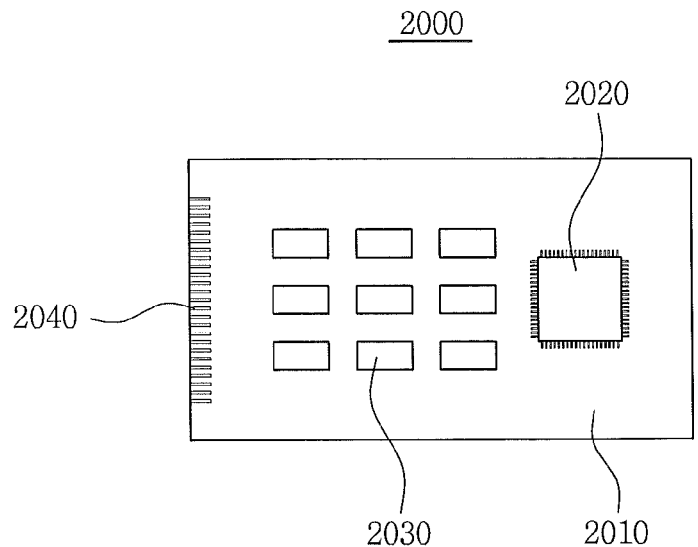
FIG. 19 is a conceptual diagram of a module including at least one of electrode-connecting structures according to various embodiments of the inventive concept, according to an embodiment of the inventive concept.

FIG. 19 is a conceptual diagram of a module including at least one of electrode-connecting structures according to various embodiments of the inventive concept, according to an embodiment of the inventive concept.

Referring to FIG. 19, a module 2000 according to an embodiment of the inventive concept may include semiconductor packages 2030 mounted on a module substrate 2010, and each of the semiconductor packages 2030 may include at least one of the electrode-connecting structures according to various embodiments of the inventive concept. The module 2000 may further include a microprocessor (MP) 2020 mounted on the module substrate 2010. Input/output (I/O) terminals 2040 may be disposed on at least one side of the module substrate 2010.

Figure 20:
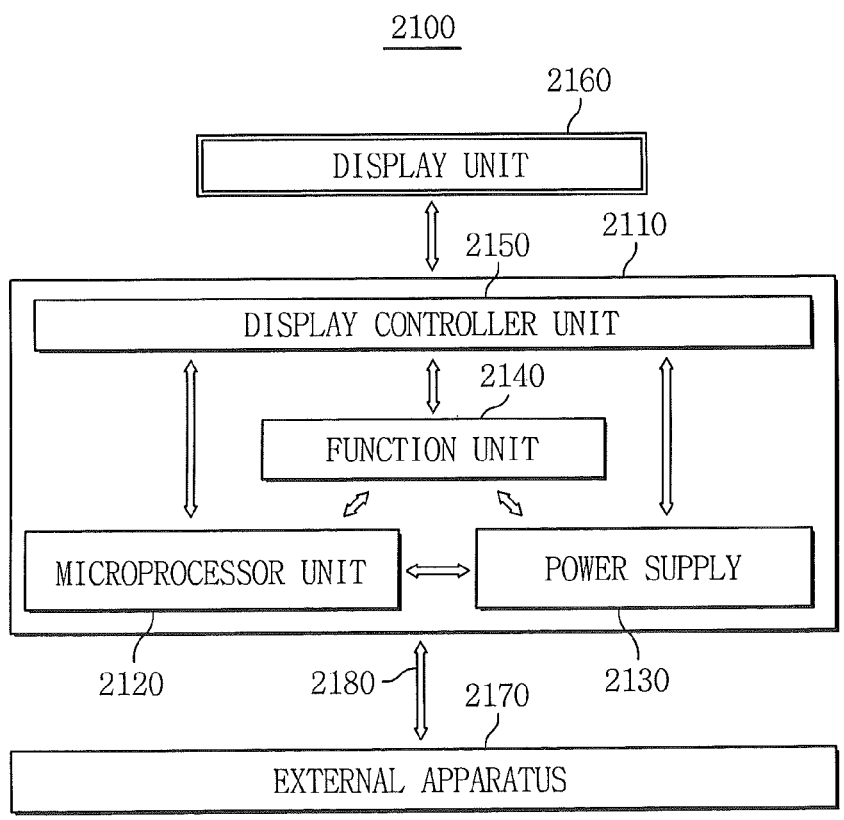
FIG. 20 is a conceptual block diagram of an electronic system including electrode-connecting structures according to various embodiments of the inventive concept.

FIG. 20 is a conceptual block diagram of an electronic system 2100 including at least one of the electrode-connecting structures according to various embodiments of the inventive concept.

Referring to FIG. 20, the electrode-connecting structures according to various embodiments of the inventive concept may be applied to the electronic system 2100. The electronic system 2100 may include a body 2110, an MP unit 2120, a power supply 2130, a function unit 2140, and/or a display controller unit 2150. The body 2110 may include a system board or mother board including a printed circuit board (PCB). The MP unit 2120, the power supply 2130, the function unit 2140, and the display controller unit 2150 may be mounted on the body 2110. The display unit 2160 may be disposed on a top surface of the body 2110, or outside the body 2110. For example, the display unit 2160 may be disposed on a surface of the body 2110 and display an image processed by the display controller unit 2150.

The power supply 2130 may receive a predetermined voltage from an external battery (not shown), divide the voltage into required voltage levels, and supply the divided voltages to the MP unit 2120, the function unit 2140, and the display controller unit 2150. The MP unit 2120 may receive a voltage from the power supply 2130 and control the function unit 2140 and the display unit 2160. The function unit 2140 may serve various functions of the electronic system 2100. For example, when the electronic system 2100 is a mobile electronic product, such as a portable phone, the function unit 2140 may include several components capable of serving wireless communication functions, for example, outputting an image to the display unit 2160 or outputting a voice to a speaker, by dialing or communicating with an external apparatus 2170. When a camera is also mounted, the function unit 2140 may serve as an image processor.

In applied embodiments, when the electronic system 2100 is connected to a memory card to increase capacity, the function unit 2140 may be a memory card controller. The function unit 2140 may transmit/receive signals to/from the external apparatus 2170 through a wired or wireless communication unit 2180. Furthermore, when the electronic system 2100 requires a universal serial bus (USB) to increase functionality, the function unit 2140 may serve as an interface controller.

The electrode-connecting structures described in the various embodiments of the inventive concept may be included in at least one of the MP unit 2120 and the function unit 2140.

Figure 21:
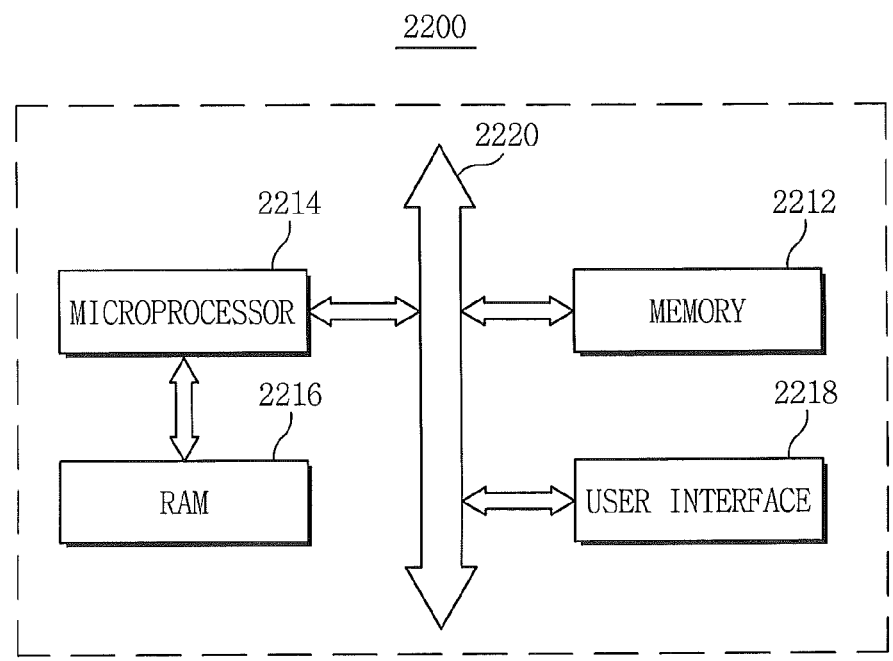
FIG. 21 is a schematic block diagram of an electronic system including at least one of electrode-connecting structures according to an embodiment of the inventive concept.

FIG. 21 is a schematic block diagram of an electronic system 2200 including at least one of the electrode-connecting structures according to an embodiment of the inventive concept. Referring to FIG. 21, the electronic system 2200 may include at least one of the electrode-connecting structures according to various embodiments of the inventive concept. The electronic system 2200 may be used to fabricate a mobile device or computer. For example, the electronic system 2200 may include a memory system 2212, an MP 2214, a random access memory (RAM) 2216, and a user interface 2218, which may communicate data using a bus 2220. The MP 2214 may program and control the electronic system 2200. The RAM 2216 may be used as an operation memory of the MP 2214. For example, the MP 2214 or the RAM 2216 may include at least one of the electrode-connecting structures according to embodiments of the inventive concept. The MP 2214, the RAM 2216, and/or other components may be assembled within a single package. The user interface 2218 may be used to input/output data to/from the electronic system 2200. The memory system 2212 may store codes for operating the MP 2214, data processed by the MP 2214, or external input data. The memory system 2212 may include a controller and a memory.

Figure 22:
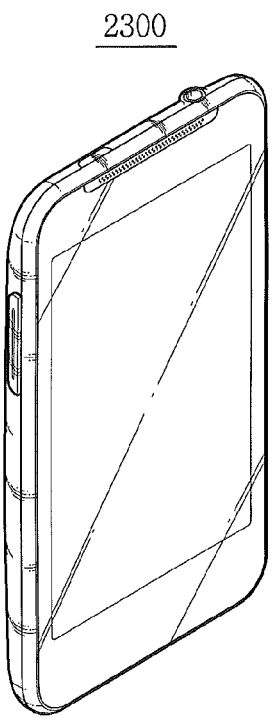
FIG. 22 is a schematic diagram of a mobile wireless phone including at least one of electrode-connecting structures according to various embodiments of the inventive concept.

FIG. 22 is a schematic diagram of a mobile wireless phone 2300 including at least one of the electrode-connecting structures according to various embodiments of the inventive concept. The mobile wireless phone 2300 may be interpreted as a tablet personal computer (PC). In addition, at least one of the semiconductor packages according to various embodiments of the inventive concept may be used not only for a tablet PC but also for a portable computer, such as a laptop computer, an MPEG-1 audio layer 3 (MP3) player, an MP4 player, a navigation device, a solid-state disk (SSD), a desktop computer, or electronic devices for automotive and household uses.

Electrode-connecting structures or semiconductor devices according to various embodiments of the inventive concept may provide a low-resistance electrode connection because lower metal electrodes can be integrally formed with upper metal electrodes. In particular, when the lower and upper metal electrodes include copper, a electrode connection having a much lower resistance than conventional electrode connection using a solder material can be provided. Also, because the lower and upper metal electrodes do not include a solder material, the lower and upper metal electrodes may not be formed in spherical shapes but in mesa shapes having planar top and bottom surfaces. Therefore, vertical thicknesses of the lower and upper metal electrodes, and the entire thicknesses of the electrode-connecting structures can be reduced.

In electrode-connecting structures or semiconductor devices according to various embodiments of the inventive concept, lower metal electrodes and upper metal electrodes are not in direct contact with a lower insulating layer and an upper insulating layer, respectively. For example, the lower metal electrodes and the upper metal electrodes can be spaced apart from the lower insulating layer and the upper insulating layer by a lower electrode barrier layer and an upper electrode barrier layer, respectively. Accordingly, oxygen or other impurities contained in the lower and upper insulating layers may be inhibited from moving or cannot move to the lower and upper metal electrodes. The lower and upper metal electrodes according to the inventive concept can have stable electrical, physical, and/or chemical properties and extended lifespans.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. An electrode-connecting structure comprising:
   a lower device including a lower substrate, a lower insulating layer formed on the lower substrate, and a lower electrode structure formed in the lower insulating layer, wherein the lower electrode structure includes a lower electrode barrier layer and a lower metal electrode formed on the lower electrode barrier layer; and
   an upper device including an upper substrate, an upper insulating layer formed under the upper substrate, and an upper electrode structure formed in the upper insulating layer, wherein the upper electrode structure includes an upper electrode barrier layer extending from the inside of the upper insulating layer under a bottom surface thereof and an upper metal electrode formed on the upper electrode barrier layer,
   wherein the lower metal electrode is in direct contact with the upper metal electrode.

2. The structure of claim 1, wherein the lower and upper metal electrodes include copper (Cu) and are materially in continuity with each other.

3. The structure of claim 1, wherein a portion of the lower metal electrode is in direct contact with a portion of the upper metal barrier layer.

4. The structure of claim 1, wherein the lower insulating layer includes a lower groove,
   the lower electrode barrier layer is conformally formed on bottom and lateral surfaces of the lower groove, and
   a topmost end of the lower electrode barrier layer is exposed on a top surface of the lower insulating layer.

5. The structure of claim 1, wherein a topmost end of the lower electrode barrier layer protrudes upward from a top surface of the lower insulating layer.

6. The structure of claim 1, wherein a top surface of the lower metal electrode protrudes upward from a topmost end of the lower electrode barrier layer.

7. The structure of claim 1, wherein the upper insulating layer includes an upper groove,
the upper electrode barrier layer is conformally formed on bottom and lateral surfaces of the upper groove, and
a portion of the upper electrode layer extends under a bottom surface of the upper insulating layer.

8. The structure of claim 7, wherein a top surface of the upper electrode barrier layer protrudes downward from the bottom surface of the upper insulating layer.

9. The structure of claim 1, wherein the lower electrode barrier layer has a first horizontal width,
the lower metal electrode has a second horizontal width smaller than the first horizontal width, and
the upper electrode barrier layer extending under a bottom surface of the upper insulating layer has a third width greater than the first horizontal width.

10. The structure of claim 9, wherein the upper metal electrode has a fourth horizontal width smaller than the second horizontal width.

11. The structure of claim 1, wherein the lower electrode barrier layer and the upper metal barrier layer include titanium (Ti), titanium/titanium nitride (Ti/TiN), TiN, titanium tungsten (TiW), tantalum (Ta), tantalum/tantalum nitride (Ta/TaN), and/or TaN.

12. The structure of claim 1, wherein the lower insulating layer and the upper insulating layer include silicon oxide.

13. The structure of claim 1, wherein an air gap is present between the lower and upper insulating layers.

14. The structure of claim 1, wherein a portion of the lower metal electrode or the upper metal electrode protrudes between the lower insulating layer and the upper metal barrier layer.

15. An electrode-connecting structure comprising:
a lower insulating layer;
a lower electrode barrier layer formed in the lower insulating layer, the lower electrode barrier layer having a first horizontal width;
a lower copper (Cu) electrode having lateral surfaces surrounded with the lower electrode barrier layer, the lower copper electrode having a second horizontal width smaller than the first horizontal width;
an upper insulating layer formed on the lower insulating layer;
an upper electrode barrier layer formed in the upper insulating layer, the upper electrode barrier layer being in contact with a portion of a top surface of the lower copper electrode and having a third horizontal width greater than the first horizontal width; and
an upper copper electrode being in direct contact with the lower copper electrode and surrounded with the upper electrode barrier layer, the upper copper electrode having a fourth horizontal width smaller than the second horizontal width.

16. An electrode-connecting structure, comprising:
an upper electrode structure comprising an upper electrode barrier layer and an upper metal electrode, the upper metal electrode having a lower surface with the upper electrode barrier layer surrounding other surfaces of the upper metal electrode; and
a lower electrode structure comprising a lower electrode barrier layer and a lower metal electrode, the lower metal electrode being disposed on the lower electrode barrier layer and having an upper surface that contacts the lower surface of the upper metal electrode;
wherein a horizontal width of the lower metal electrode is greater than a horizontal width of the upper metal electrode.

17. The electrode-connecting structure of claim 16, wherein the upper electrode barrier layer and the lower electrode barrier layer are spaced apart from one another.

18. The electrode-connecting structure of claim 16, wherein the upper electrode barrier layer and the lower electrode barrier layer contact each other.

19. The electrode-connecting structure of claim 16, wherein a portion of the lower electrode barrier layer is disposed on the upper surface of the lower metal electrode.

20. The electrode-connecting structure of claim 16, further comprising:
a surface electrode barrier layer disposed on outer regions of the upper surface of the lower metal electrode.

* * * * *